(12) United States Patent
Ohkawa et al.

(10) Patent No.: US 7,419,864 B2
(45) Date of Patent: Sep. 2, 2008

(54) SEMICONDUCTOR DEVICE AND METHOD OF MANUFACTURING THE SAME

(75) Inventors: Narumi Ohkawa, Kawasaki (JP); Masaya Katayama, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 11/882,355

(22) Filed: Aug. 1, 2007

(65) Prior Publication Data

US 2007/0281414 A1    Dec. 6, 2007

Related U.S. Application Data

(62) Division of application No. 11/117,689, filed on Apr. 29, 2005, now Pat. No. 7,285,838.

(30) Foreign Application Priority Data

Jan. 6, 2005  (JP)  ............................... 2005-001708

(51) Int. Cl.
*H01L 21/8238* (2006.01)

(52) U.S. Cl. ..................... 438/199; 438/218; 438/303; 257/E21.632

(58) Field of Classification Search ................. 438/195, 438/197, 199, 218, 301, 303; 257/E21.632
See application file for complete search history.

(56) References Cited

U.S. PATENT DOCUMENTS

| 5,917,222 | A | 6/1999 | Smayling et al. |
| 6,093,950 | A | 7/2000 | Kuroda |
| 6,468,860 | B1 * | 10/2002 | Polavarapu et al. ......... 438/257 |
| 6,569,742 | B1 | 5/2003 | Taniguchi et al. |

| 2002/0164858 | A1 | 11/2002 | Sayama et al. |

FOREIGN PATENT DOCUMENTS

| JP | 55-63873  | 5/1980  |
| JP | 3-242977  | 10/1991 |
| JP | 4-279033  | 10/1992 |
| JP | 5-175228  | 7/1993  |
| JP | 7-263705  | 10/1995 |

(Continued)

OTHER PUBLICATIONS

European Search Report dated Mar. 26, 2008, issued in corresponding European Patent Application No. 05252769.

*Primary Examiner*—Hoai v Pham
(74) *Attorney, Agent, or Firm*—Westerman, Hattori, Daniels & Adrian, LLP.

(57) ABSTRACT

A semiconductor device includes a first n-type source/drain region 48a and a second p-type source/drain region 48b formed on a semiconductor substrate 20 away from side surfaces of first and second gate electrodes 39a, 39b at a first interval W4 respectively, a second n-type source/drain region 48c and a first p-type source/drain region 48d formed on the semiconductor substrate 20 away from side surfaces of third and fourth gate electrodes 39c, 39d at a second interval W3, which is wider than the first interval W4, respectively, and third and fourth insulating sidewalls 43c, 43d extended onto source/drain extensions 42c, 42d on both sides of third and fourth gate electrodes 39c, 39d from edges of upper surfaces of the third and fourth gate electrodes 39c, 39d respectively.

12 Claims, 63 Drawing Sheets

FOREIGN PATENT DOCUMENTS

| | | |
|---|---|---|
| JP | 10-242414 | 9/1998 |
| JP | 2000-196037 | 7/2000 |
| JP | 2000-299390 | 10/2000 |
| JP | 2001-93984 | 4/2001 |
| JP | 2002-26139 | 1/2002 |
| JP | 2003297944 A | 10/2003 |

* cited by examiner

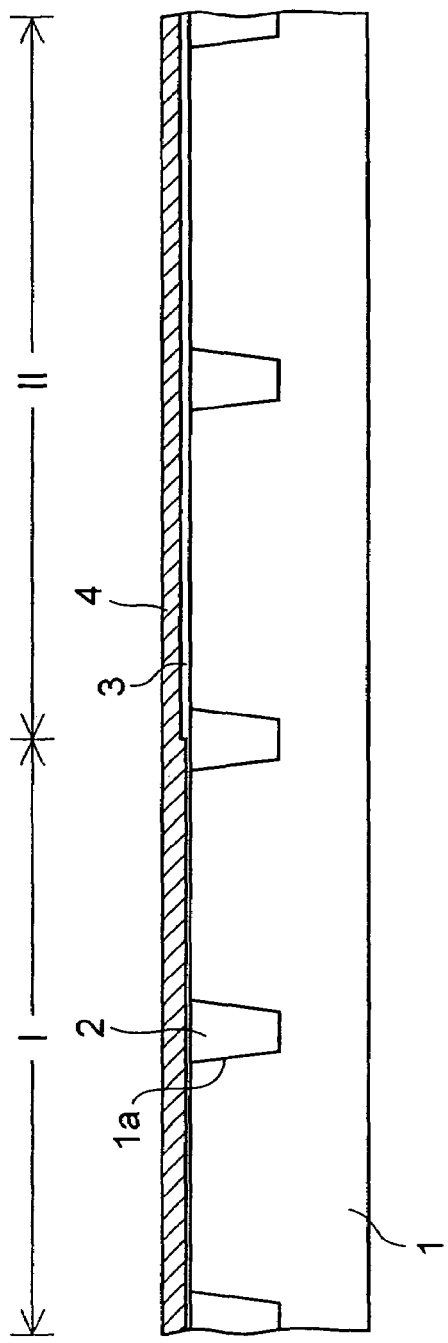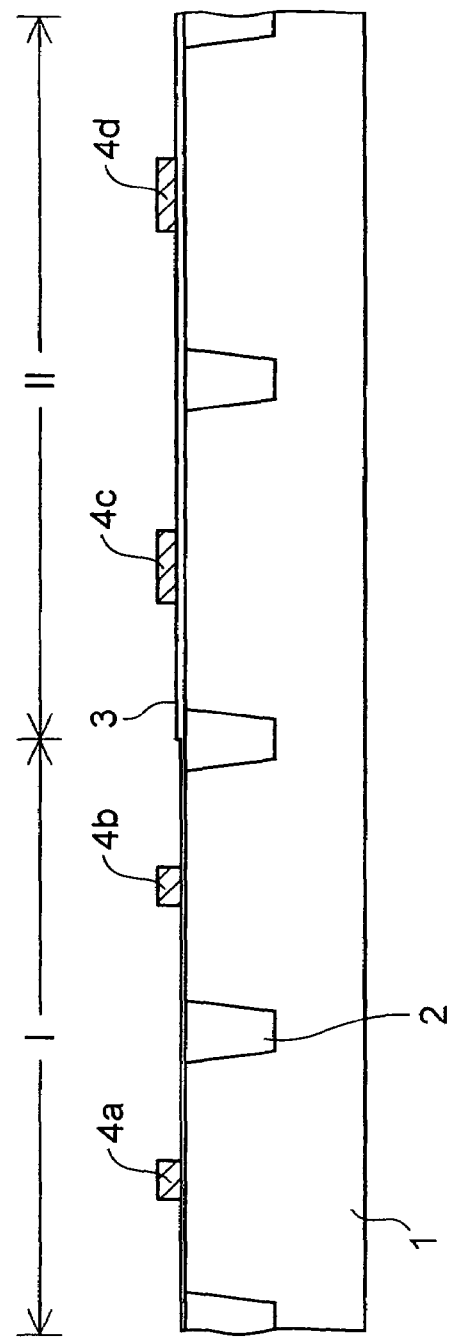
FIG. 1A (Prior Art)
FIG. 1B

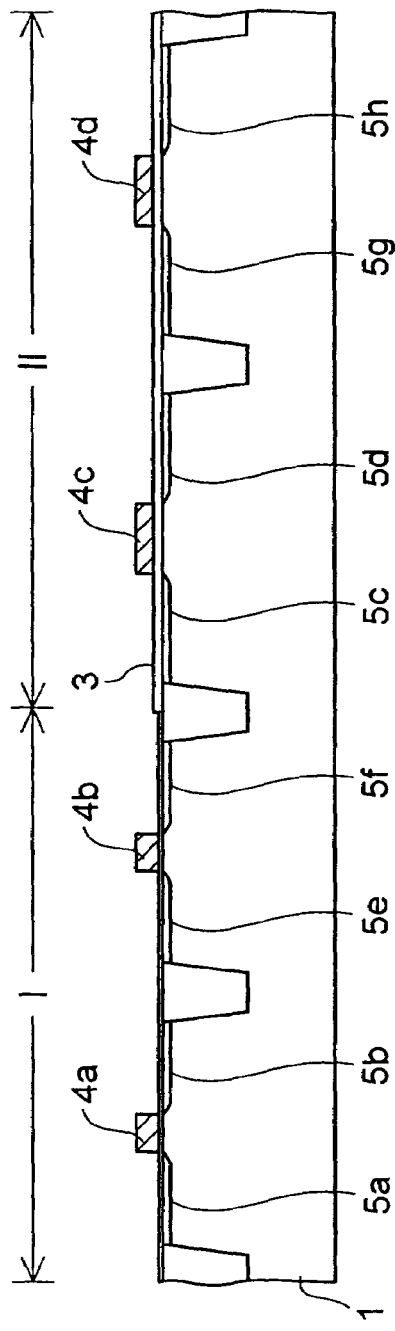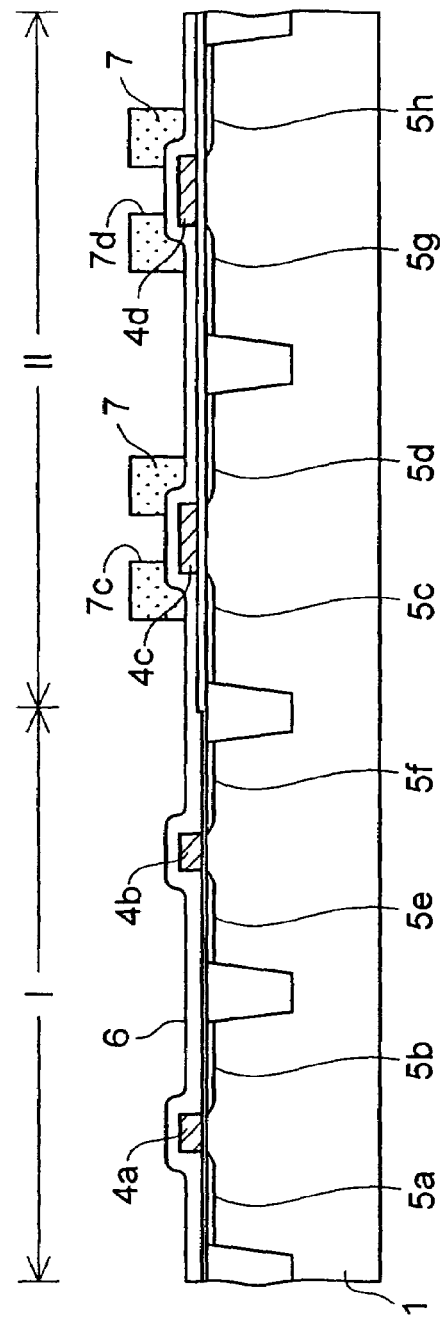

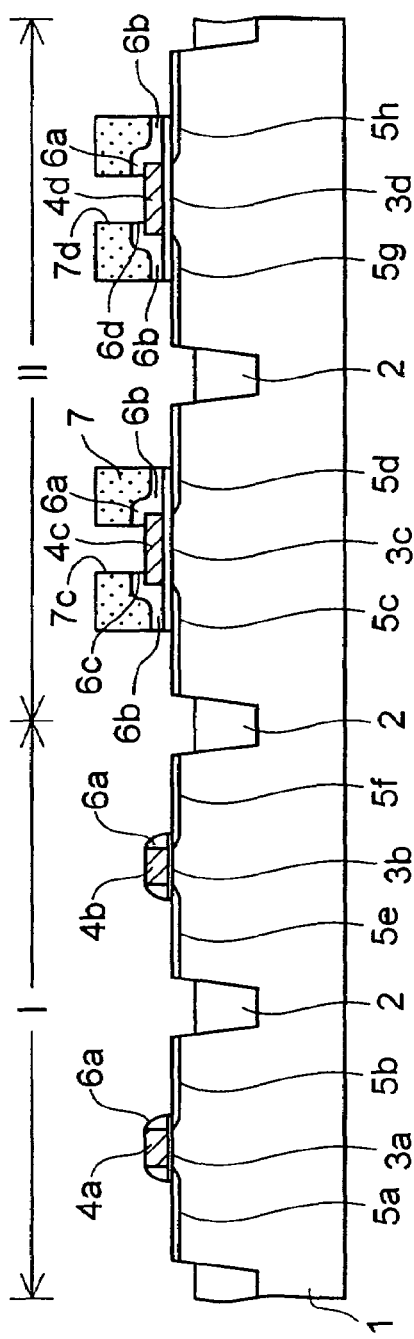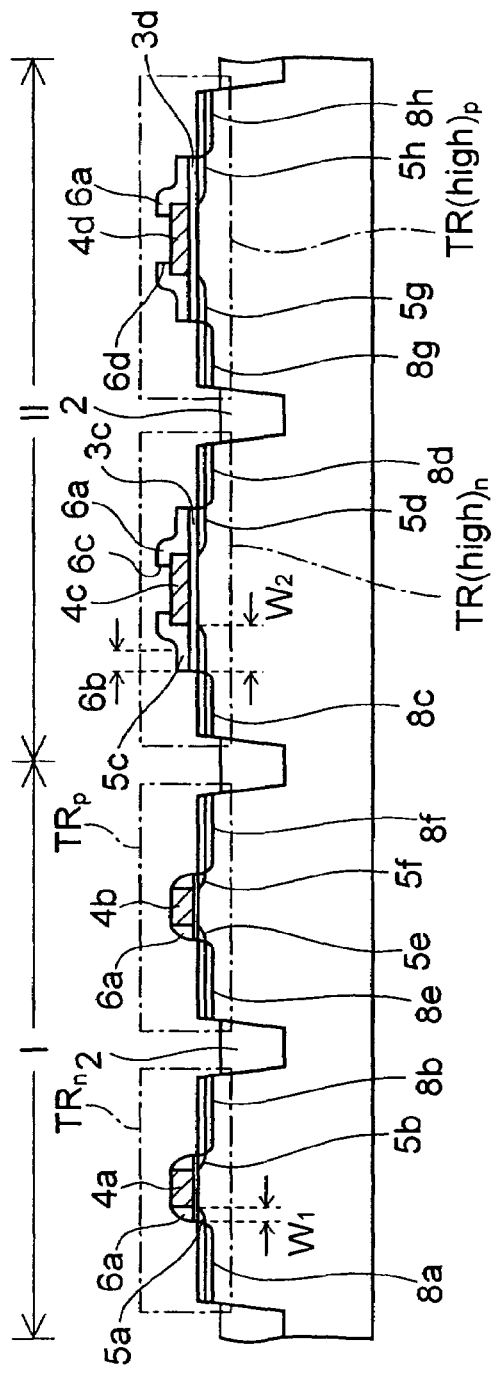
FIG. 1E  Prior Art
FIG. 1F

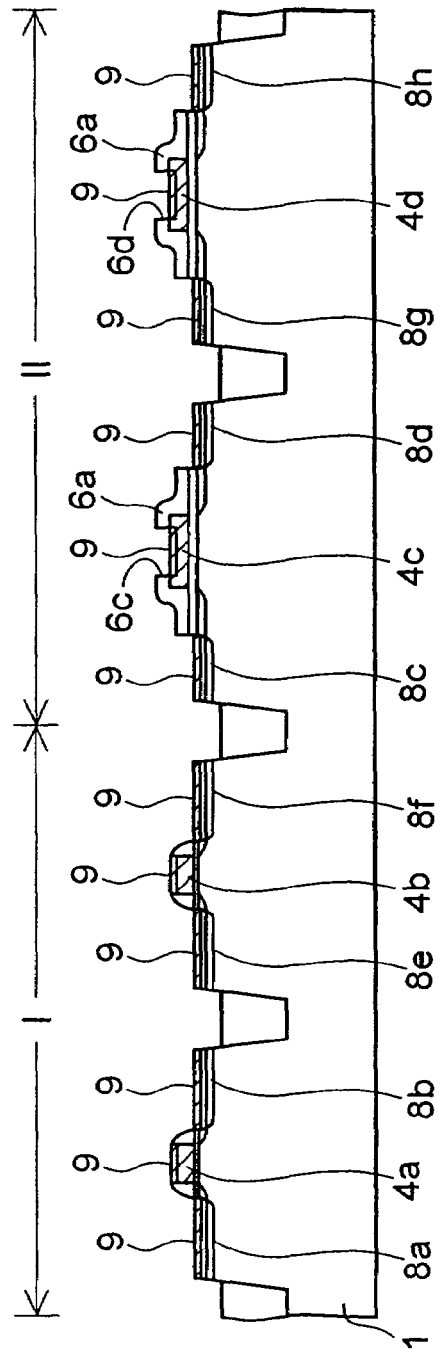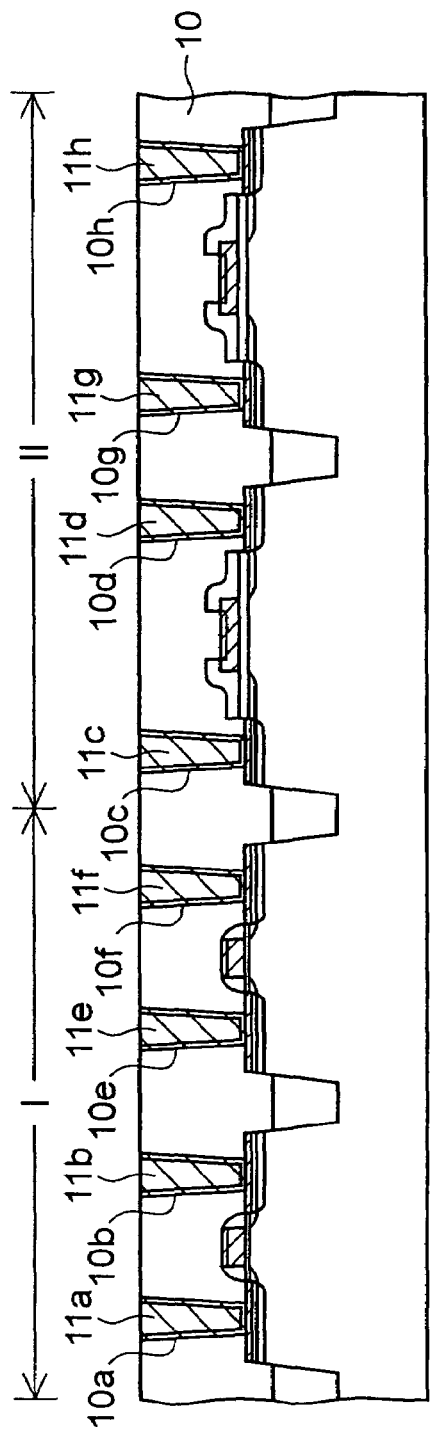
FIG. 1G Prior Art
FIG. 1H

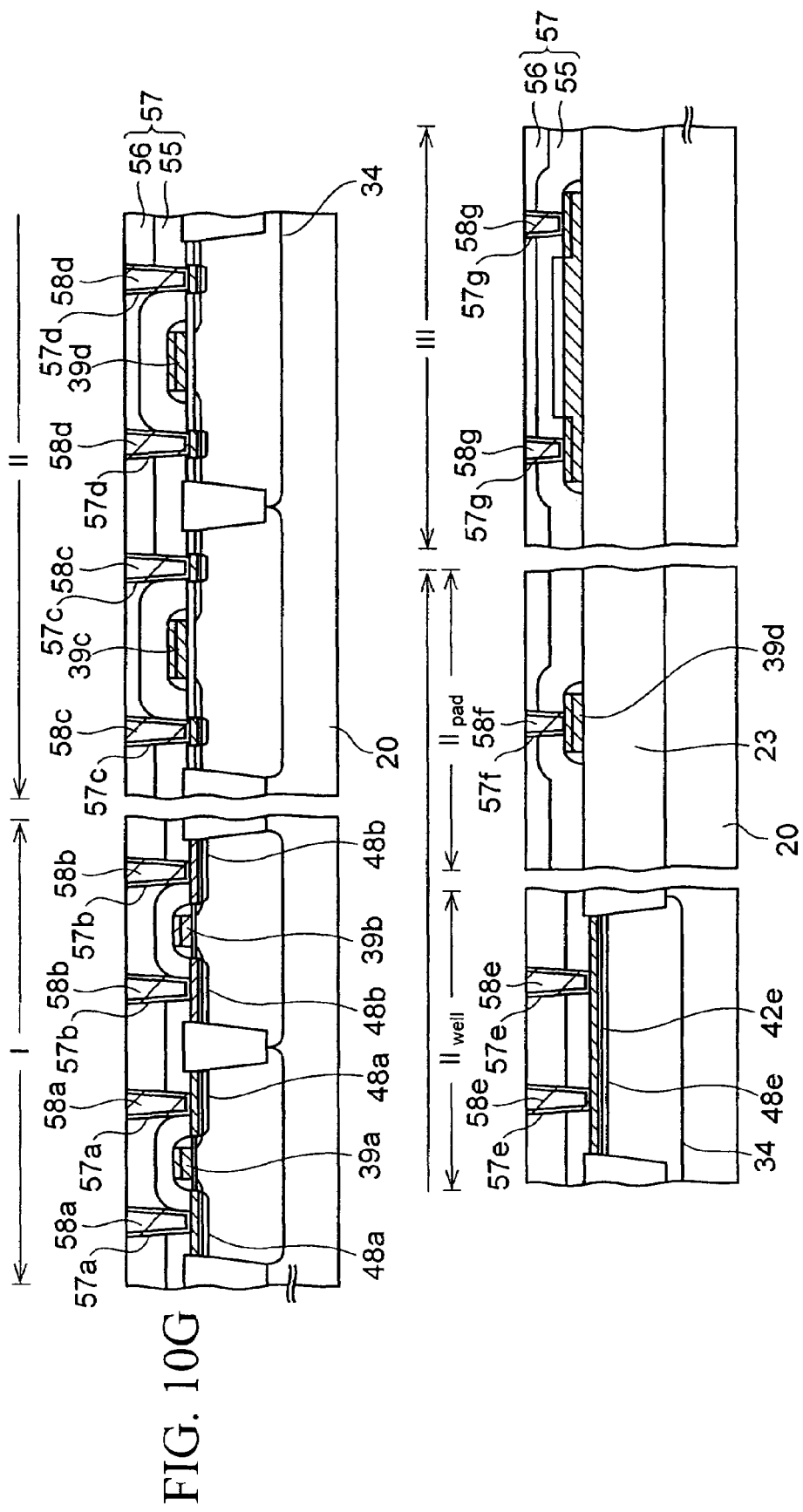

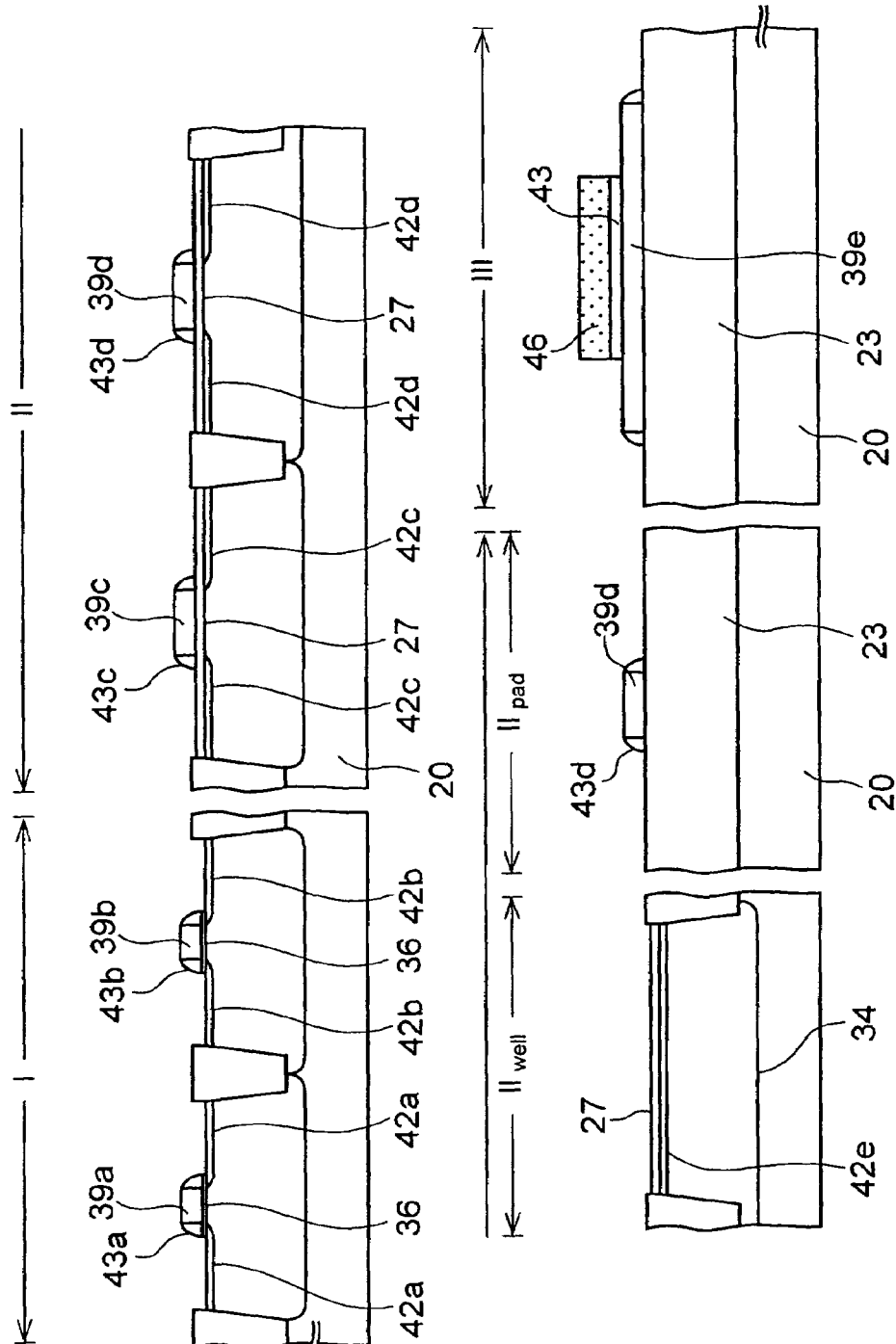

SEMICONDUCTOR DEVICE AND METHOD OF MANUFACTURING THE SAME

CROSS-REFERENCE TO RELATED APPLICATIONS

This application is a Divisional application of application Ser. No. 11/117,689, filed Apr. 29, 2005, now U.S. Pat. No. 7,285,838 which is based on and claims priority of Japanese Patent Application No. 2005-001708 filed on Jan. 6, 2005, the entire contents of which are incorporated herein by reference.

BACKGROUND OF THE INVENTION

1. Field of the Invention

The present invention relates to a semiconductor device and a method of manufacturing the same.

2. Description of the Related Art

In recent years, as the result of a reduction in power consumption of the mobile equipment, and the like, a demand for lower power consumption in semiconductor devices such as LSIs, and so on, which are incorporated into the equipment, is increasing. As the semiconductor device capable of meeting such demand, there is the MOS transistor having the dual gate structure. The dual gate structure is a MOS transistor having such a structure that an n-type impurity is introduced into a gate electrode of an n-type MOS transistor and a p-type impurity is introduced into a gate electrode of a p-type MOS transistor. A threshold voltage of the transistor can be lowered if the same impurity as the conductivity type of the channel is introduced into the gate electrode in this manner, and thus the power consumption of the transistor can be suppressed.

However, only a single kind of dual gate transistor of the identical driving voltage is rarely integrated in an actual semiconductor device. Commonly, the transistor having the dual gate structure is employed as the normal transistor for the logic circuit whose driving voltage is low, and this normal transistor is embedded with a high-voltage transistor. For instance, in the driver IC in the liquid crystal panel, the high-voltage driving transistor used to apply a voltage to alignment electrodes of the liquid crystal panel is formed together with the normal transistor for the logic circuit.

The semiconductor device in which the normal transistor having such dual gate structure and the high-voltage transistor are integrated together is disclosed in FIG. 32 in Patent Literature 1.

FIG. 1 to FIG. 4 are sectional views showing the essential part of processes in a method of manufacturing a semiconductor device disclosed in Patent Literature 1.

First, as shown in FIG. 1A, element isolation insulating films 2 are buried in element isolation trenches 1a of a silicon substrate 1, and then a thermal oxide film 3 and an undoped polysilicon film 4 are formed sequentially on the silicon substrate 1.

A normal transistor forming region I and a high-voltage transistor forming region II are defined on the silicon substrate 1. The thermal oxide film 3 in the high-voltage transistor forming region II is formed thicker than that in the normal transistor forming region I.

Then, as shown in FIG. 1B, first to fourth gate electrodes 4a to 4d are formed by patterning the polysilicon film 4.

Then, as shown in FIG. 1C, first to fourth n-type source/drain extensions 5a to 5d and first to fourth p-type source/drain extensions 5e to 5h are formed by the ion implantation using the first to fourth gate electrodes 4a to 4d as a mask. In this case, individual implantations of the p-type impurity and the n-type impurity in this ion implantation are executed by using resist patterns (not shown), and then the resist patterns are removed after the ion implantation is ended.

Then, as shown in FIG. 1D, an insulating film 6 is formed on the overall surface, and then a resist pattern 7 is formed on the insulating film 6 in the high-voltage transistor forming region II. The resist pattern 7 has first and second windows 7c, 7d on the gate electrodes 4c, 4d respectively. In contrast, the normal transistor forming region I is not covered with the resist pattern 7 and is exposed.

Then, as shown in FIG. 1E, the insulating film 6 is etched back while using the resist pattern 7 as a mask. Thus, the insulating film 6 is shaped into an insulating sidewall 6a positioned besides the first to fourth gate electrodes 4a to 4d respectively, and also the thermal oxide film 3 located under the gate electrodes 4a to 4d is shaped into first to fourth gate insulating films 3a to 3d respectively. Also, the insulating film 6 under the first and second windows 7c, 7d is etched by the etching-back. Thus, first and second openings 6c, 6d are formed in the insulating sidewall 6a and thus upper surfaces of the third and fourth gate electrodes 4c, 4d are exposed from these openings 6c, 6d.

Also, out of the gate electrodes 4a to 4d, an extended portion 6b that corresponds to the resist pattern 7 is formed to extend from the insulating sidewall 6a positioned besides the third and fourth gate electrodes 4c, 4d in the high-voltage transistor forming region II respectively.

Meanwhile, prior to this step, the thermal oxide film 3 is formed in the high-voltage transistor forming region II to have a thickness that is thicker than that in the normal transistor forming region I. For this reason, in the etching-back step, even if an etching time is set to remove completely the thermal oxide film 3 and the insulating film 6 from the normal transistor forming region I, it is possible that the etching is not completed owing to the etching residue of the thick thermal oxide film 3 in the high-voltage transistor forming region II and the thermal oxide film 3 still remains on the silicon substrate 1.

Therefore, in order not to leave the thermal oxide film 3 in the high-voltage transistor forming region II, an etching time is set in the etching-back step such that the thermal oxide film 3 and the insulating film 6 can be removed completely from the high-voltage transistor forming region II.

However, the over-etching is caused by such etching time in the normal transistor forming region I in which the thermal oxide film 3 is formed thin. Thus, as shown in FIG. 1E, upper surfaces of the element isolation insulating films 2 are etched and their height is lowered than that of the silicon substrate 1.

Then, as shown in FIG. 1F, a resist pattern (not shown) having windows from which n-type MOS transistor forming regions are exposed is formed. Then, the n-type impurity is ion-implanted simultaneously into the silicon substrate 1 and the first and third gate electrodes 4a, 4c through the windows. As a result, first to fourth n-type source/drain region 8a to 8d are formed in the silicon substrate 1 on the side of the gate electrodes 4a, 4c, and also the conductivity type of the gate electrodes 4a, 4c is set to the n type. Also, according to the same processes as above, first to fourth p-type source/drain regions 8e to 8h are formed and at the same time the conductivity type of the gate electrodes 4b, 4d is set to the p type.

In this ion implantation, since the impurity is blocked by the insulating sidewalls 6a, the source/drain regions 8a to 8h are not formed in the silicon substrate 1 under the insulating sidewalls 6a, and thus the source/drain extensions 5a to 5h are still extended thereunder. The source/drain extensions 5a to 5h in the area in which the source/drain regions 8a to 8h are not formed are called the offset.

Then, as described above, since the extended portion 6b is provided to the insulating sidewall 6a in the high-voltage transistor forming region II, an offset W2 in the high-voltage transistor forming region II becomes longer than an offset W1 in the normal transistor forming region I.

According to the steps applied up to now, basic structures of an n-type MOS transistor $TR_n$ and a p-type MOS transistor $TR_p$ having the dual gate structure are completed in the normal transistor forming region I respectively. In contrast, basic structures of an n-type high-voltage MOS transistor $TR(high)_n$ and a p-type high-voltage MOS transistor $TR(high)_p$ are completed in the high-voltage transistor forming region II. In the high-voltage MOS transistors $TR(high)_n$ and $TR(high)_p$, since a source-drain interval is prolonged by the offset W2 that is longer than the offset W1 of the normal transistor, a source-drain withstand voltage can be enhanced. Also, since the gate insulating films 3c, 3d are formed thicker than the gate insulating films 3a, 3b of the normal transistor, a gate-source withstand voltage can be enhanced.

Then, as shown in FIG. 1G, a refractory metal layer is formed on the overall surface and then the refractory metal layer is caused to react with the silicon by the annealing. Thus, a silicide layer 9 is formed on the source/drain regions 8a to 8h and the gate electrodes 4a to 4d. Then, the unreacted refractory metal layer is removed by the etching.

Then, as shown in FIG. 1H, an interlayer insulating film 10 is formed on the overall surface and is patterned. Thus, first to eighth holes 10a to 10h are formed on the source/drain region 8a to 8h, and also first to eighth conductive plugs 11a to 11h are buried in the holes 10a to 10h.

With the above, a basic structure of the semiconductor device in the prior art is completed.

According to the above prior art, as explained with reference to FIG. 1E, due to a difference in the thermal oxide films 3 in respective regions I and II, the element isolation insulating films 2 in the normal transistor forming region I are etched at the time of forming the sidewall insulating films 6a, and thus their height is lowered than the upper surface of the silicon substrate 1.

However, when the element isolation insulating films 2 are etched in this manner, the silicide layer 9 is also formed on the silicon substrate 1 exposed on the side surface of the element isolation trench 1a, as shown in FIG. 2. Thus, the first n-type source/drain region 8a and the silicon substrate 1 are short-circuited by the silicide layer 9. As a result, it is impossible to control an electric potential of the first n-type source/drain region 8a via the first conductive plug 11a.

Also, in the ion-implantation step shown in FIG. 1F, as shown in an enlarged sectional view of FIG. 3, the n-type impurity is injected into the third gate electrode 4c through the first opening 6c in the insulating sidewall 6a, and thus a resistance of the third gate electrode 4c is lowered.

In this case, it is only a doped portion 4e of the third gate electrode 4c in the first opening 7c indicated by the hatching that the n-type impurity is injected into. Thus, the n-type impurity is not injected into the portions covered with the insulating sidewalls 6a, and these portions are left as undoped portions 4f.

However, when viewed from the carriers flowing through a channel 13, the carriers are influenced by the voltage of the third gate electrode 4c under the doped portion 4e whereas the influence of the gate electrode is reduced under the undoped portion 4f. Thus, the same effect as the case where the gate insulating film 3c only under the undoped portion 4f is made locally thick appears. According to this, a threshold voltage under the undoped portion 4f is increased higher than that under the doped portion 4e and therefore a channel resistance is increased and also a driving ability of the transistor TR(high)$_n$ is lowered.

In addition, the channel resistance depends on a shape and a size of the undoped portion 4f. Therefore, the channel resistance is changed depending upon a positional displacement between the first opening 7c and the third gate electrode 4c and thus there is a possibility that the driving ability is varied among a plurality of transistors.

Further, in the silicide step shown in FIG. 1G, as shown in an enlarged sectional view of FIG. 4, it is only in the portion under the first opening 7c of the insulating sidewall 6a that the silicide layer 9 is formed on the upper surface of the third gate electrode 4c. Thus, the silicide layer 9 is not formed in the portion covered with the insulating sidewall 6a, and the resistance of the third gate electrode 4c cannot be sufficiently lowered.

The high-voltage transistors are also disclosed in Patent Literatures 2, 3.

In Patent Literature 2, the structure capable of extending the offset of the source/drain extension by employing the dual sidewall in which two sidewalls are stacked is proposed. However, a width of the inner sidewall constituting the dual sidewall is almost 100 nm roughly, and only a width of 0.2 fÊm is given at most by the dual sidewall. For this reason, the width of the source/drain extension cannot be sufficiently expanded by the structure in Patent Literature 2 and thus it becomes difficult to increase sufficiently the source-drain withstand voltage of the high-voltage transistor.

Also, in Patent Literature 3, the process of forming the thermal oxide film on side walls and the upper surface of the gate electrode and then removing the thermal oxide film only from the upper surface to form the silicide layer therein is proposed. However, the thick thermal oxide film cannot be formed on the side surfaces of the gate electrode. Therefore, like Patent Literature 2, the width of the source/drain extension cannot be sufficiently expanded and thus the source-drain withstand voltage cannot be enhanced.

In addition to the above, the technology to integrate together the normal transistor and the high-voltage transistor is also disclosed in Patent Literatures 4 to 10.

[Patent Literature 1] Patent Application Publication (KOKAI) 2000-196037

[Patent Literature 2] Patent Application Publication (KOKAI) 2001-93984

[Patent Literature 3] Patent Application Publication (KOKAI) 2002-26139

[Patent Literature 4] Patent Application Publication (KOKAI) Hei 10-242414

[Patent Literature 5] Patent Application Publication (KOKAI) 2000-299390

[Patent Literature 6] Patent Application Publication (KOKAI) Sho 55-63873

[Patent Literature 7] Patent Application Publication (KOKAI) Hei 3-242977

[Patent Literature 8] Patent Application Publication (KOKAI) Hei 7-263705

[Patent Literature 9] Patent Application Publication (KOKAI) Hei 5-175228

[Patent Literature 10] Patent Application Publication (KOKAI) Hei 4-279033

SUMMARY OF THE INVENTION

According to an aspect of the present invention, there is provided a semiconductor device which comprises: a first gate insulating film formed in a high-voltage transistor forming region of a semiconductor substrate; a second gate insulating film formed in a low-voltage transistor forming region of the semiconductor substrate; first and second gate electrodes which are formed on the second gate insulating film mutually at an interval and into which an impurity having a different conductivity type is introduced respectively; third and fourth gate electrodes which are formed on the first gate insulating film mutually at an interval, an impurity being introduced in an all portion of the third and fourth gate electrodes; first and second source/drain extensions of first conductivity type formed on the semiconductor substrate beside the first and third gate electrodes respectively; third and fourth source/drain extensions of second conductivity type formed on the semiconductor substrate beside the second and fourth gate electrodes respectively; low-voltage first and second conductivity type source/drain regions formed on the semiconductor substrate at a distance from side surfaces of the first and second gate electrodes with a first interval respectively; high-voltage first or second conductivity type source/drain regions formed on the semiconductor substrate at a distance from side surfaces of the third or fourth gate electrodes with a second interval that is wider than the first interval, respectively; first and second insulating sidewalls formed respectively beside the first and second gate electrodes; a third insulating sidewall extending from an edge of an upper surface of the third gate electrode to the first conductivity type source/drain extension beside the third gate electrode; and a fourth insulating sidewall extending from an edge of an upper surface of the forth gate electrode to the second conductivity type source/drain extension beside the fourth gate electrode.

According to the present invention, the impurity is introduced into all portions of the third and fourth gate electrodes in the high-voltage transistor forming region, and the third and fourth gate electrodes have no undoped portion, unlike the prior art. Therefore, a reduction and a variation in the driving ability of the transistor due to the presence of the undoped portion can be prevented.

Also, according to another aspect of the present invention, there is provided a semiconductor device which comprises: a first gate insulating film formed in a high-voltage transistor forming region of a semiconductor substrate to have two first openings and two second openings respectively; a second gate insulating film which is formed in a low-voltage transistor forming region of the semiconductor substrate and is thinner than the first gate insulating film; first and second gate electrodes which are formed on the second gate insulating film mutually at an interval and into which an impurity having a different conductivity type is introduced respectively; a third gate electrode which is formed on the first gate insulating film between the two first openings and into all portion of which the impurity is introduced; a fourth gate electrode which is formed on the first gate insulating film between the two second openings and into all portion of which an impurity having the same or opposite conductivity type of the impurity introduced into the third gate electrode is introduced; first and second source/drain extensions of first conductivity type formed on the semiconductor substrate beside the first and third gate electrodes respectively; third and fourth source/drain extensions of second conductivity type formed on the semiconductor substrate beside the second and fourth gate electrodes respectively; first and second insulating sidewalls formed beside the first and second gate electrodes; third and fourth insulating sidewalls formed beside the third and fourth gate electrode at a distance from the first and second openings; low-voltage first and second conductivity type source/drain regions formed respectively on the semiconductor substrate beside the first and second insulating sidewalls; and high-voltage first and second conductivity type source/drain regions respectively formed on the semiconductor substrate under the first and second openings beside the third and fourth gate electrodes.

Also, in the present invention, like the above, the impurity is doped into all portions of the third and fourth gate electrodes in the high-voltage transistor forming region. Therefore, not only a reduction in the driving ability of the high-voltage transistor can be prevented but also a variation in the driving ability every transistor can be prevented.

Also, according to still another aspect of the present invention, there is provided a method of manufacturing a semiconductor device, which comprises the steps of: forming an element isolation insulating film, which defines first and second low-voltage transistor forming regions and first and second high-voltage transistor forming regions, on a semiconductor substrate; forming a first gate insulating film on the semiconductor substrate in the first and second high-voltage transistor forming regions; forming a second gate insulating film on the semiconductor substrate in the first and second low-voltage transistor forming regions; forming an undoped conductive film on the first and second gate insulating films; implanting selectively a first conductivity type impurity into the conductive film in the first low-voltage transistor forming region and the first and second high-voltage transistor forming regions; patterning the conductive film after the first conductivity type impurity is implanted, to form first and second gate electrodes in the first and second low-voltage transistor forming regions respectively and form third and fourth gate electrodes in the first and second high-voltage transistor forming regions respectively; forming selectively first and second source/drain extensions of first conductivity type on the semiconductor substrate beside the first and third gate electrodes respectively; forming selectively third and fourth source/drain extensions of second conductivity type, which is opposite to the first conductivity type, on the semiconductor substrate beside the second and fourth gate electrodes respectively; forming first to fourth insulating sidewalls beside the first to fourth gate electrodes respectively; forming low-voltage first conductivity type source/drain region away from side surfaces of the first gate electrode at a first interval after the first to fourth insulating sidewalls are formed, and forming high-voltage first conductivity type source/drain region away from side surfaces of the third gate electrode at a second interval that is wider than the first interval; forming low-voltage second conductivity type source/drain region away from side surfaces of the second gate electrode at the first interval after the first to fourth insulating sidewalls are formed, and forming high-voltage second conductivity type source/drain region away from side surfaces of the fourth gate electrode at the second interval; and introducing a second conductivity type impurity into the second gate electrode.

According to the present invention, in the step of introducing the first conductivity type impurity into the conductive film, the first conductivity type impurity is introduced into the conductive film in the first and second high-voltage transistor forming regions in advance. Therefore, the first conductivity type impurity has been introduced into all portions of the third and fourth gate electrodes at the time when the step of forming the third and fourth gate electrodes in the first and second high-voltage transistor forming regions is ended. As a result, unlike the prior art, the undoped portion into which the impurity is not doped is not formed in the third and fourth gate electrodes. Therefore, not only a reduction in the driving ability of the high-voltage transistor due to the undoped portion can be prevented but also a variation in the driving ability every transistor can be prevented.

According to a yet still another aspect of the present invention, there is provided a method of manufacturing a semiconductor device, which comprises the steps of: forming an element isolation insulating film, which defines first and second low-voltage transistor forming regions and first and second high-voltage transistor forming regions, on a semiconductor substrate; forming a first gate insulating film on the semiconductor substrate in the first and second high-voltage transistor forming regions; forming a second gate insulating film, which is thinner than the first gate insulating film, on the semiconductor substrate in the first and second low-voltage transistor forming regions; forming an undoped conductive film on the first and second gate insulating films; patterning the conductive film to form first and second gate electrodes in the first and second low-voltage transistor forming regions respectively and form third and fourth gate electrodes in the first and second high-voltage transistor forming regions respectively; forming a sidewall insulating film in the first and second low-voltage transistor forming regions and the first and second high-voltage transistor forming regions to cover the first to fourth gate electrodes; removing the sidewall insulating film from upper surfaces of the first to fourth gate electrodes by etching back the sidewall insulating film by an etching depth at which an etching residue of the first gate insulating film is left, and making the sidewall insulating film left beside the first to fourth gate electrode into first to forth insulating sidewalls; forming a first opening in the first gate insulating film away from a side surface of the third insulating sidewall at an interval, and forming a second opening in the first gate insulating film away from a side surface of the fourth insulating sidewall at an interval; introducing a first conductivity type impurity into the first gate electrode, as well as forming low-voltage first conductivity type source/drain region on the silicon substrate beside the first gate electrode, and forming high-voltage first conductivity type source/drain region on the silicon substrate under the first opening; introducing a second conductivity type impurity into the second gate electrode, as well as forming low-voltage second conductivity type source/drain region on the silicon substrate beside the second gate electrode, and forming high-voltage second conductivity type source/drain region on the silicon substrate under the second opening; introducing the impurity into all portions of the third gate electrode; and introducing the impurity into all portions of the fourth gate electrode.

According to the present invention, the first and second openings are formed in the first gate insulating film away from the third and fourth gate electrodes at an interval, and the high-voltage first and second conductivity type source/drain regions are formed on the semiconductor substrate under these openings. Therefore, since the high-voltage first and second conductivity type source/drain regions are separated from the third and fourth electrodes at a predetermined interval respectively, the withstand voltage between the gate electrode and the source/drain region can be enhanced.

Also, in the present invention, since the impurity is doped into all portions of the third and fourth electrodes, a reduction and a variation in the driving ability of the transistor can be prevented for the above reason.

In addition, in the present invention, since the sidewall insulating film is removed from the upper surfaces of the third and fourth gate electrodes, the silicide layer can be formed on the entire upper surfaces of these gate electrodes. Thus, the resistance of the gate electrode can be lowered in contrast to the prior art in which the silicide layer is formed only on a part of the upper surfaces of the gate electrodes of the high-voltage transistor.

BRIEF DESCRIPTION OF THE DRAWINGS

FIGS. 1A to 1H are sectional views showing the gist of a method of manufacturing a semiconductor device in the prior art;

FIGS. 10A to 10G are sectional views showing a semiconductor device according to a third embodiment of the present invention in the manufacturing process respectively;

FIGS. 15A to 15E are sectional views showing a semiconductor device according to a fifth embodiment of the present invention in the manufacturing process respectively;

DESCRIPTION OF THE PREFERRED EMBODIMENTS

Next, embodiments of the present invention will be explained in detail with reference to the accompanying drawings hereinafter.

(1) First Embodiment

Figure 2:
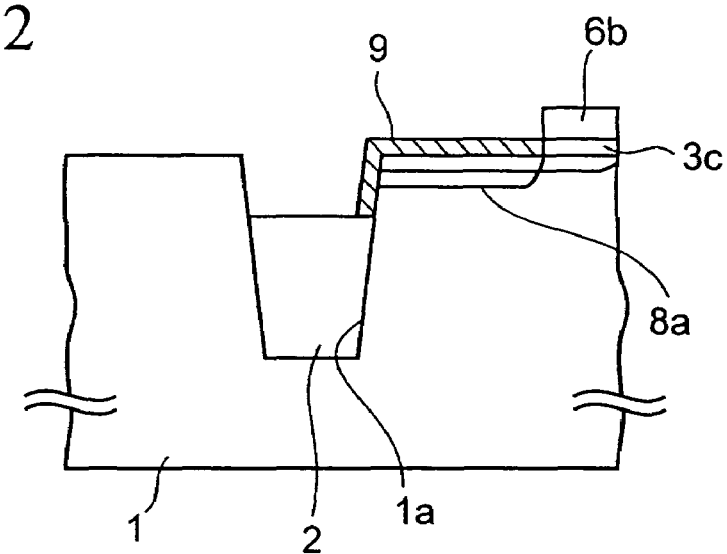
FIG. 2 is an enlarged sectional view showing an event that an element isolation insulating film is etched, in the method of manufacturing the semiconductor device in the prior art.
Figure 3:
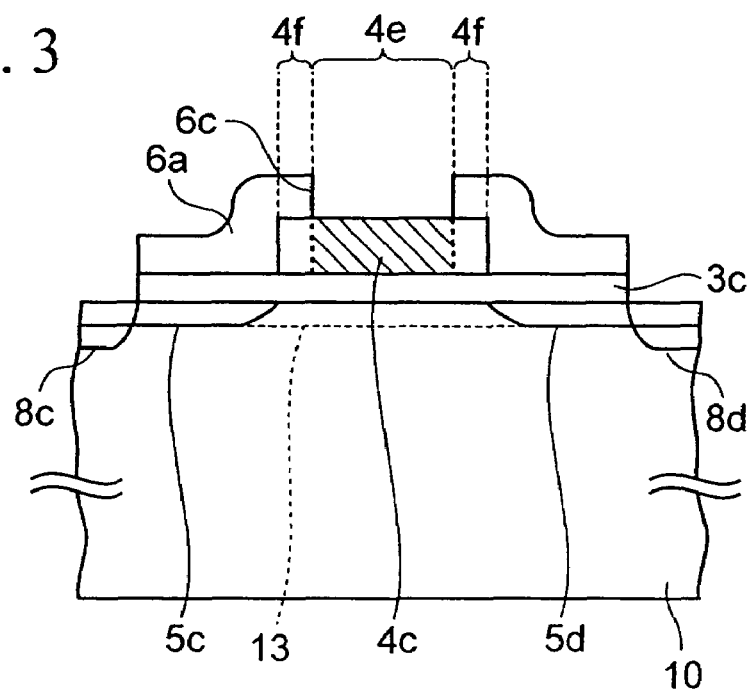
FIG. 3 is an enlarged sectional view showing an event that an impurity is introduced only into a part of a gate electrode, in the method of manufacturing the semiconductor device in the prior art.
Figure 4:
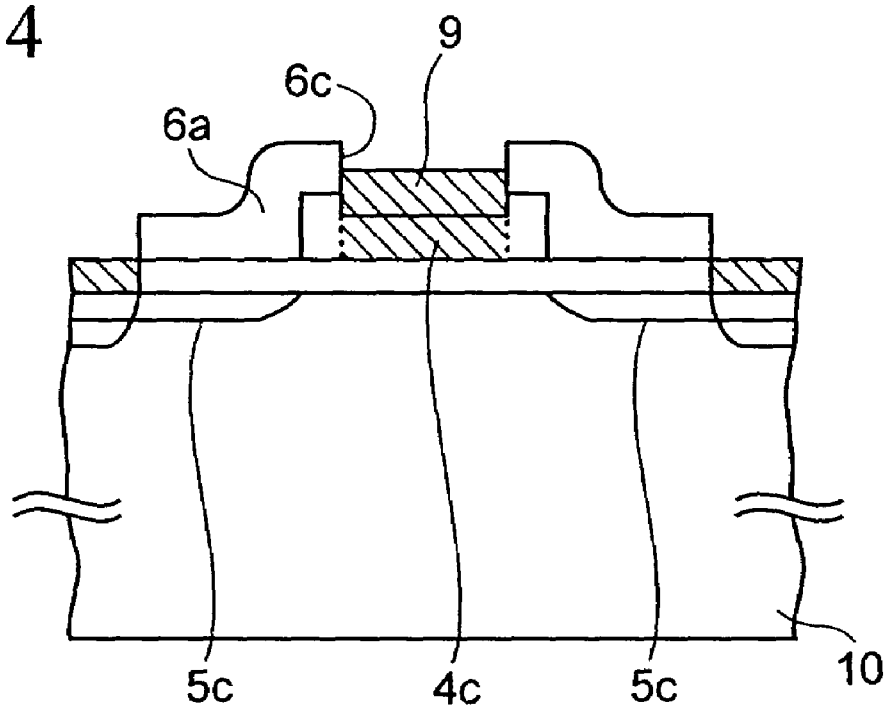
FIG. 4 is an enlarged sectional view showing an event that a silicide layer is formed on a part of an upper surface of the gate electrode, in the method of manufacturing the semiconductor device in the prior art.
Figure 5A:
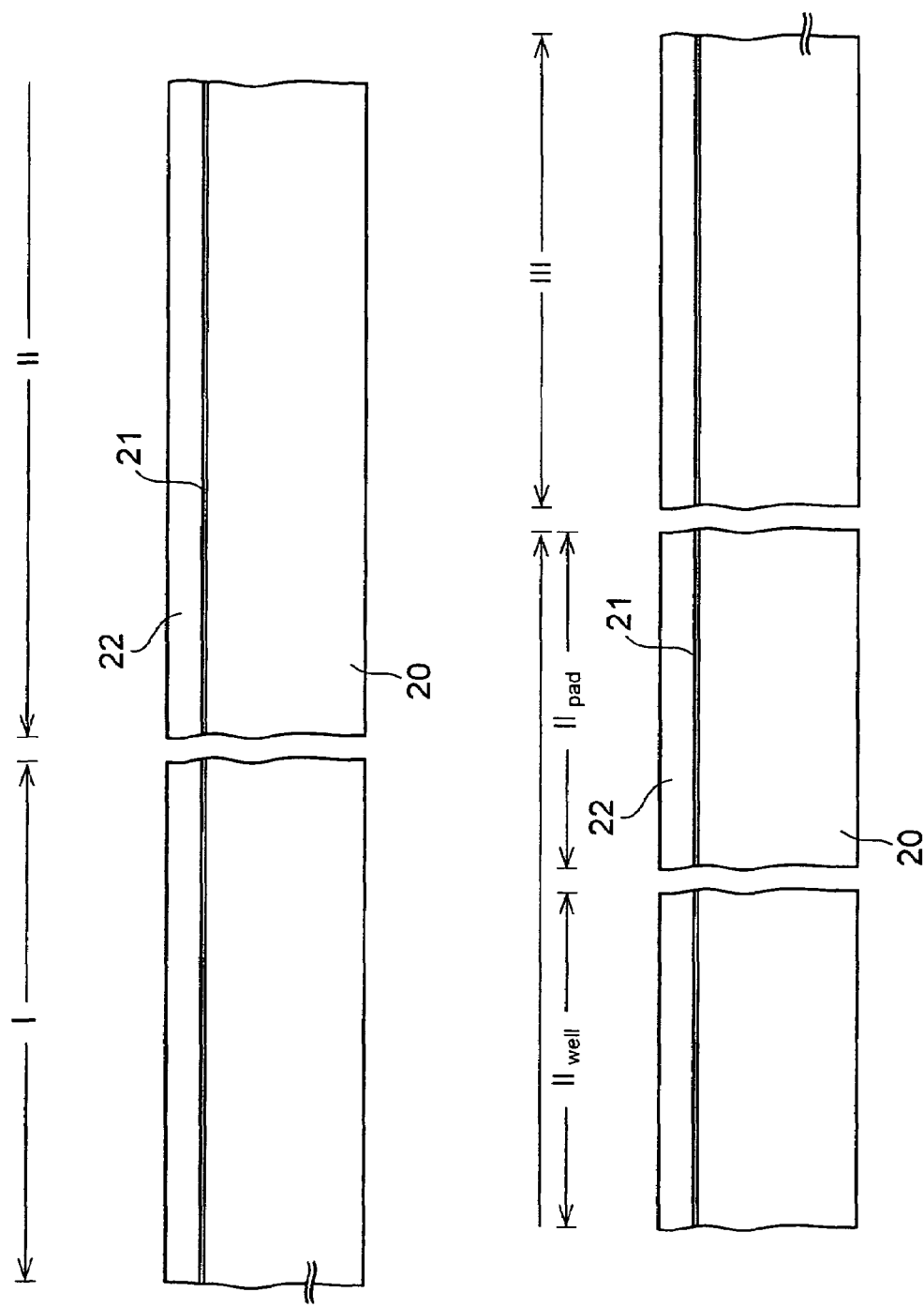
FIGS. 5A to 5S are sectional views showing a semiconductor device according to a first embodiment of the present invention in the manufacturing process respectively.
Figure 5B:
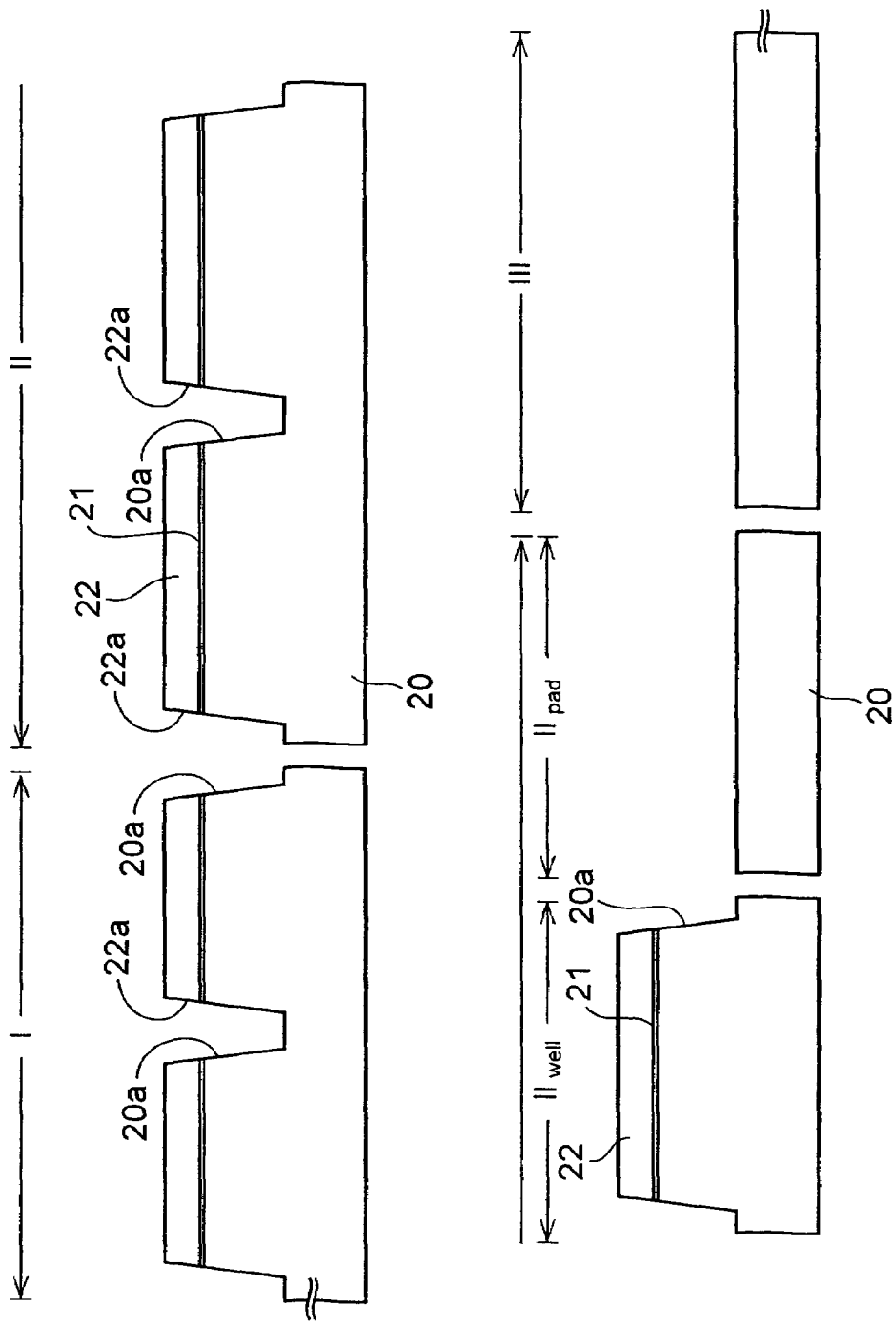
Figure 5C:
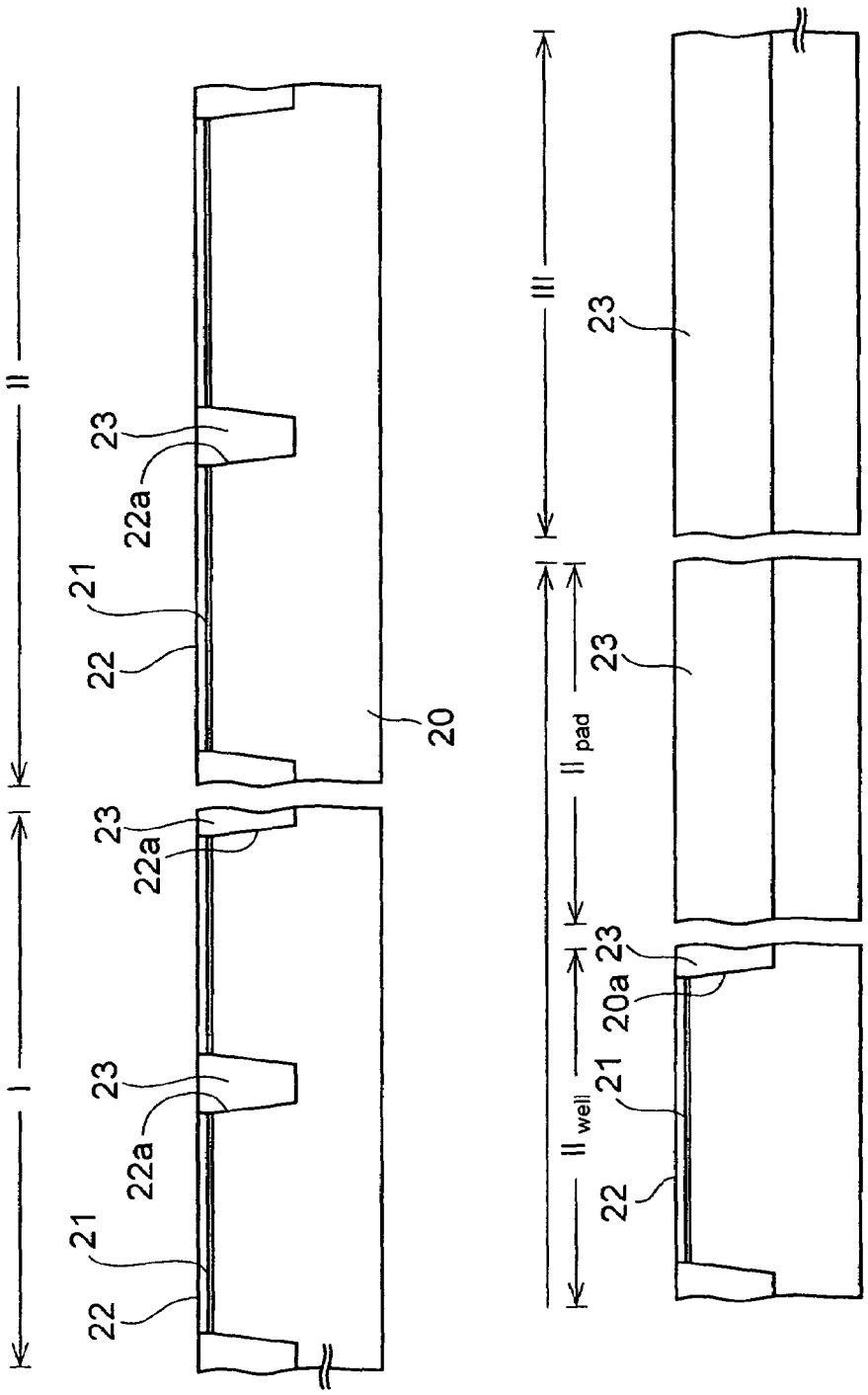
Figure 5D:
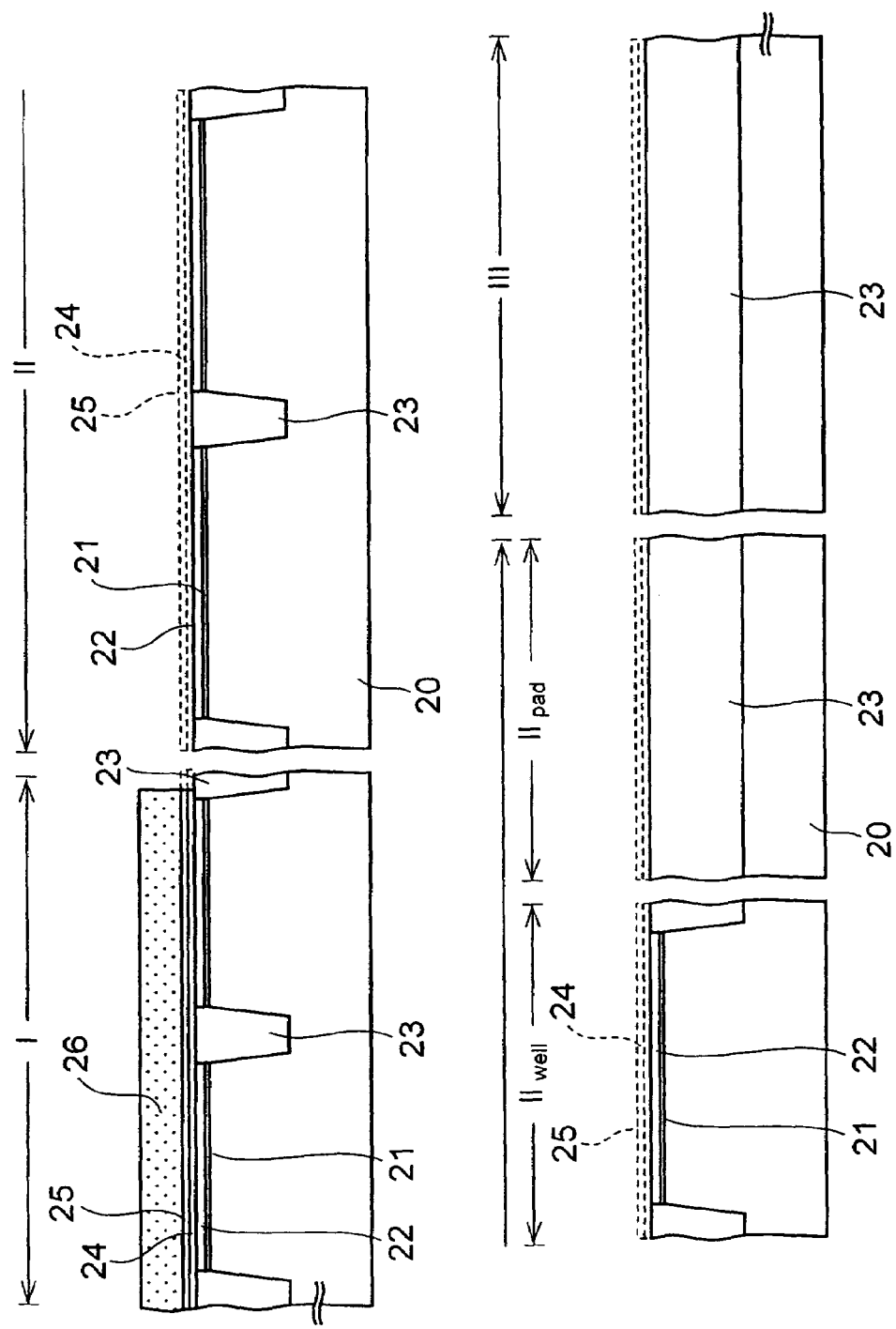
Figure 5E:
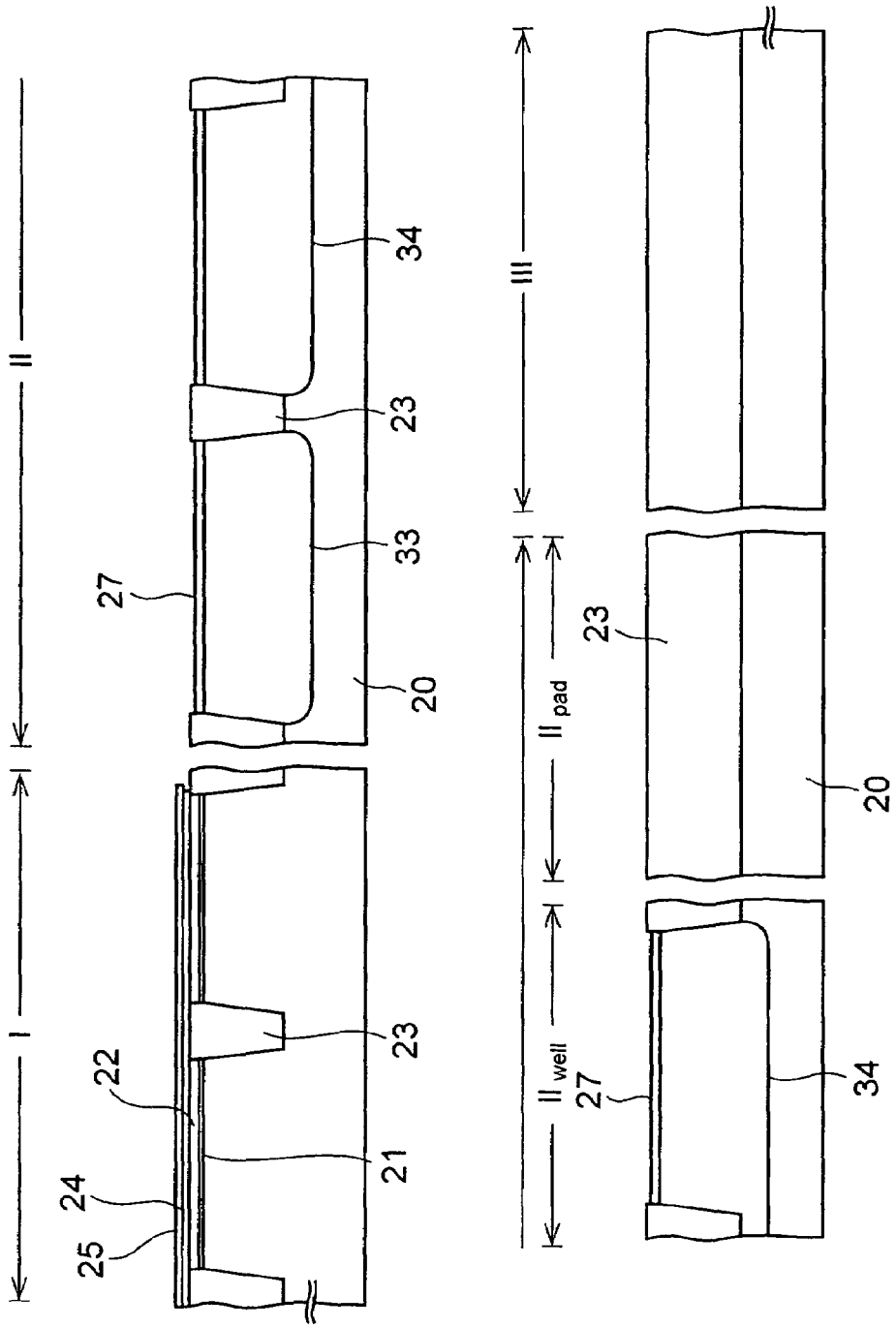
Figure 5F:
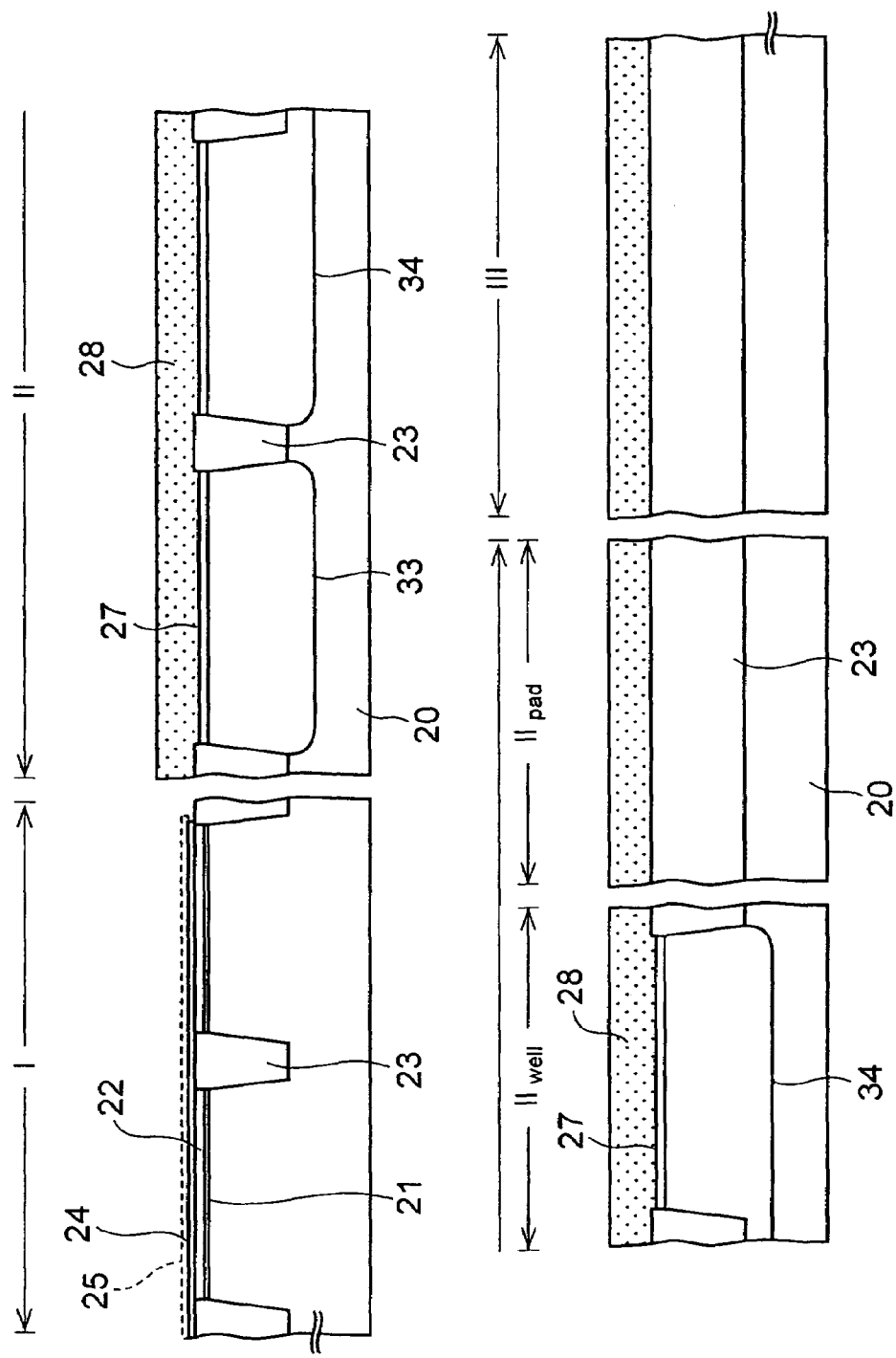
Figure 5G:
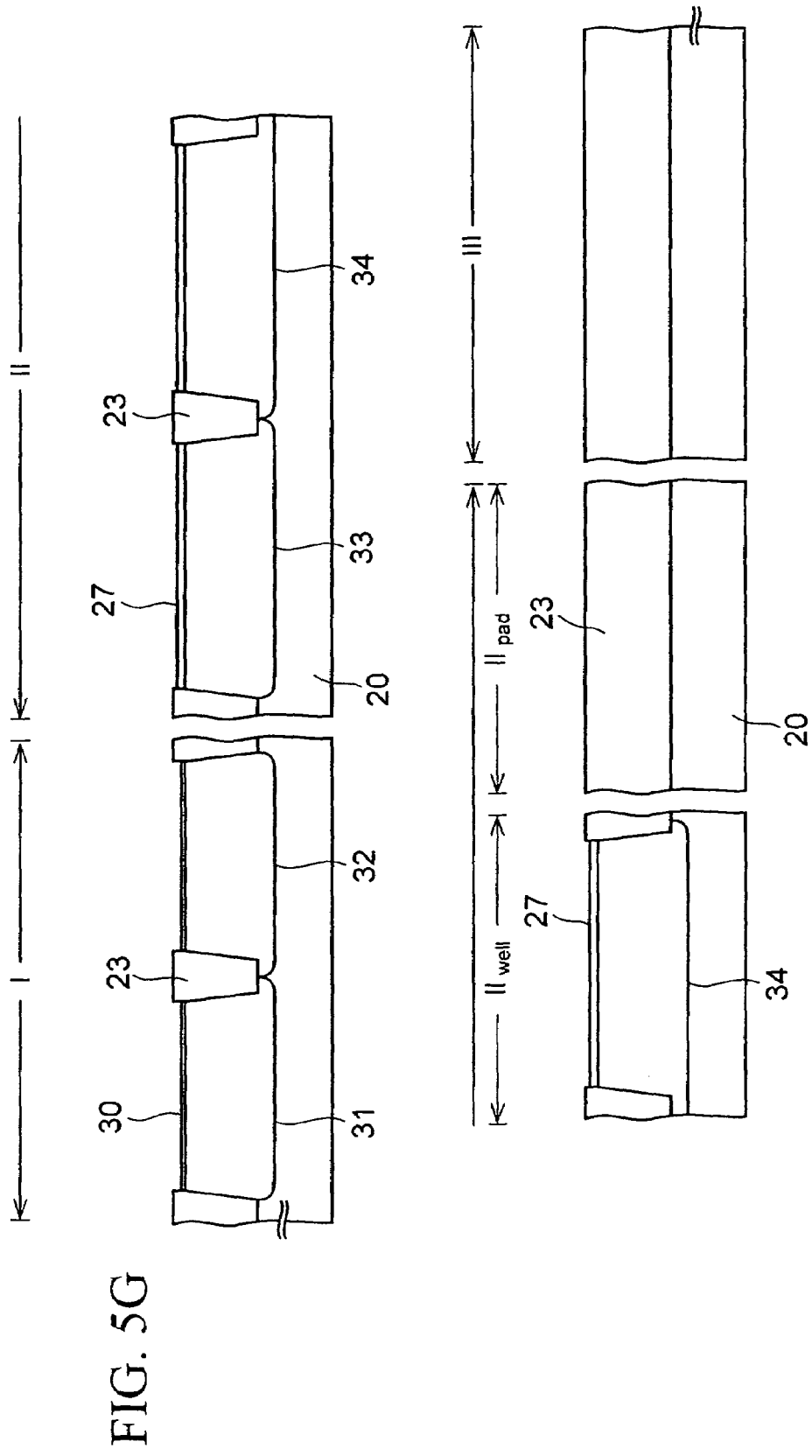
Figure 5H:
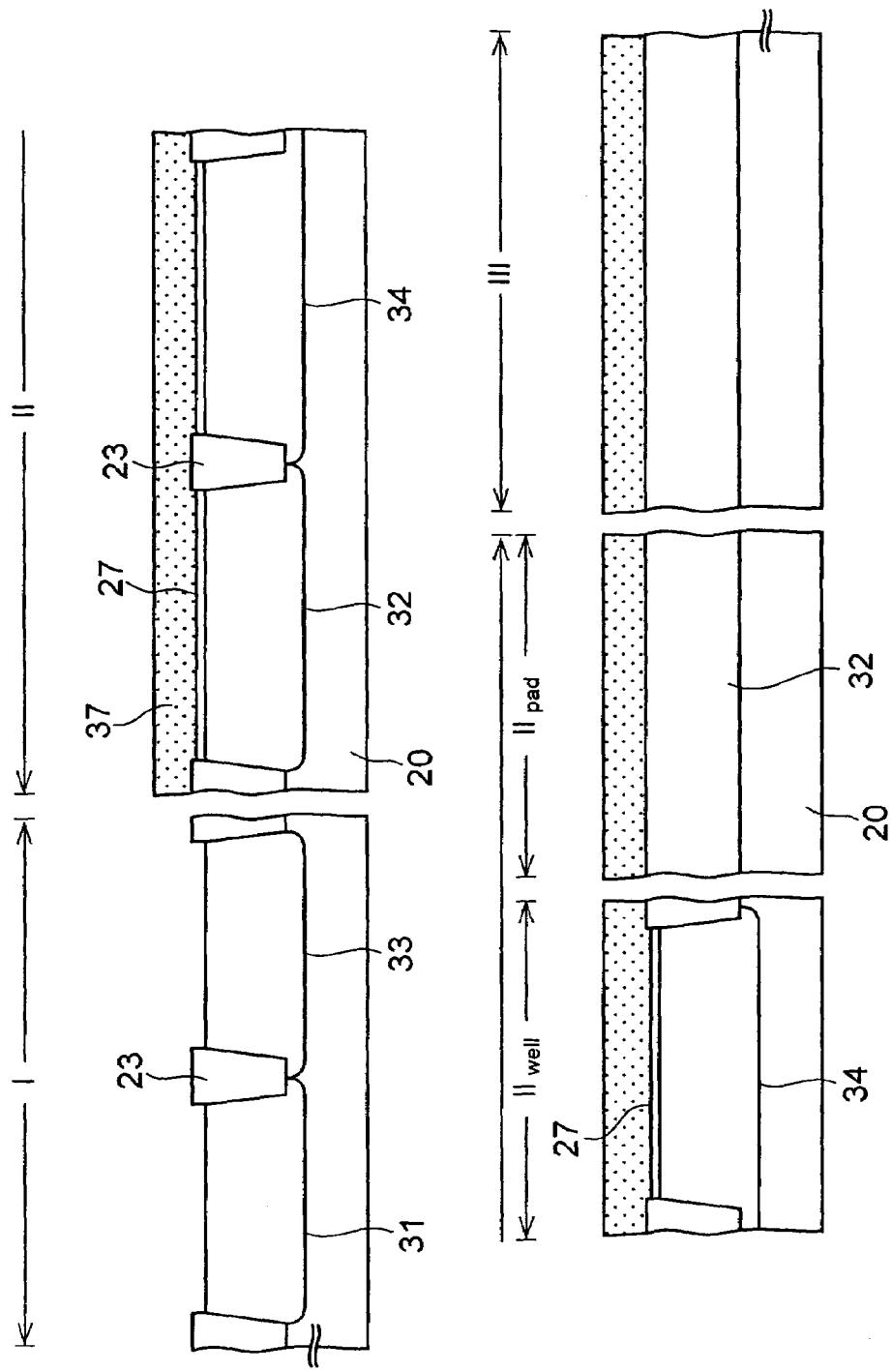
Figure 5I:
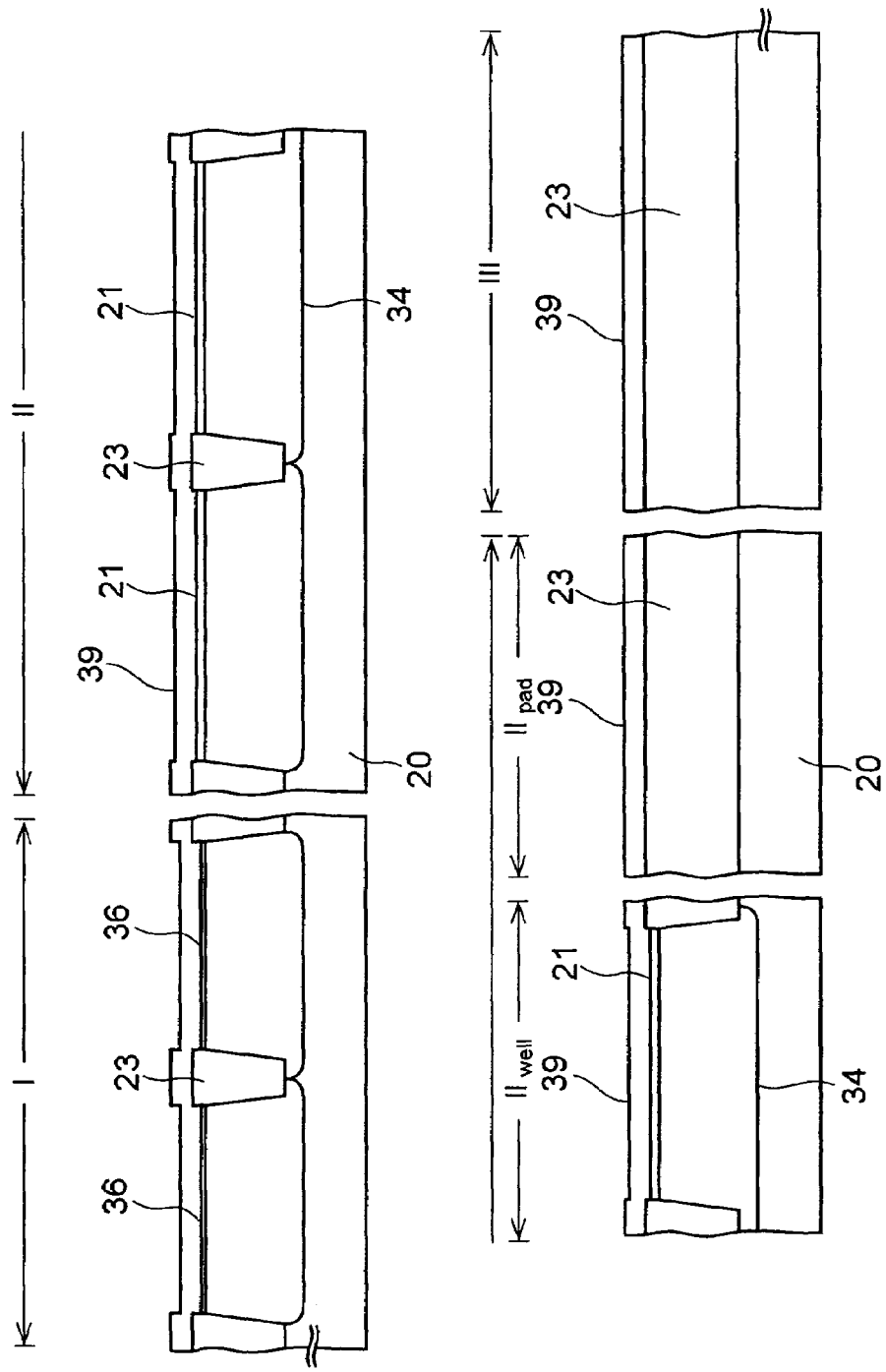
Figure 5J:
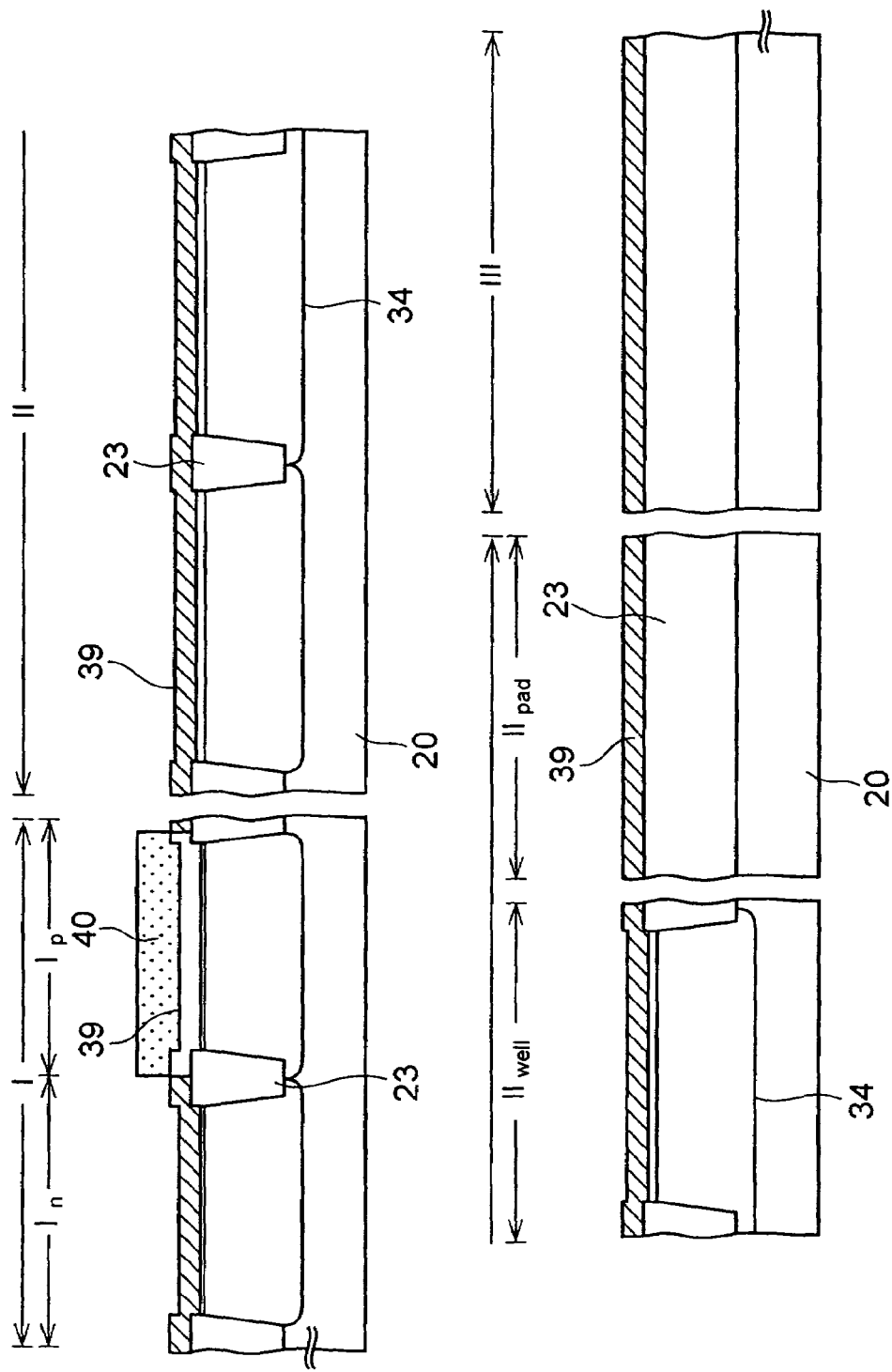
Figure 5K:
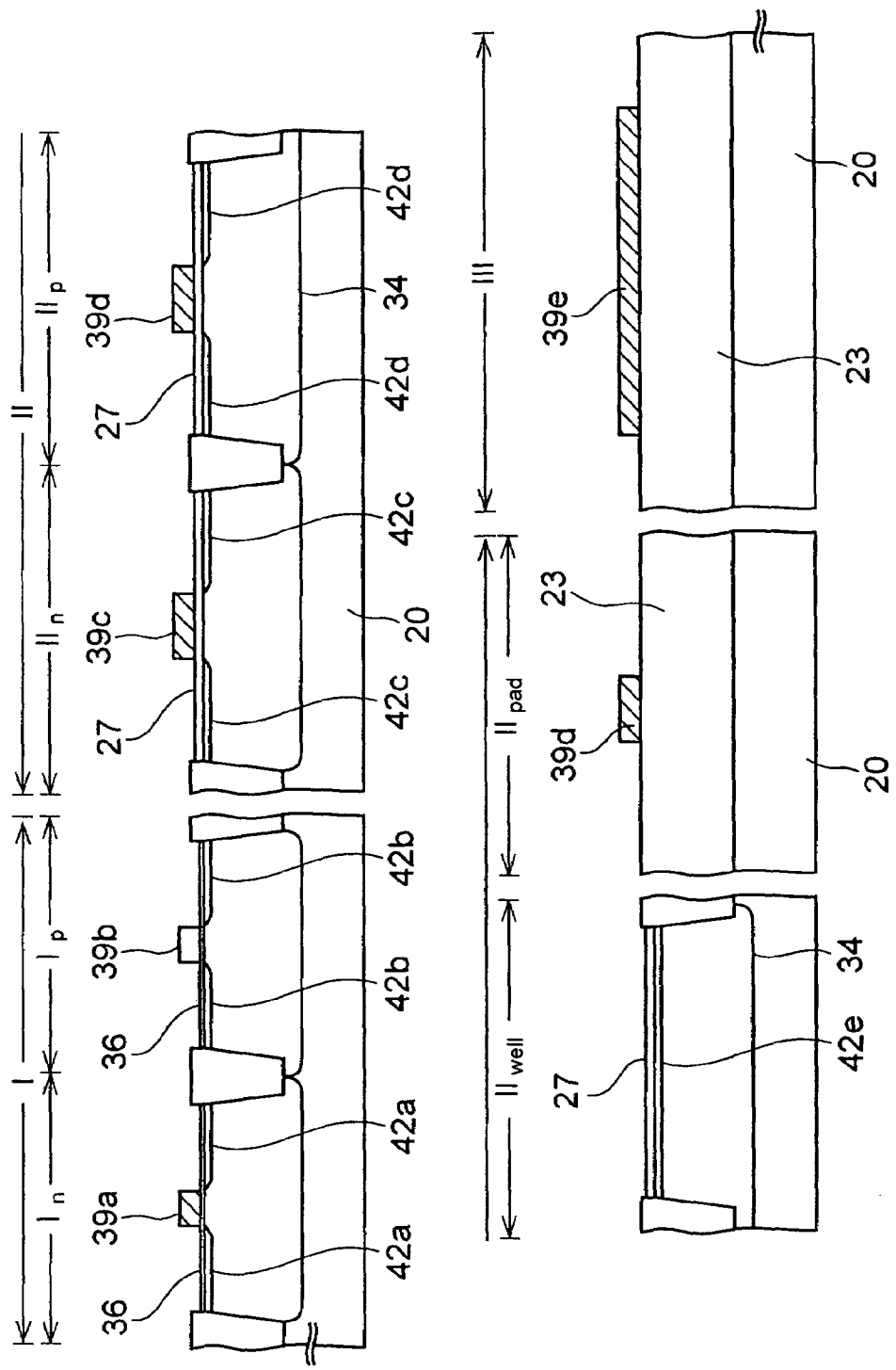
Figure 5L:
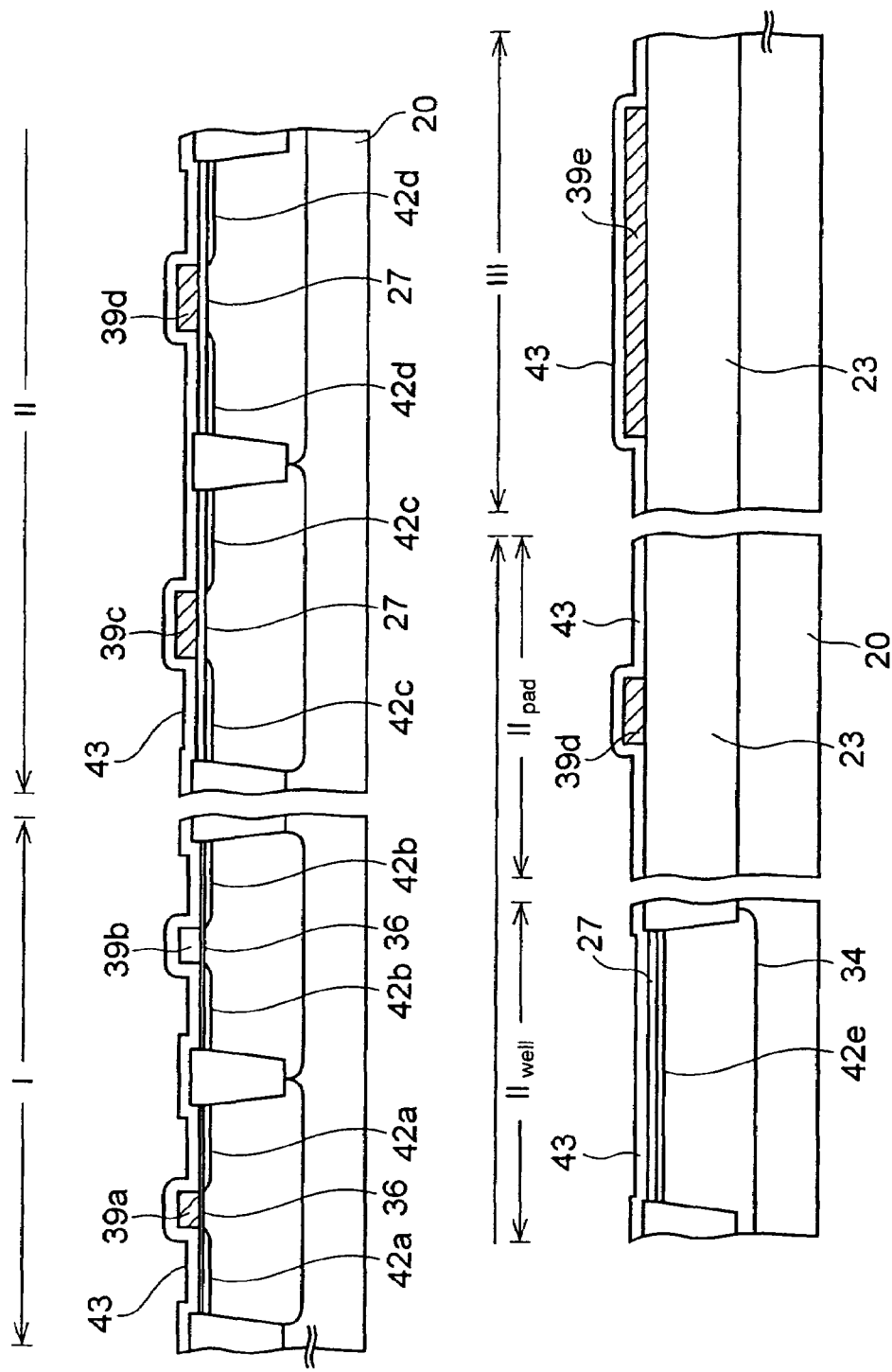
Figure 5M:
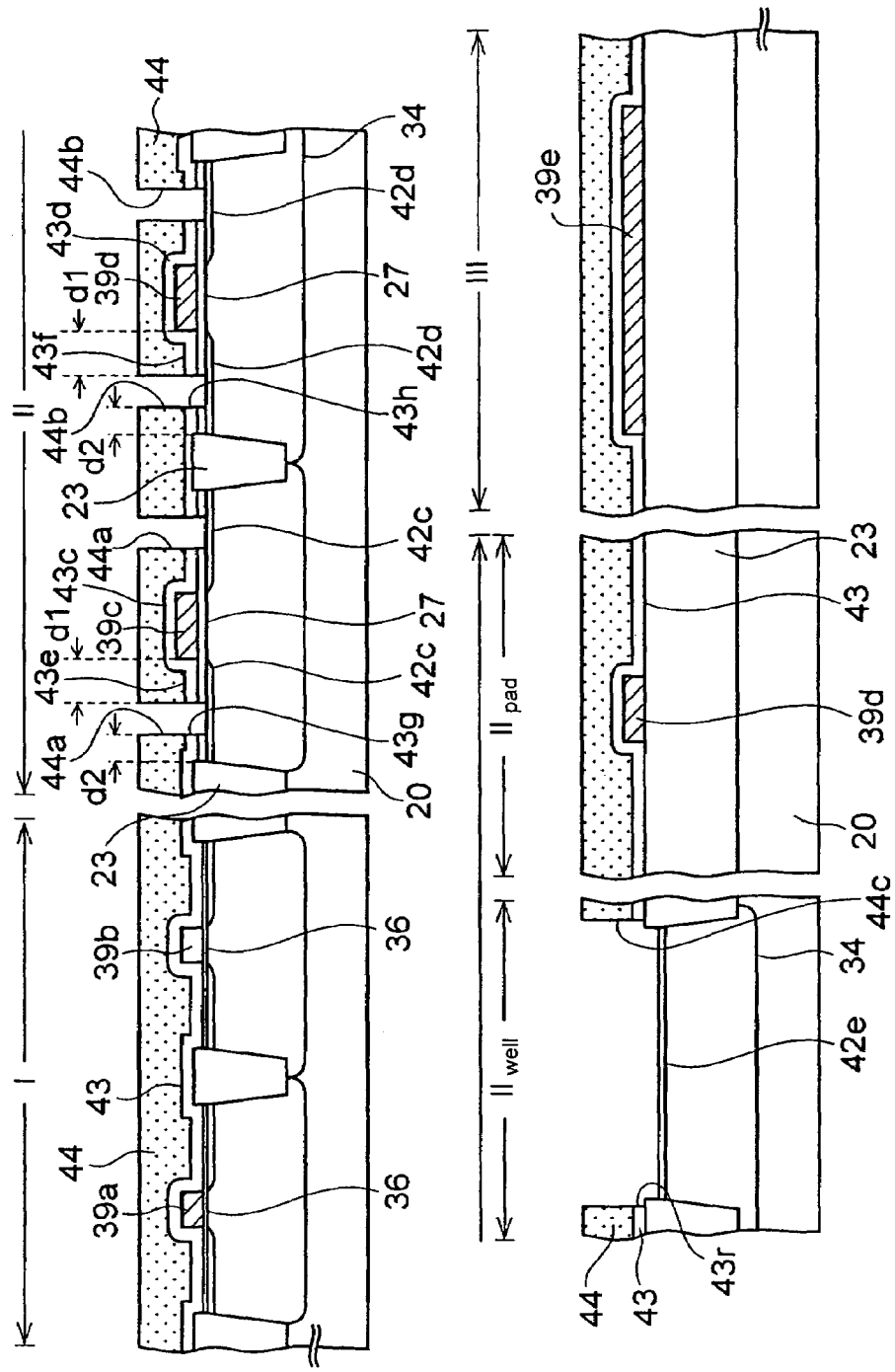
Figure 5N:
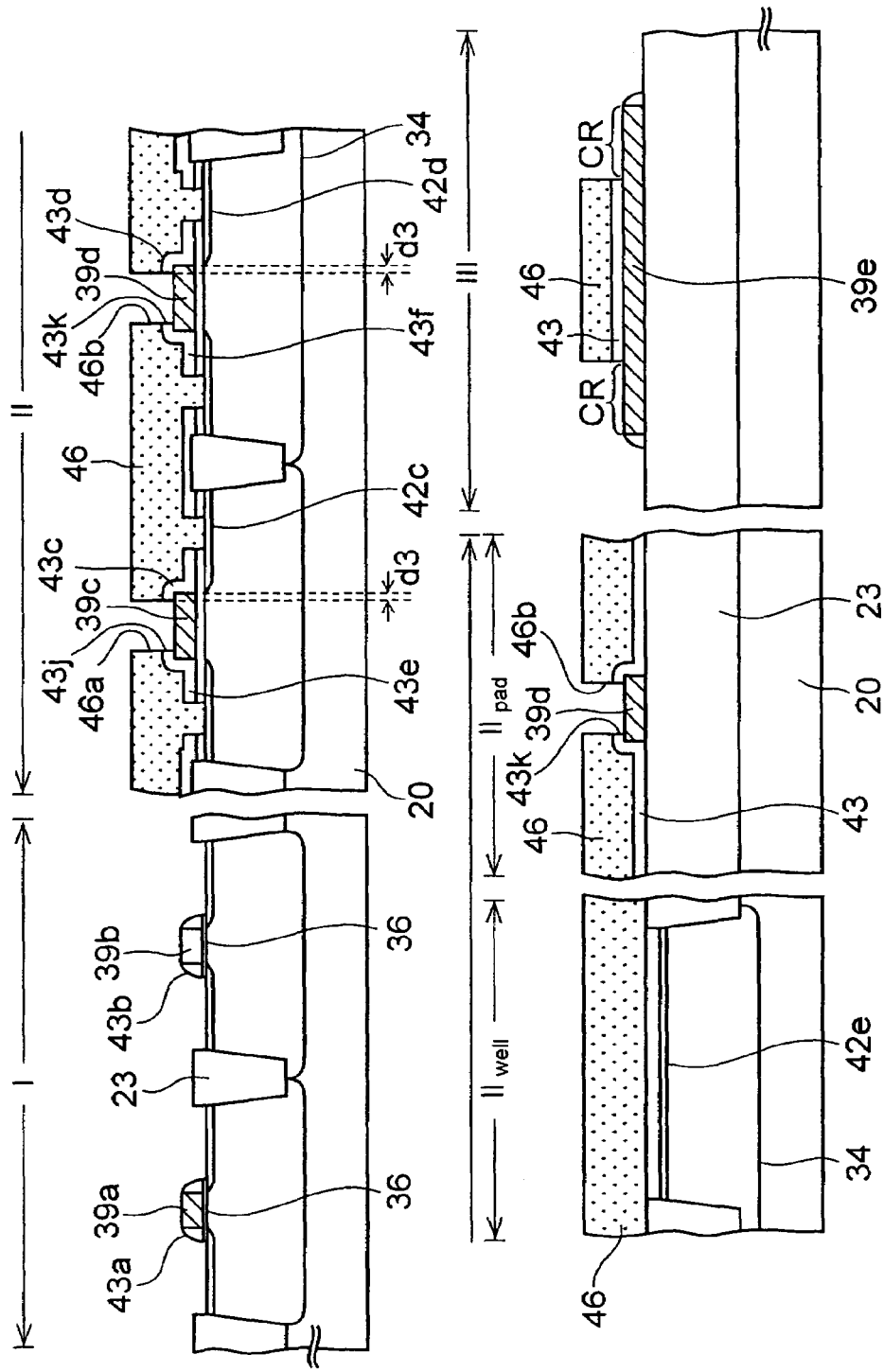
Figure 50:
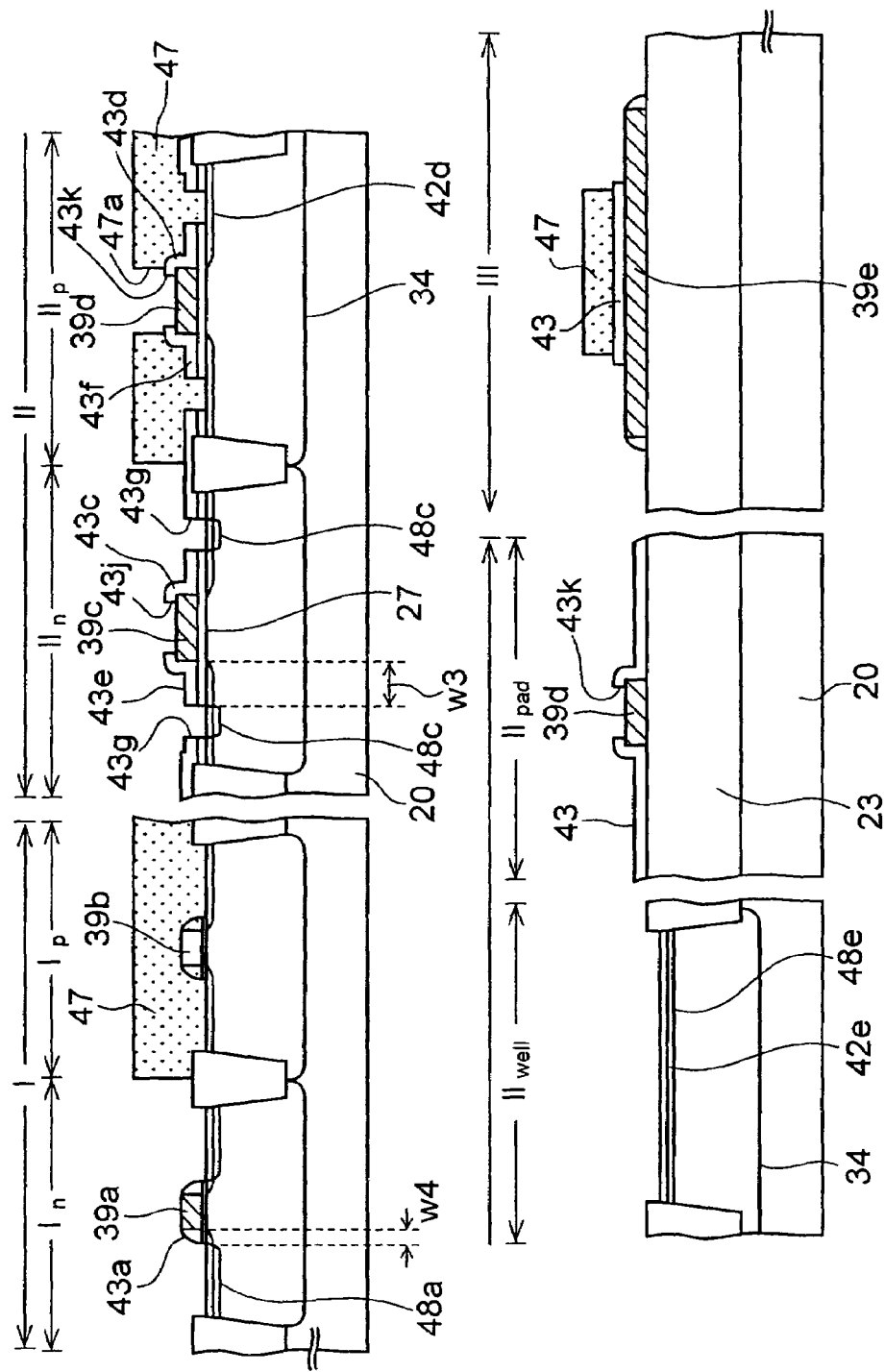
Figure 5P:
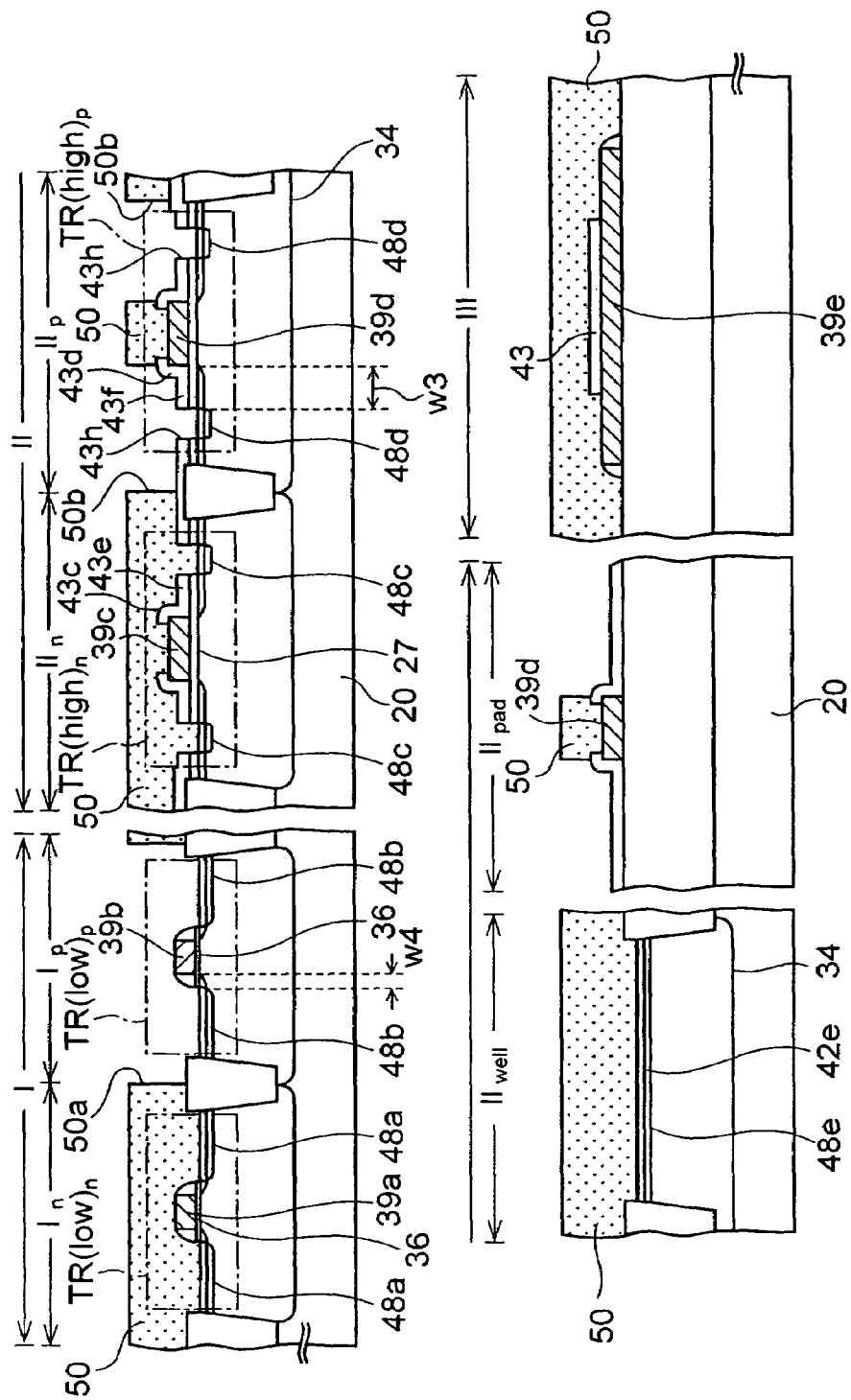
Figure 5Q:
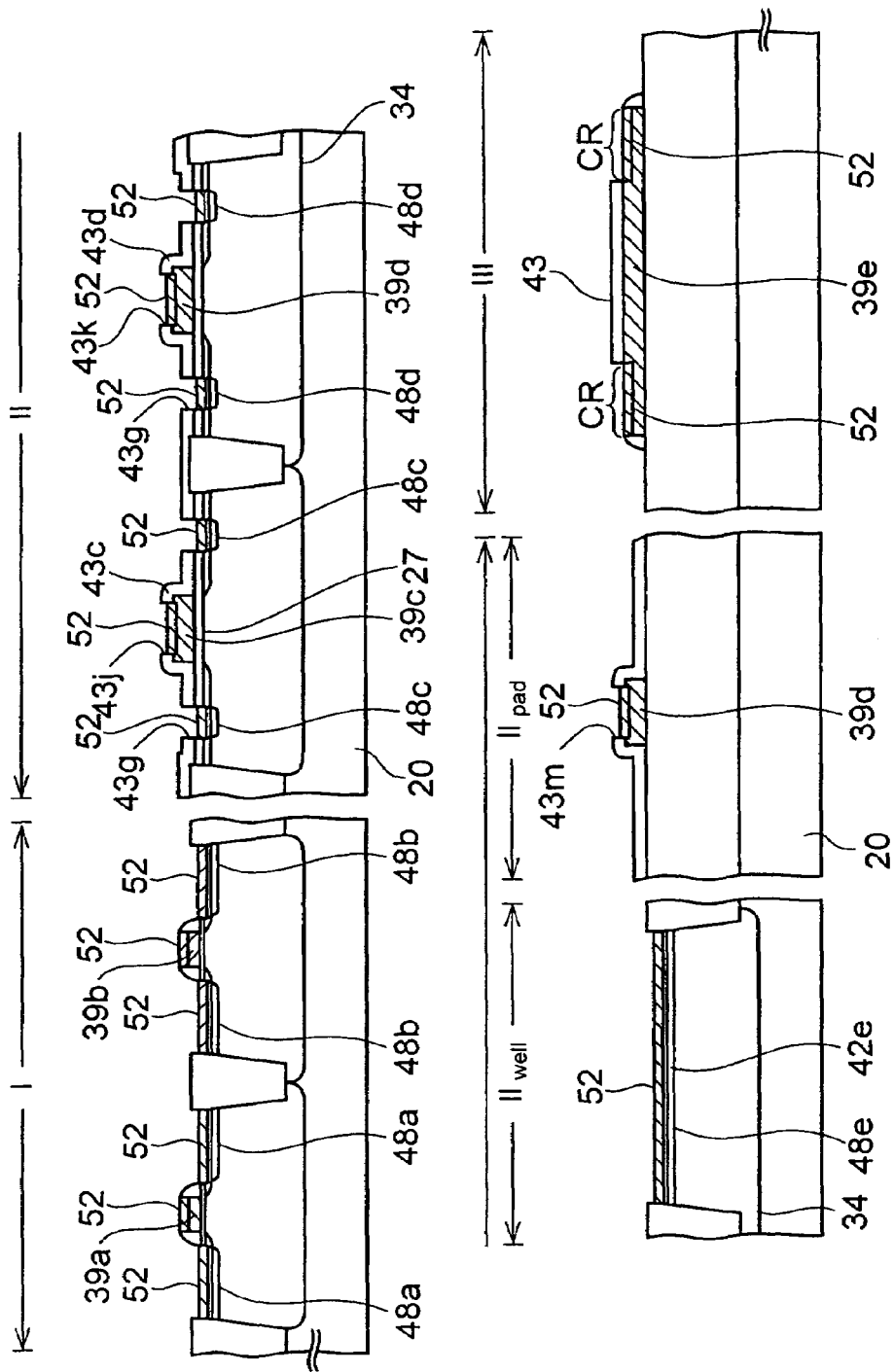
Figure 5R:
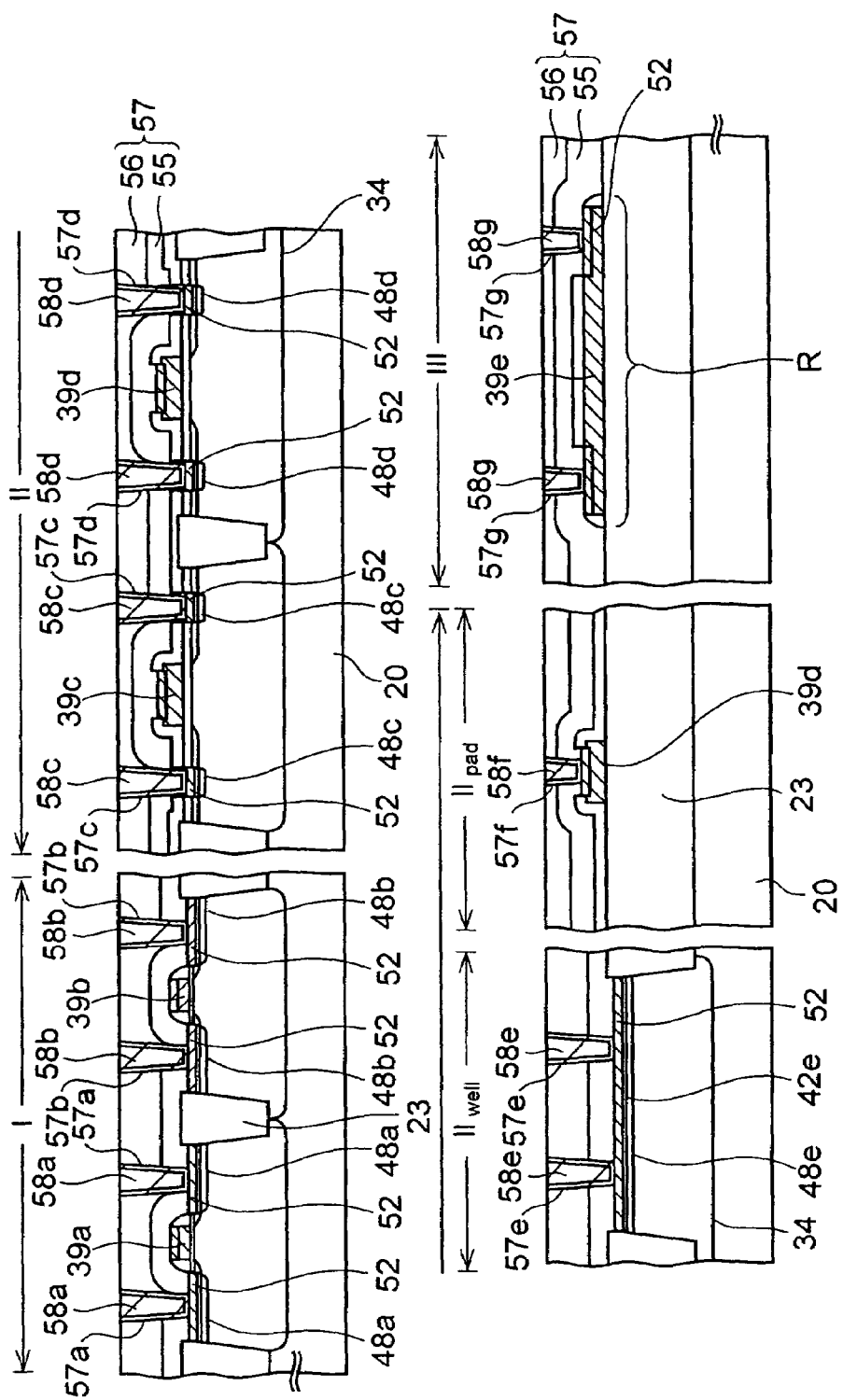
Figure 5S:
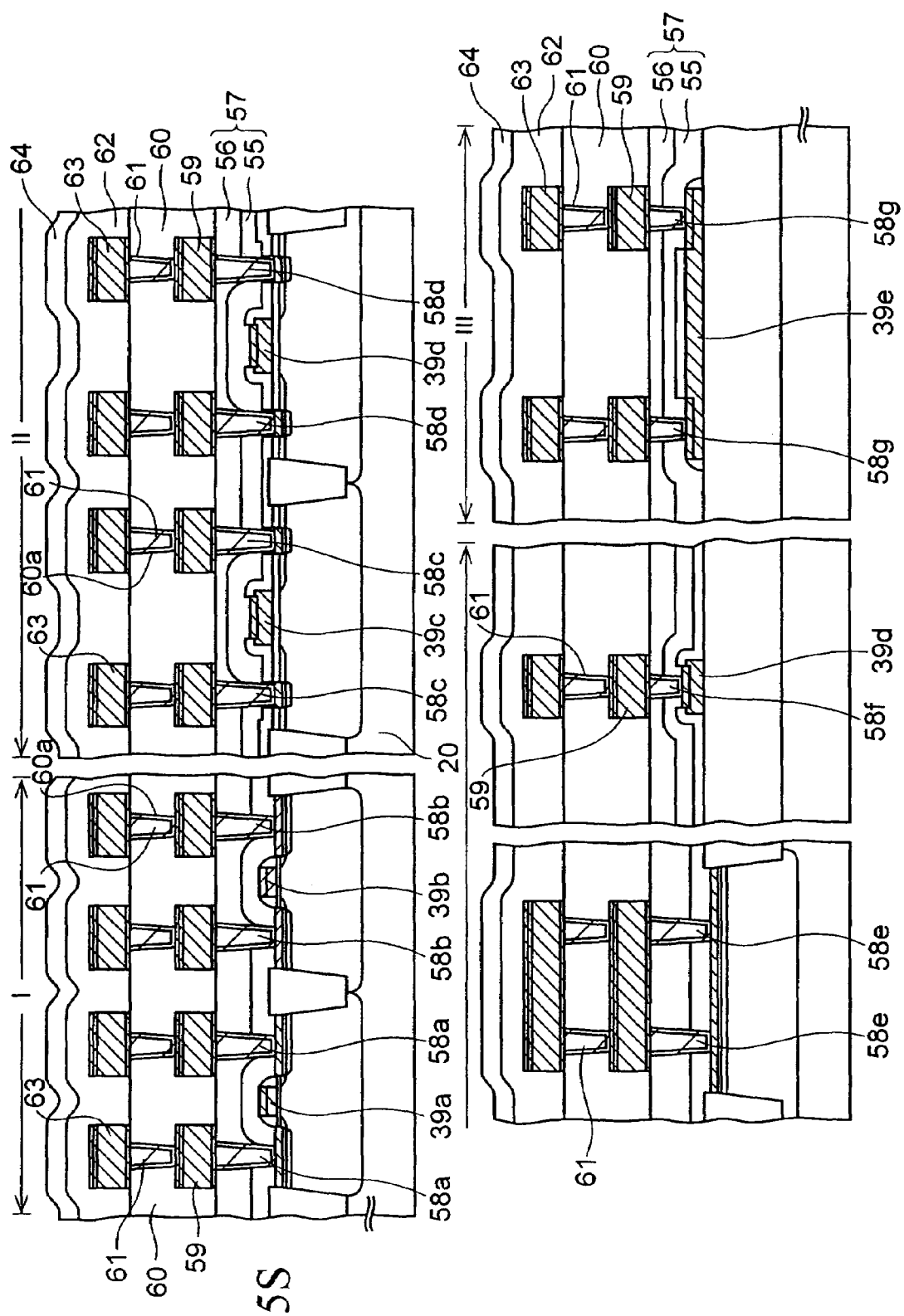

FIGS. 5A to 5S are sectional views showing a semiconductor device according to a first embodiment of the present invention in the manufacturing process respectively.

At first, the steps required until a sectional structure shown in FIG. 5A is obtained will be explained hereunder.

First, a first thermal oxide film 21 of an about 10 nm thickness is formed by thermally oxidizing a surface of a p-type silicon (semiconductor) substrate 20. A normal (low-voltage) transistor forming region I, a high-voltage transistor forming region II, and a resistor forming region III are defined later on this surface of the substrate by an element isolation insulating film. Then, a first silicon nitride film 22 of an about 150 nm thickness is formed thereon by the low pressure CVD method.

In this case, the high-voltage transistor forming region II is further divided into a well contact region $II_{well}$ and a pad region $II_{pad}$. A control plug used to control an electric potential of a well in the high-voltage transistor forming region II is formed later on the silicon substrate 20 in the well contact region $II_{well}$. Also, the pad region $II_{pad}$ is a region in which the portion acting as the pad portion is connected to the conductive plug in the gate electrode in the high-voltage transistor forming region II.

Then, as shown in FIG. 5B, first holes 22a are formed by patterning the first silicon nitride film 22 by means of the RIE (Reactive Ion Etching) using a fluorine-based gas as an etching gas. Then, the first thermal oxide film 21 and the silicon substrate 20 are etched through the first holes 22a by the RIE using a chlorine-based gas as an etching gas. Thus, element isolation insulating trenches 20a each having an about 400 nm depth are formed.

Next, the steps required until a sectional structure shown in FIG. 5C is obtained will be explained hereunder.

First, in order to recover the damage of the side walls of the element isolation insulating trenches 20a caused by the RIE, a thermal oxide film (not shown) of an about 10 nm thickness is formed in the element isolation insulating trenches 20a. Then, a silicon oxide film is formed on the first silicon nitride film 22 by HDPCVD (High Density Plasma CVD) using a silane as a reaction gas, and thus the element isolation insulating trenches 20a are filled completely with the silicon oxide film. Then, the extra silicon oxide film on the first silicon nitride film 22 is removed by the CMP (Chemical Mechanical Polishing) method, and thus the silicon oxide film is left in the element isolation insulating trenches 20a as an element isolation insulating film 23. Such element isolation structure is also called the STI (Shallow Trench Isolation).

Then, as shown in FIG. 5D, a second silicon nitride film 24 of an about 10 nm thickness is formed on the first silicon nitride film 22 by the low pressure CVD method. Then, a silicon oxide film 25 of an about 10 nm thickness is formed on the second silicon nitride film 24 by the low pressure CVD method executed at a substrate temperature of about 750 ℃ to 800 ℃.

Then, a first resist pattern 26 from which the high-voltage transistor forming region II and the resistor forming region III are exposed is formed on the silicon oxide film 25. The second silicon nitride film 24 and the silicon oxide film 25 in the regions II, III are removed by the etching while using the first resist pattern 26 as a mask. The first resist pattern 26 is removed after this etching is finished.

Next, the steps required until a sectional structure shown in FIG. 5E is obtained will be explained hereunder.

First, the first silicon nitride film 22 in the high-voltage transistor forming region II is removed selectively by the wet etching using a phosphoric acid as an etchant. Here, the etching of the first and second silicon nitride films 22, 24 located under the silicon oxide film 25 is prevented by the silicon oxide film 25 in the normal transistor forming region I.

Then, the surface of the silicon substrate 20 in the high-voltage transistor forming region II is thermally oxidized once again. Thus, the thermal oxide film of an about 30 to 100 nm thickness is formed and this film serves as a first gate insulating film 27. Here, the silicon substrate 20 in the normal transistor forming region I is prevented by the second silicon nitride film 24 from being oxidized upon the thermal oxidation.

Then, the p-type impurity and the n-type impurity are ion-implanted into the silicon substrate 20 in the high-voltage transistor forming region II while using the first gate insulating films 27 as a through film, and thus a first p-well 33 and a first n-well 34 are formed. This first n-well 34 is also formed in the well contact region $II_{well}$. In this case, individual implantations of the p-type impurity and the n-type impurity in this step are executed by using resist patterns (not shown), and then the resist patterns are removed after the ion implantation is ended.

Then, as shown in FIG. 5F, a second resist pattern 28 from which the normal transistor forming region I is exposed is formed in the high-voltage transistor forming region II and the resistor forming region III. Then, the silicon oxide film 25 in the normal transistor forming region I is removed by the selective etching, i.e., the RIE using a fluorine-based gas as an etching gas, while using the second resist pattern 28 as a mask. Here, the second silicon nitride film 24 located under the silicon oxide film 25 acts as the etching stopper in this etching.

Then, the second resist pattern 28 is removed.

Next, the steps required until a sectional structure shown in FIG. 5G is obtained will be explained hereunder.

First, the first and second silicon nitride films 22, 24 in the normal transistor forming region I are removed by the wet etching using the phosphoric acid as an etchant.

Then, a second thermal oxide film 30 of an about 10 nm thickness is formed by thermally oxidizing the surface of the silicon substrate 20 in the normal transistor forming region I.

Then, the p-type impurity and the n-type impurity are ion-implanted into the silicon substrate 20 in the normal transistor forming region I while using the second thermal oxide film 30 as the through film. Thus, a second p-well 31 and a second n-well 32 are formed. In this case, individual implantations of the p-type impurity and the n-type impurity in this step are executed by using resist patterns (not shown), and then the resist patterns are removed after the ion implantation is ended.

Then, as shown in FIG. 5H, a third resist pattern 37 from which the normal transistor forming region I is exposed is formed on the high-voltage transistor forming region II and the resistor forming region III. The second thermal oxide film 30 in the normal transistor forming region I is removed by the wet etching using an HF solution while using the third resist pattern 37 as a mask.

Then, the third resist pattern 37 is removed.

Next, the steps required until a sectional structure shown in FIG. 5I is obtained will be explained hereunder.

First, a thermal oxide film of an about 3 to 8 nm thickness is formed by thermally oxidizing the surface of the silicon substrate 20 in the normal transistor forming region I, and this film is used as a second gate insulating film 36.

Then, an undoped polysilicon film of an about 180 nm thickness is formed on the first and second gate insulating film 21, 36 and the element isolation insulating films 23 in the regions I to III respectively by the low-pressure CVD method using as a silane a reaction gas, and this film is used as a conductive film 39.

Then, as shown in FIG. 5J, a fourth resist pattern 40 from which the conductive film 39 in a normal n-type MOS transistor forming region (first low-voltage transistor forming region) $I_n$ and the high-voltage transistor forming region II is exposed is formed on a normal p-type MOS transistor forming region (second low-voltage transistor forming region) $I_p$. Then, the P$^+$ ion as the n-type impurity is ion-implanted selectively into the conductive film 39 under the conditions of an acceleration energy of 20 KeV and a dose amount of $4 \times 10^{15}$ cm$^{-3}$, while using the fourth resist pattern 40 as a mask. As a result, the conductive film 39 is still kept in its undoped condition in the normal p-type MOS transistor forming region $I_p$, but the conductivity of the conductive film 39 is set to the n type in the normal n-type MOS transistor forming region $I_n$, the high-voltage transistor forming region II, and the resistor forming region III.

Then, the fourth resist pattern 40 is removed.

Next, the steps required until a sectional structure shown in FIG. 5K is obtained will be explained hereunder.

First, the conductive film 39 is patterned by the photolithography, and thus first and second gate electrodes 39a, 39b are formed in the normal regions $I_n$, $I_p$ respectively. Also, the conductive film 39 in a high-voltage n-type MOS transistor forming region (first high-voltage transistor forming region) $II_n$ and a high-voltage p-type MOS transistor forming region (second high-voltage transistor forming region) $II_p$ is patterned by the photolithography, and thus third and fourth gate electrodes 39c, 39d are formed in these regions $II_n$, $II_p$ respectively.

These third and fourth gate electrodes 39c, 39d are formed by patterning the portion of the conductive film 39, into which the P$^+$ ion is implanted, as shown in FIG. 5J. Therefore, these gate electrodes have such a structure that the P$^+$ ion is implanted into their entire parts.

Here, the third and fourth gate electrodes 39c, 39d are formed such that their portions acting as the pad are extended on the element isolation insulating films 23. In this case, in FIG. 5K et seq., only the portion serving as the pad of the fourth gate electrode 39d out of them is illustrated in the pad region $II_{pad}$.

In addition, as the result of the above patterning, a resistor pattern 39e serving later as a resistor element is formed on the element isolation insulating films 23 in the resistor forming region III. The conductivity type of this resistor pattern 39e becomes the n type that is same as the third and fourth gate electrodes 39c, 39d, as the result of the ion implantation in FIG. 5K.

Then, the As$^+$ ion as the n-type impurity is ion-implanted into the silicon substrate 20 in the normal n-type MOS transistor forming region $I_n$ under the conditions of an acceleration energy of 10 KeV and a dose amount of $3 \times 10^{14}$ cm$^{-3}$. Thus, a first n-type source/drain extension 42a is formed in the silicon substrate 20 beside the first gate electrode 39a.

Then, the BF$_2^+$ ion as the p-type impurity is ion-implanted into the silicon substrate 20 in the normal p-type MOS transistor forming region $I_p$ under the conditions of an acceleration energy of 10 KeV and a dose amount of $3 \times 10^{14}$ cm$^{-3}$. Thus, a first p-tyoe source/drain extension 42b is formed in the silicon substrate 20 beside the second gate electrode 39b.

Then, in order to make these extensions 42a, 42b hard to diffuse in the later annealing step, RTA (Rapid Thermal Anneal) is applied to the silicon substrate 20 at this point of time. The conditions of RTA are not particularly limited and, in the present embodiment, a substrate temperature is set to 1000 °C and a process time is set to 10 second.

Then, the P$^+$ ion as the n-type impurity and the B$^+$ ion as the p-type impurity are ion-implanted into the silicon substrate in the high-voltage regions $II_n$, $II_p$ respectively. Thus, a second n-type source/drain extension 42c and a second p-type source/drain extension 42d are formed in the silicon substrate 20 beside the third gate electrode 39c and the fourth gate electrode 39d respectively. The conditions of the ion implantation of the extensions 42c, 42d are not particularly limited. In the present embodiment, as the conditions of the ion implantation of the second n-type source/drain extension 42c, an acceleration energy of 80 KeV and a dose amount of $2 \times 10^{12}$ cm$^{-3}$ are employed. Also, as the conditions of the ion implantation of the second p-type source/drain extension 42d, an acceleration energy of 30 KeV and a dose amount of 0.2 to $1 \times 10^{13}$ cm$^{-3}$ are employed.

The impurity is diffused into the extensions 42a, 42b in the normal transistor forming region I to some extent by the above-mentioned RTA before the extensions 42c, 42d are formed in the high-voltage transistor forming region II. Therefore, the impurity distribution in the extensions 42c, 42d in the high-voltage transistor forming region II is ready to extend in later annealing steps in contrast to the normal transistor forming region I.

Also, the above acceleration energy applied to the extensions 42c, 42d in the high-voltage transistor forming region II is an example given when a thickness of the first gate insulating film 27 is set to 30 to 40 nm. The acceleration energy may be increased by almost 8 KeV in the P$^+$ ion and almost 3 KeV in the B$^+$ ion as the thickness of the film is increased every 10 nm.

In addition, the P$^+$ ion is also introduced into the well contact region $II_{well}$ by the above ion implantation applied to the second n-type source/drain extension 42c, and thus a first n-type impurity diffusion region 42e is formed.

Then, as shown in FIG. 5L, a silicon oxide film for covering the first to fourth gate electrodes 39a to 39d and having a thickness of about 100 nm is formed on respective regions I to III by the plasma CVD using a silane as a reaction gas, and this film is used as a sidewall insulating film 43.

Next, the steps required until a sectional structure shown in FIG. 5M is obtained will be explained hereunder.

First, a photoresist is coated on the sidewall insulating film 43, and then a fifth resist pattern 44 is formed by exposing/developing the photoresist. This fifth resist pattern 44 has first and second windows 44a, 44b in portions that are separated from respective sidewalls of the third and fourth gate electrode 39c, 39d by a distance d1. The distance d1 is not particularly limited and, in the present embodiment, such distance is set to about 0.3 to 1.0 µm. Also, the first and second windows 44a, 44b are formed away from the end portion of the element isolation insulating film 23 by a distance d2 of about 0.1 µm.

Also, the fifth resist pattern 44 has a third window 44c in the well contact region $II_{well}$ of the first n-well 34.

Then, the first gate insulating film 27 and the sidewall insulating film 43 are etched through the first and second windows 44a, 44b, and thus first and second openings 43g, 43h are formed under the first and second windows 44a, 44b. Such etching is executed by the RIE and also C$_4$F$_8$+O$_2$+Ar, for example, is employed as an etching gas.

As the result of this etching, the sidewall insulating film 43 located beside the third and fourth gate electrodes 39c, 39d are shaped into third and fourth insulating sidewalls 43c, 43d having extended portions 43e, 43f.

Also, the sidewall insulating film 43 under the third window 44c is removed by the above etching, and thus a second hole 43r from which the first n-type impurity diffusion region 42e in the well contact region $II_{well}$ is exposed is formed in the sidewall insulating film 43.

Then, the fifth resist pattern 44 is removed.

Next, the steps required until a sectional structure shown in FIG. 5N is obtained will be explained hereunder.

First, a sixth resist pattern 46 from which the normal transistor forming region I is exposed is formed on the high-voltage transistor forming region II and the resistor forming region III. The sixth resist pattern 46 has fourth and fifth windows 46a, 46b on the third and fourth gate electrodes 39c, 39d and has an island-like pattern on the resistor pattern 39e.

In this case, an overlapping distance d3 between the fourth and fifth windows 46a, 46b and the third and fourth gate electrodes 39c, 39d is not particularly limited and, in the present embodiment, the distance d3 is set to about 0.1 fÊm.

Then, the sidewall insulating film 43 in the normal transistor forming region I is etched back by about 100 nm by the RIE using $C_4F_8+O_2+Ar$ as an etching gas, for example, while using the sixth resist pattern 46 as a mask. Thus, the sidewall insulating film 43 is left as first and second insulating sidewalls 43a, 43b beside the first and second gate electrodes 39a, 39b.

Also, the third and fourth insulating sidewalls 43c, 43d located under the fourth and fifth windows 46a, 46b are etched by this etching, and thus third and fourth openings 43j, 43k are formed. As a result, the upper surfaces of the third and fourth gate electrodes 39c, 39d except their edge portions whose width is set to d3 are exposed, and also the third and fourth insulating sidewalls 43c, 43d are extended onto the source/drain extensions 42c, 42d from their edges.

Also, the sidewall insulating film 43 that underlies the sixth resist pattern 46 acting as a mask is patterned like an island in the resistor forming region III, and thus a contact region CR of the resistor pattern 39e is exposed.

Then, the sixth resist pattern 46 is removed.

By the way, it may be considered that the above step of forming the third and fourth openings 43j, 43k in the third and fourth insulating sidewalls 43c, 43d is carried out by the etching step shown in FIG. 5M.

However, since the etching step shown in FIG. 5M is the step applied to form the first and second openings 43g, 43h, a thickness of the insulating films 27, 43 is added to an etching depth and thus its etching depth is larger than a thickness of the sidewall insulating film 43 that corresponds to an etching depth to form the third and fourth openings 43j, 43k. Therefore, if the third and fourth openings 43j, 43k are formed simultaneously with the etching step shown in FIG. 5M, the first and second openings 43g, 43h are not opened yet even after these openings are formed. As a consequence, upper surfaces of the third and fourth gate electrodes 39c, 39d are exposed to the etching atmosphere until the first and second openings 43g, 43h are opened. This situation is not preferable because an energy of the plasma in the etching atmosphere is transmitted to the first gate insulating film 27 located under the third and fourth gate electrodes 39c, 39d and thus the first gate insulating film 27 is degraded.

Next, the steps required until a sectional structure shown in FIG. 5O is obtained will be explained hereunder.

First, a seventh resist pattern 47 from which the normal n-type MOS transistor forming region $I_n$ and the high-voltage n-type MOS transistor forming region $II_n$ are exposed is formed on the silicon substrate 20. In this case, the seventh resist pattern 47 has a sixth window 47a from which the fourth gate electrode 39d is exposed, and has a planar shape that is smaller than the sidewall insulating film 43 in the resistor forming region III. Also, the well contact region $II_{well}$ is not covered with the seventh resist pattern 47 and is exposed.

Then, the $P^+$ ion is ion-implanted into the silicon substrate 20 under the conditions of an acceleration energy of 10 to 15 KeV and a dose amount of $2 \square 10^{15}$ cm$^{-3}$, while using the seventh resist pattern 47 as a mask. As a result, a first n-type source/drain region (low-voltage first conductivity type source/drain region) 48a is formed in the silicon substrate 20 beside the first gate electrode 39a.

Also, a second n-type source/drain region (high-voltage first conductivity type source/drain region) 48c is formed in the silicon substrate 20 under the first openings 43g in the high-voltage transistor forming region II, and also the $P^+$ ion is implanted into the third and fourth gate electrodes 39c, 39d. In addition, the $P^+$ ion is implanted into the portion of the resistor pattern 39e in which the sidewall insulating film 43 is not formed in the resistor forming region III, and a resistance of the portion is lowered. Then, a deep second n-type impurity diffusion region 48e whose impurity concentration is higher than the first n-type impurity diffusion region 42e is formed in the well contact region $II_{well}$.

Meanwhile, according to the above ion implantation, because the extended portion 43e of the third insulating sidewall 43c in the high-voltage transistor forming region II acts as a mask, the $P^+$ ion is not implanted into the silicon substrate 20 under this extended portion 43e. Therefore, an offset W3 (second interval) of the second n-type source/drain region 48c formed as above is equal to the distance d1 of the extended portion 43e and is set to about 0.3 to 1.0 fÊm.

In contrast, the extended portion is not provided to the first insulating sidewall 43a in the normal transistor forming region I. Therefore, an offset W4 (first interval) of the first n-type source/drain region 48a becomes smaller than the offset W3 in the high-voltage transistor forming region.

The seventh resist pattern 47 is removed after this ion implantation is ended.

Next, the steps required until a sectional structure shown in FIG. 5P is obtained will be explained hereunder.

First, an eighth resist pattern 50 having eighth and ninth windows 50a, 50b, from which the source/drain forming regions in the normal p-type MOS transistor forming region $I_p$ and the high-voltage p-type MOS transistor forming region $II_p$ are exposed, is formed on the silicon substrate 20. Also, the well contact region $II_{well}$ is covered with the eighth resist pattern 50.

Then, the $B^+$ ion is ion-implanted into the silicon substrate 20 under the conditions of an acceleration energy of 5 KeV and a dose amount of $2 \ 10^{15}$ cm$^{-3}$, while using the eighth resist pattern 50 as a mask. As a result, a first p-type source/drain region (high-voltage second conductivity type source/drain region) 48d is formed on the silicon substrate 20 under the second opening 43h, and also a second p-type source/drain region (low-voltage second conductivity type source/drain region) 48b is formed on the silicon substrate 20 beside the second gate electrode 39b.

Then, according to this ion implantation, the $B^+$ ion is ion-implanted into the second gate electrode 39b that is kept in its undoped condition up to now, and thus the conductivity type of the second gate electrode 39b is set to the p type.

In this ion implantation, the extended portion 43f of the fourth insulating sidewall 43f acts as a mask. Therefore, the $B^+$ ion is not implanted into the silicon substrate 20 under this extended portion 43f. Therefore, the offset W3 of the first p-type source/drain region 48d is equal to the distance d1 of the extended portion 43f and is set to about 0.3 to 1.0 fÊm. Also, because the extended portion is not provided to the second insulating sidewall 43b, which acts as a mask at the time of ion implantation, in the second p-type source/drain region 48b, its offset W4 becomes shorter than the above offset W3.

Then, the eighth resist pattern 50 is removed. Then, the impurity injected into respective source/drain regions 48a to 48d is activated by the RTA that is executed in the nitrogen atmosphere at a substrate temperature of 1000 ☐Z for a process time of 10 second.

According to the steps up to now, a basic structure consisting of an n-type normal MOS transistor $TR(low)_n$ and a p-type normal MOS transistor $TR(low)_p$ is completed in the normal transistor forming region I, while a basic structure consisting of an n-type high-voltage MOS transistor $TR(high)_n$ and a p-type high-voltage MOS transistor $TR(high)_p$ is completed in the high-voltage transistor forming region II.

Out of these transistors, the transistors $TR(low)_n$, $TR(low)_p$ in the normal transistor forming region I have the same conductivity type of the gate electrode and the source/drain regions, and are of the surface channel type. Also, the dual gate structure can be realized by such n-type and p-type transistors $TR(low)_n$, $TR(low)_p$ of the surface channel type in the normal transistor forming region I.

In contrast, the offset W3 (see FIG. 5O) of the MOS transistor $TR(high)_n$ formed in the high-voltage transistor forming region II is larger than the offset W4 in the normal transistor forming region I. Therefore, the source-drain withstand voltage can be enhanced in the MOS transistor $TR(high)_n$, so that this MOS transistor $TR(high)_n$ can be employed as the high-voltage transistor that is used to apply a high voltage to the alignment electrodes in the liquid crystal panel, for example. For the same reason, the MOS transistor $TR(high)_p$ can serve as the high-voltage MOS transistor.

Also, a thickness of the first gate insulating film 27 constituting the high-voltage MOS transistors $TR(high)_n$, $TR(high)_p$ is set to about 30 to 100 nm, and is thicker than a thickness (3 to 8 nm) of the second gate insulating film 36. Therefore, the source-drain withstand voltage of the high-voltage MOS transistors $TR(high)_n$, $TR(high)_p$ can be enhanced in contrast to the normal MOS transistors $TR(low)_n$, $TR(low)_p$.

Now, the low voltage (normal) and the high voltage mentioned in this specification denotes an event that one driving voltage is higher than the other driving voltage, and these voltage values are not particularly limited.

Next, the steps required until a sectional structure shown in FIG. 5Q is obtained will be explained hereunder.

First, a cobalt layer of an about 10 nm thickness is formed as a refractory metal layer on the source/drain regions 48a to 48d and the first to fourth gate electrodes 39a to 39d by the sputter method. Then, a silicide layer 52 is formed by causing the cobalt layer to react with the silicon by the first RTA at a substrate temperature of about 500 ☐Z. This silicide layer 52 is also formed on the silicon substrate 20 in the well contact region $II_{well}$. Then, the unreacted cobalt layer on the element isolation insulating film 23, and the like is removed by the wet etching while employing a mixed solution consisting of APM (pure water+hydrogen peroxide+NH$_4$OH) and SPM (sulfuric acid+hydrogen peroxide) as an etchant.

Then, the RTA is applied again to the silicide layer 52 at a substrate temperature higher than the first RTA, e.g., a substrate temperature of about 840 ☐Z. The crystals of the cobalt silicide layer 52 are transferred into the low resistance phase by such high-temperature RTA, so that a parasitic resistance of the MOS transistors $TR(low)_n$, $TR(low)_p$, $TR(high)_n$, $TR(high)_p$ can be suppressed.

The cobalt silicide layer 52 is formed on the overall upper surfaces of the first and second gate electrodes 39a, 39b, but such cobalt silicide layer 52 is formed only on the portions of the third and fourth gate electrodes 39c, 39d except the edge portions of the upper surfaces of these gate electrodes.

Also, in the high-voltage transistor forming region II, the cobalt silicide layer 52 is also formed on the contact region CR of the resistor pattern 39e, and a resistance of the resistor pattern 39e in the contact region CR is lowered.

Next, the steps required until a sectional structure shown in FIG. 5R is obtained will be explained hereunder.

First, a silicon oxide film of an about 20 nm thickness and a silicon nitride film of an about 70 nm thickness are formed on the overall surface in this order by the plasma CVD method, and thus these films are used as an etching stopper film 55. In this case, the etching stopper film 55 may be formed of the silicon nitride film only. But it is preferable that the silicon oxide film should be formed together to relax a stress in the etching stopper film 55.

Then, a silicon oxide film of an about 1000 nm thickness is formed as an insulating film 56 on the etching stopper film 55 by the HDPCVD method. The insulating film 56 together with the etching stopper film 55 constitutes a first interlayer insulating film 57.

Then, an upper surface of the first interlayer insulating film 57 is polished and planarized by the CMP method. Thus, a thickness of the first interlayer insulating film 57 on the planar surface of the silicon substrate 20 is set to about 700 nm.

Then, the first interlayer insulating film 57 is patterned by the photolithography and the etching. Thus, first to fourth holes each having a depth that reaches the silicide layer 52 on the source/drain regions 48a to 48d are formed. Also, fifth and sixth holes 57e, 57f are formed in the well contact region $II_{well}$ and the pad region $II_{pad}$ in the high-voltage transistor forming region II by the patterning respectively. Then, seventh holes 57g each having a depth that reaches the contact region CR of the resistor pattern 39e are formed in the first interlayer insulating film 57 in the resistor forming region III.

The etching to form the holes 57a to 57g is executed in two steps, i.e., the etching to the insulating film 56 and the etching to the etching stopper film 55. The first etching to the insulating film 56 is stopped by the etching stopper film 55. In order to stop the etching in such manner, the etching gas to increase a selective etching ratio between the insulating film 56 and the etching stopper film 55 should be employed. In the present embodiment, $C_4F_8+O_2+Ar$ is employed as the etching gas. In contrast, in the etching of the etching stopper film 55 containing mainly the silicon nitride, $C_4F_8+CF_4+O_2+Ar$ is employed as the etching gas.

Such two-step etching and the etching gas employed therein are similar in respective embodiments described later.

Then, a Ti (titanium) film of an about 20 to 50 nm thickness is formed on the first interlayer insulating film 57 and on inner surfaces of first to seventh holes 57a to 57g by the sputter method. Then, a surface layer of the Ti film is nitrided by the RTA executed at a substrate temperature of 650 to 700 ☐Z in the nitrogen atmosphere, to enhance the barrier property of the Ti film. Then, a TiN (titanium nitride) film of an about 50 nm thickness is formed on the Ti film by the sputter method. Then, a W (tungsten) film is formed on the TiN film by the CVD method using a tungsten hexafluoride as a reaction gas, to bury completely the first to seventh holes 57a to 57g. Then, extra Ti film, TiN film, and W film formed on the first interlayer insulating film 57 are removed by the CMP method, and thus these films are left in the first to seventh holes 57a to 57g as first to seventh conductive plugs 58a to 58g.

Out of these conductive plugs, two conductive plugs 58g formed in the resistor forming region and the resistor pattern 39e constitute the resistor element R. The conductive plugs 58g function as two terminals of the resistor element R.

Next, the steps required until a sectional structure shown in FIG. 5S is obtained will be explained hereunder.

First, Ti film, TiN film, Cu-containing Al film, Ti film, and TiN film are formed on the first interlayer insulating film 57 in this order by the sputter method to have a thickness of 50 nm, 12 nm, 400 nm, 5 nm, and 70 nm respectively. Then, first-layer metal wirings 59 are formed by patterning these stacked films by means of the photolithography.

Then, a silicon oxide film of an about 750 nm thickness is formed on the first interlayer insulating film 57 and the first-layer metal wiring 59 by the HDPCVD method. Spaces between the first-layer metal wirings 59 are buried with the silicon oxide film. In addition, another silicon oxide film of an about 1000 nm thickness is formed on the silicon oxide film by the plasma CVD method using TEOS as a reaction gas, whereby these two-layer silicon oxide films constitute a second-layer insulating film 60. Then, the second-layer insulating film 60 is planarized by the CMP and is patterned, and thus an eighth hole 60a having a depth that comes up to the first-layer metal wiring 59 is formed.

Then, a TiN film of an about 50 nm thickness is formed on the second-layer insulating film 60 and an inner surface of the eighth hole 60a by the sputter method. Then, a W film of an about 200 to 300 nm thickness is formed thereon by the CVD method and thus the eighth hole 60a is buried completely by the W film. Then, the TiN film and the W film remained on the second-layer insulating film 60 are removed by the CMP method, and these films are left in the eighth hole 60a as an eighth conductive plug 61.

Then, Ti film, TiN film, Cu-containing Al film, Ti film, and TiN film are formed on respective upper surfaces of the second-layer insulating film 60 and the eighth conductive plugs 61 in this order by the sputter method to have a thickness of 50 nm, 12 nm, 400 nm, 5 nm, and 70 nm respectively. Then, second-layer metal wirings 63 are formed by patterning these films.

Then, a silicon oxide film of an about 750 nm thickness is formed on the second-layer metal wirings 63 and the second-layer insulating film 60 by the HDPCVD method, and this film is used as a third interlayer insulating film 62. Then, a silicon nitride film of an about 500 nm thickness is formed as a passivating film 64 on the third interlayer insulating film 62 by the plasma CVD method.

Then, the step of opening the pad openings in the passivating film 64 and the third interlayer insulating film 62 by the photolithography to expose the pad portions of the second-layer metal wirings 63 under the openings is carried out. But their details will be omitted herein.

According to the steps executed up to now, a basic structure of the semiconductor device according to the present embodiment is completed.

Figure 6:
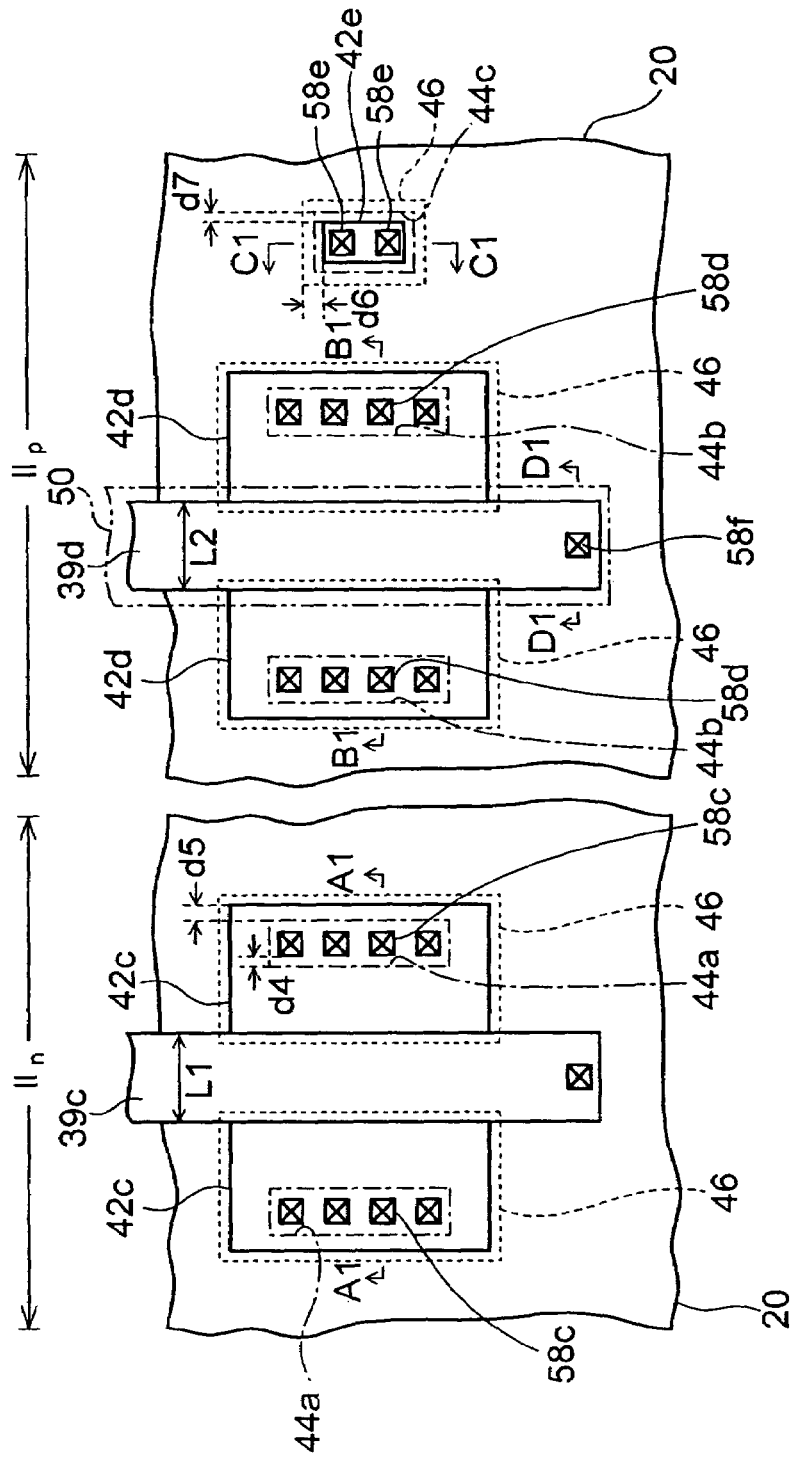
FIG. 6 is a plan view showing the semiconductor device according to the first embodiment of the present invention.

Here, FIG. 6 is a plan view showing the high-voltage transistor forming region II of this semiconductor device in an enlarged fashion, and planar layouts of respective resist patterns formed in the above are also illustrated in FIG. 6. Then, sectional views of respective regions $II_n$, $II_p$ in above FIGS. 5A to 5S correspond to cross sections taken along an A1-A1 line and a B1-B1 line in FIG. 6 respectively. Also, a sectional view of the well contact region $II_{well}$ corresponds to a cross section taken along a C1-C1 line in FIG. 6, and a sectional view of the pad region $II_{pad}$ corresponds to a cross sectional taken along a D1-D1 line in FIG. 6.

In FIG. 6, d4 is an interval between the first window 44a of the fifth resist pattern 44 and the third conductive plug 58c and has a value of about 0.15 fÊm, for example. Also, d5 is an interval between the first window 44a and the second n-type source/drain extension 42c and has a value of about 0.15 fÊm, for example. Also, d6 is a protruded distance of the sixth resist pattern 46 from the first n-type impurity diffusion region 42e in the well contact region $II_{well}$ and has a value of about 0.2 fÊm, for example. Also, d7 is a distance between the third window 44c of the fifth resist pattern 44 and an edge of the first n-type impurity diffusion region 42e and has a value of about 0.1 fÊm, for example.

In this case, respective gate lengths L1, L2 of the third and fourth gate electrodes 39c, 39d are not particularly limited. In the present embodiment and subsequent embodiments, L1 is set to about 1 to 2 fÊm and L2 is set to about 0.6 to 2 fÊm.

In the present embodiment explained as above, the impurity is doped into the conductive film 39 in the high-voltage transistor forming region II, as shown in FIG. 5J, and then the third and fourth insulating sidewalls 43c, 43d are formed in the high-voltage transistor forming region II, as shown in FIG. 5M. Therefore, since there is no necessity of doping the impurity into the third and fourth gate electrodes 39c, 39d after the third and fourth insulating sidewalls 43c, 43d are formed, the undoped portion is not formed in the gate electrode of the high-voltage transistor, unlike the prior art. As a result, a variation in the driving ability due to an increase in the threshold voltage caused by the undoped portion, a shape of the undoped portion, and the like is not generated in the high voltage transistor, and therefore the high-quality semiconductor device in which the high voltage transistor and the dual-gate type normal transistor are integrated together can be provided.

Also, in the present embodiment, the step of forming the first and second openings 43g, 43h in the high-voltage transistor forming region II, explained in FIG. 5M, and the step of forming the first and second insulating sidewalls 43a, 43b in the normal transistor forming region I, explained in FIG. 5N, are carried out separately.

An etching depth in the step of FIG. 5M corresponds to a total thickness of the sidewall insulating film 43 and the first gate insulating film 27 whereas an etching depth in the step of FIG. 5N corresponds to a total thickness of the sidewall insulating film 43 and the second gate insulating film 36. Therefore, the etching depths in these steps are different mutually by a thickness difference between the first gate insulating film 27 and the second gate insulating film 36. In the present embodiment, even though the etching depths are different in this way, these two etching steps are executed separately as above. As a result, unlike the prior art in which these etching steps are executed simultaneously, such an event can be prevented that the element isolation insulating film 23 is etched excessively.

(2) Second Embodiment

Next, a second embodiment of the present invention will be explained hereunder.

FIGS. 7A to 7G are sectional views showing a semiconductor device according to the present embodiment in the manufacturing process respectively. In these Figures, the same reference symbols as those in the first embodiment are affixed to the same elements as those in the first embodiment, and their explanation will be omitted herein.

In the above first embodiment, as shown in FIG. 5J, while covering only the normal p-type MOS transistor forming region $I_p$ with the fourth resist pattern 40, the P$^+$ ion as the n-type impurity is introduced into the conductive film 39 located in remaining regions.

Figure 7A:
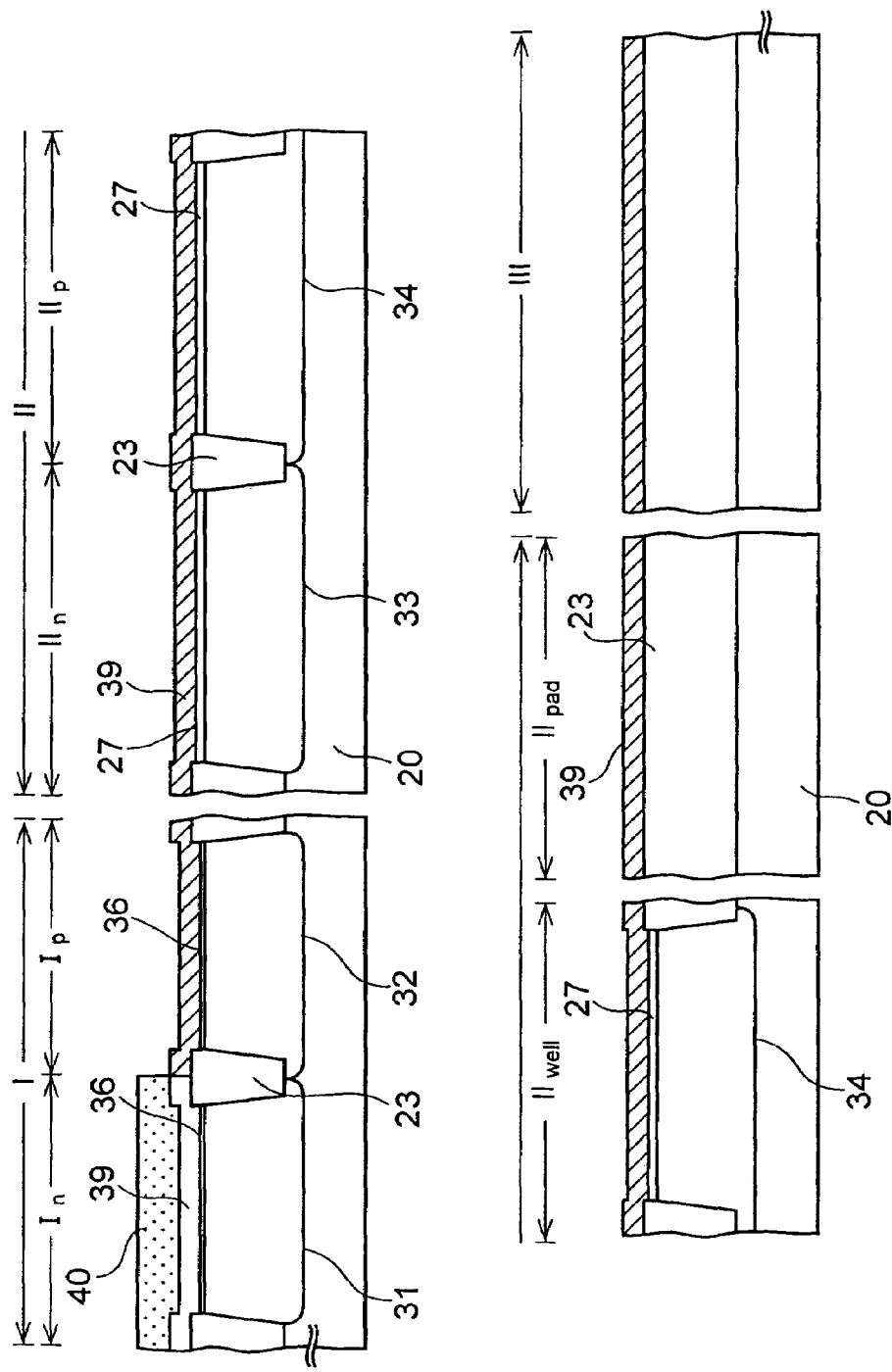
FIGS. 7A to 7G are sectional views showing a semiconductor device according to a second embodiment of the present invention in the manufacturing process respectively.

In contrast, in the present embodiment, as shown in FIG. 7A, only the normal n-type MOS transistor forming region $I_n$ is covered with the fourth resist pattern 40. Then, the B$^+$ ion as the p-type impurity is ion-implanted selectively into portions of the conductive film 39, which are not covered with the fourth resist pattern 40, under the conditions of an acceleration energy of 7 KeV and a dose amount of $4 \times 10^{15}$ cm$^{-3}$, while using the eighth resist pattern 50 as a mask.

As the result of such ion-implantation, the conductive film 39 in the normal n-type MOS transistor forming region $I_n$ is still kept in its undoped condition, while the conductivity type of the conductive film 39 in the normal p-type MOS transistor forming region $I_p$ and the high-voltage transistor forming region II is set to the p type.

Then, the fourth resist pattern 40 is removed.

The third and fourth gate electrodes 39c, 39d are formed by patterning the conductive film 39 into which the B$^+$ ion is implanted, as shown in FIG. 7A. The B$^+$ ion is implanted into all portions of the structure.

Figure 7B:
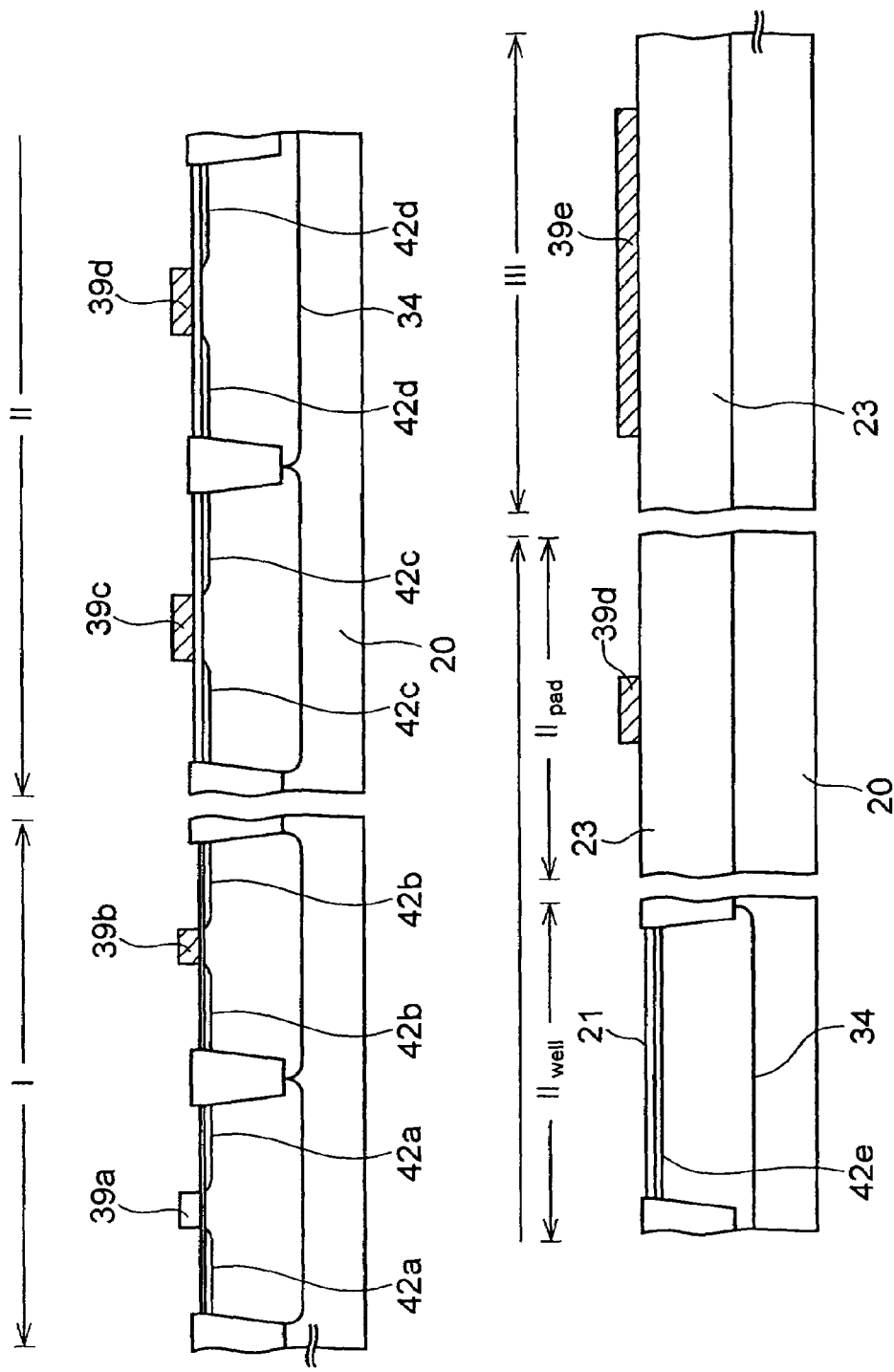

Then, as shown in FIG. 7B, in compliance with the same steps as in FIG. 5K, the first to fourth gate electrodes 39a to 39d are formed and also the first and second n-type source/drain extensions 42a, 42c and the first and second p-type source/drain extensions 42b, 42d are formed in the silicon substrate 20 beside these gate electrodes 39a to 39d.

Figure 7C:
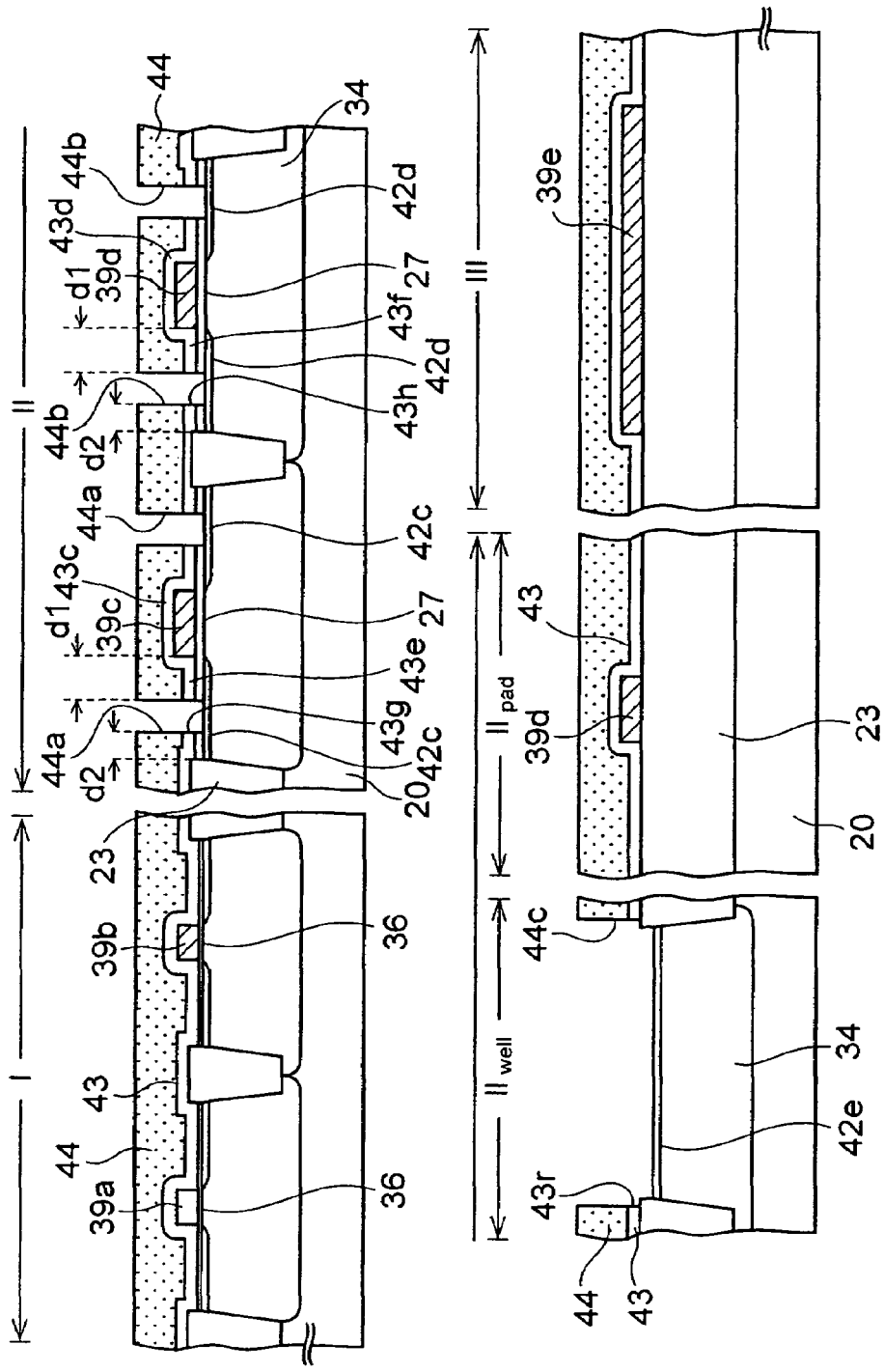

Then, as shown in FIG. 7C, in compliance with the steps as in FIG. 5M explained in the first embodiment, the first gate insulating film 27 and the sidewall insulating film 43 are etched to form the first and second openings 43g, 43h.

The distance d1 between the first and second openings 43g, 43h and the third and fourth gate electrodes 39c, 39d and the distance d2 between the element isolation insulating film 23 and the first and second windows 44a, 44b are similar to those in the first embodiment.

Figure 7D:
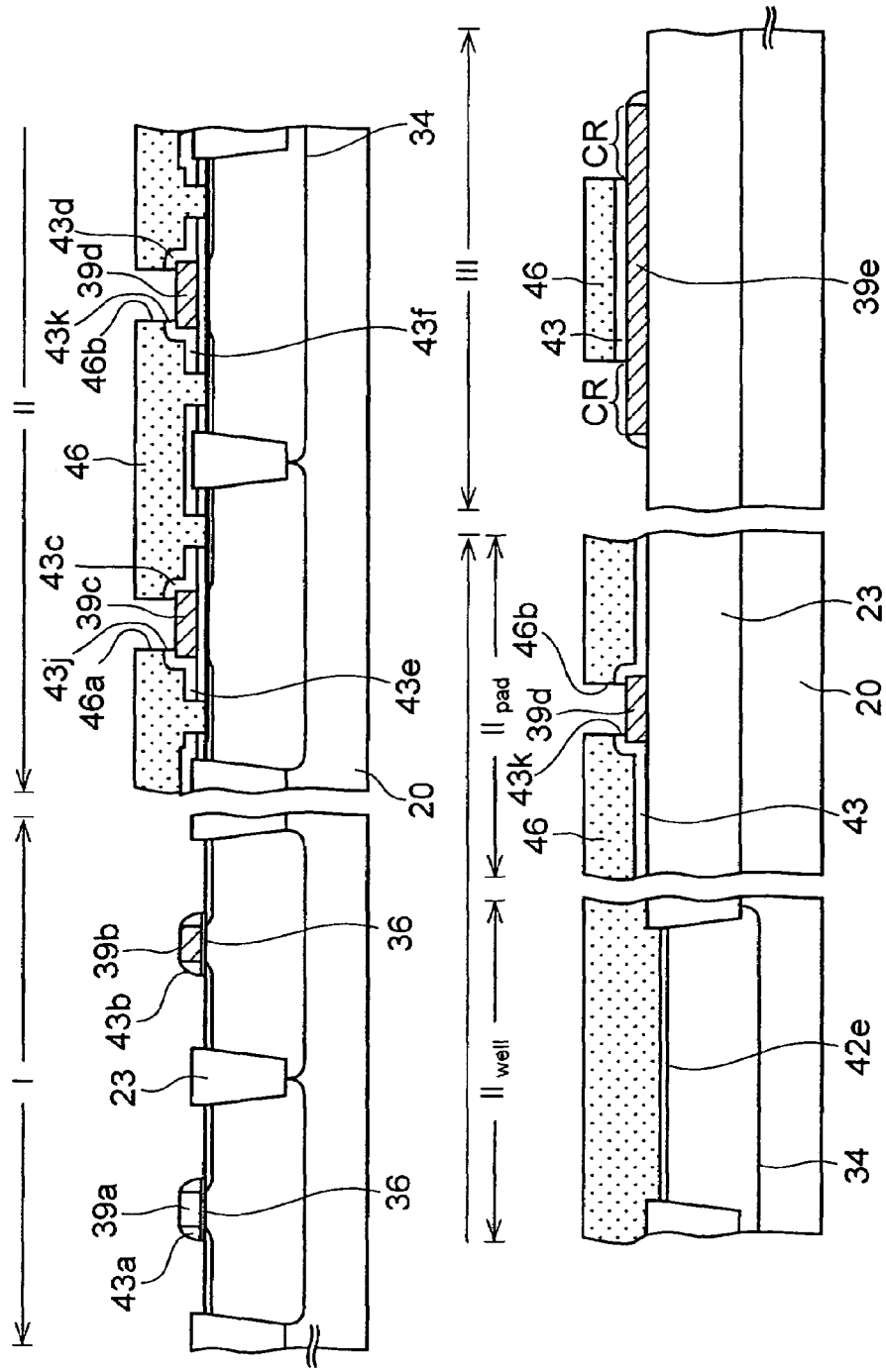

Then, as shown in FIG. 7D, in compliance with the steps as in FIG. 5N explained in the first embodiment, the first and second sidewalls 43a, 43b are formed in the normal transistor forming region I by the etching using the sixth resist pattern 46 as a mask. At the same time, the third and fourth openings 43j, 43k are formed in the third and fourth sidewalls 43c, 43d on the third and fourth gate electrodes 39c, 39d, and also the sidewall insulating film 43 on the contact region CR in the resistor forming region III is removed by the etching.

Then, the sixth resist pattern 46 is removed.

Figure 7E:
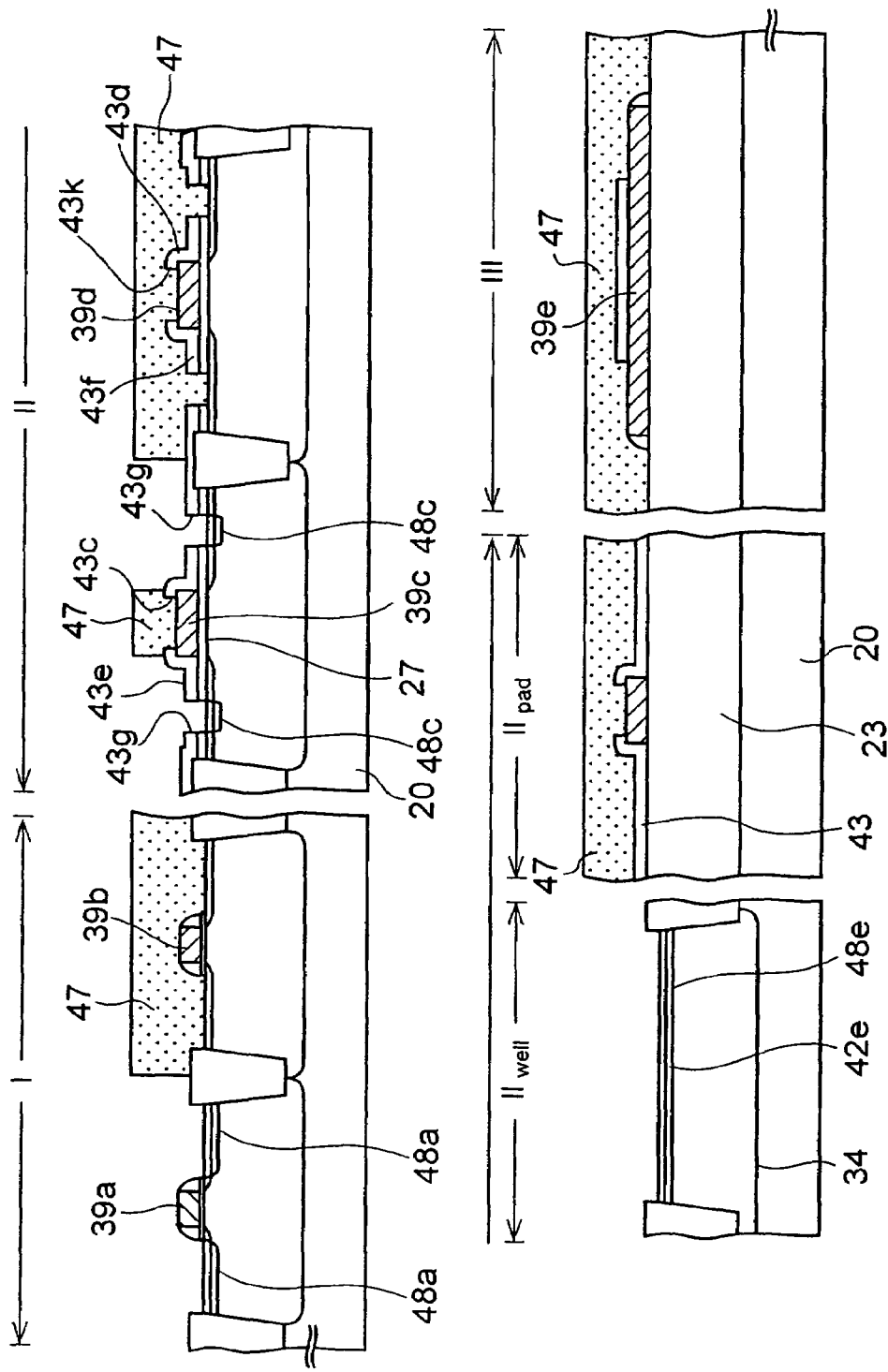

Next, the steps required until a sectional structure shown in FIG. 7E is obtained will be explained hereunder.

First, the photoresist is coated on respective regions I to III, and then the seventh resist pattern 47 is formed by exposing/developing the photoresist. Then, the P$^+$ ion is ion-implanted into the silicon substrate 20 under the conditions of an acceleration energy of 10 to 15 KeV and a dose amount of $2 \times 10^{15}$ cm$^{-3}$, while using the seventh resist pattern 47 as a mask. As a result, the second n-type source/drain region 48c is formed in the silicon substrate 20 under the first openings 43g in the high-voltage transistor forming region II. Also, the pad region $II_{pad}$ is covered with the seventh resist pattern 47. Then, the seventh resist pattern 47 is opened in the well contact region $II_{well}$, and the deep second n-type impurity diffusion region 48e whose impurity concentration is higher than the first n-type impurity diffusion region 42e is formed therein.

Then, the P$^+$ ion is implanted into the first gate electrode 39a, which is still kept in its undoped state, by this ion implantation and thus the conductivity type of the first gate electrode 39a is set to the n type.

Then, the seventh resist pattern 47 is removed.

Figure 7F:
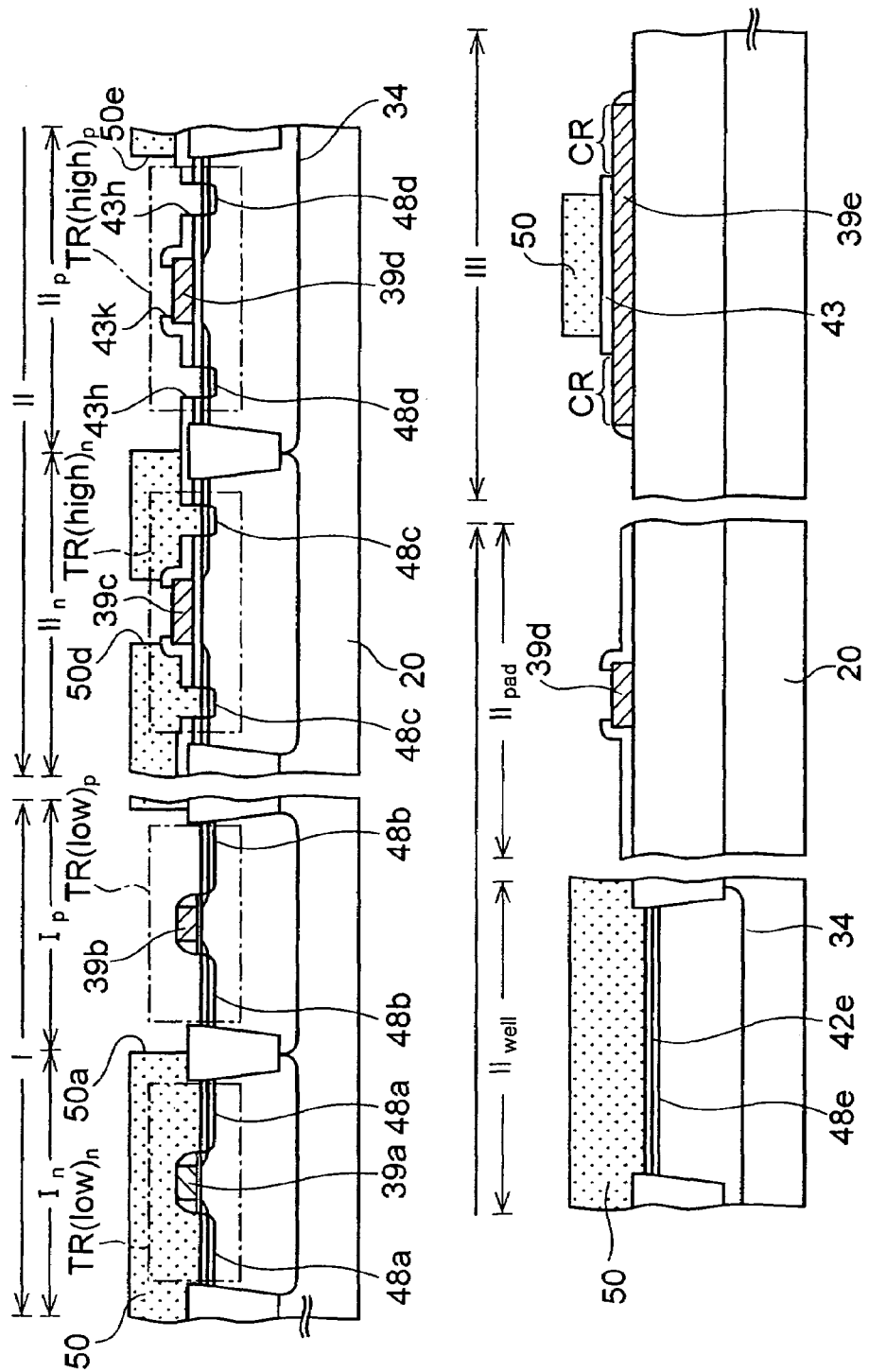

Next, the steps required until a sectional structure shown in FIG. 7F is obtained will be explained hereunder.

First, the eighth resist pattern 50 having the eighth and ninth windows 50a, 50b from which the normal p-type MOS transistor forming region $I_p$ and the high-voltage p-type MOS transistor forming region $II_p$ are exposed is formed on the silicon substrate 20. Also, the eighth resist pattern 50 has a tenth window 50d from which the third gate electrode 39c is exposed. In this case, the pad region $II_{pad}$ and the contact region CR in the resistor forming region III are not covered with the eighth resist pattern 50 and are exposed. Also, the well contact region $II_{well}$ is covered with the eighth resist pattern 50.

Then, the B$^+$ ion is ion-implanted into the silicon substrate 20 under the conditions of an acceleration energy of 5 KeV and a dose amount of $2 \times 10^{15}$ cm$^{-3}$, while using the eighth resist pattern 50 as a mask. As a result, the first p-type source/drain region 48d is formed on the silicon substrate 20 under the second opening 43h, and also the second p-type source/drain region 48b is formed on the silicon substrate 20 beside the second gate electrode 39b.

Then, the eighth resist pattern 50 is removed. Then, the impurity injected into respective source/drain regions 48a to 48d is activated by the RTA that is executed in the nitrogen atmosphere at a substrate temperature of 1000 ℃ for a process time of 10 second.

In the present embodiment, the B$^+$ ion is introduced previously into the conductive film 39 in the normal p-type MOS transistor forming region $I_p$ in the step in FIG. 7A. In this case, since the B$^+$ ion is ready to move rather than other ions, it is possible that such B$^+$ ion pierces the second gate insulating film 36 and is diffused into the silicon substrate 20 in the annealing steps applied until the second p-type source/drain region 48b is formed. Therefore, in the case where many annealing steps are applied, the conductive film 39 in this portion may be kept in its undoped condition and then the B$^+$ ion may be ion-implanted into the second gate electrode 39b upon implanting the ion to form the second p-type source/drain region 48b. In contrast, in the case where few annealing steps are applied, the B$^+$ ion may be introduced into the conductive film 39 in the normal p-type MOS transistor forming region $I_p$ in the step in FIG. 7A.

According to the steps applied up to now, the basic structures of the normal n-type MOS transistor TR(low)$_n$ and the normal p-type MOS transistor TR(low)$_p$ are completed in the normal transistor forming region I respectively, and also the basic structures of the n-type high-voltage MOS transistor TR(high)$_n$ and the p-type high-voltage MOS transistor TR(high)$_p$ are completed in the high-voltage transistor forming region II.

Figure 7G:
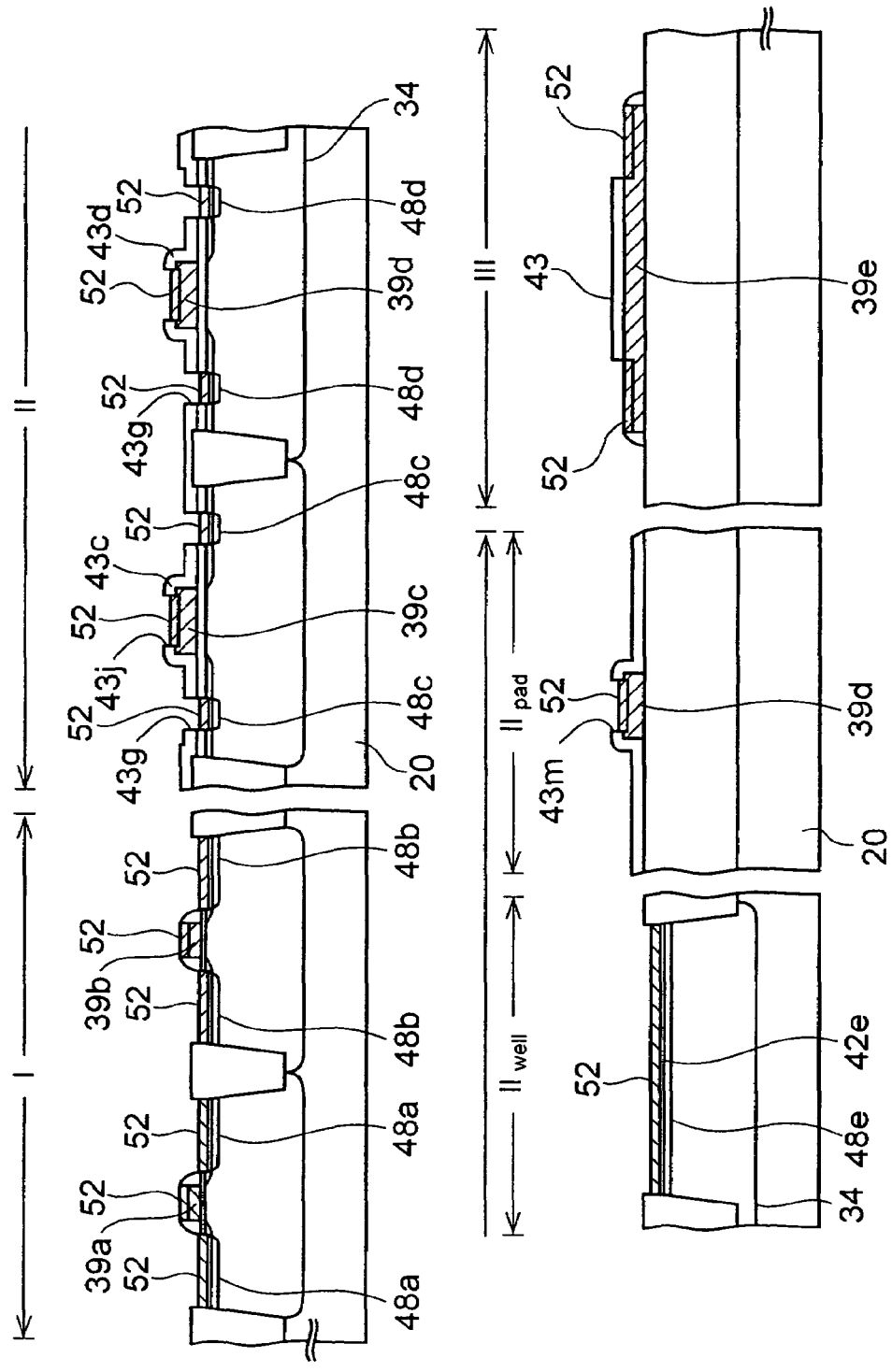

Then, as shown in FIG. 7G, the silicide layer 52 is formed in respective regions I to III by executing the steps in FIG. 5Q explained in the first embodiment.

After this, the process goes to the steps of forming the interlayer insulating film and the metal wirings.

Since theses steps are similar to those in the first embodiment, their explanation will be omitted herein.

Figure 8:
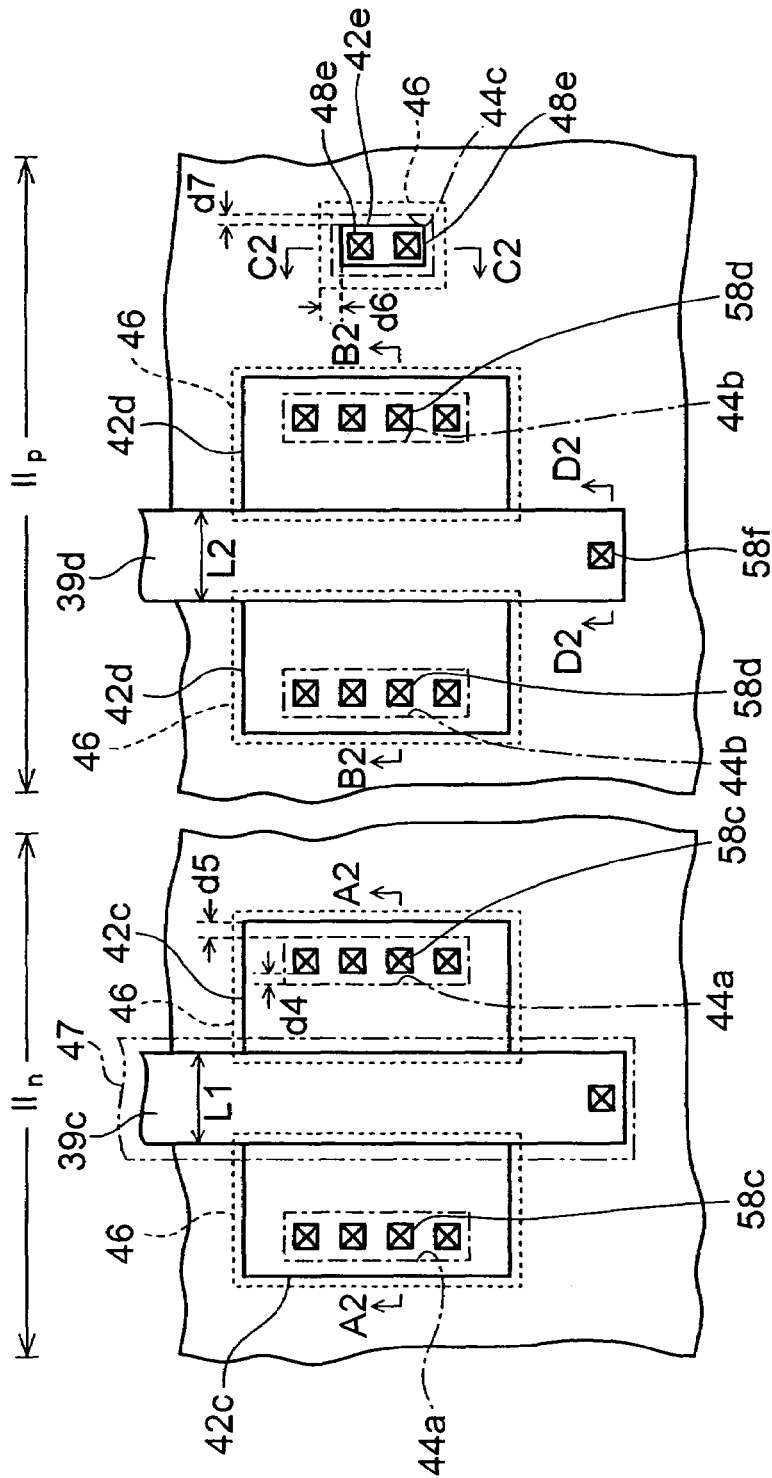
FIG. 8 is a plan view showing the semiconductor device according to the second embodiment of the present invention.

FIG. 8 is a plan view showing the high-voltage transistor forming region II of the semiconductor device in an enlarged fashion, and planar layouts of respective resist patterns formed in the above are also illustrated in FIG. 8. Then, sectional views of respective regions $II_n$, $II_p$ in above FIGS. 7A to 7G correspond to cross sections taken along an A2-A2 line and a B2-B2 line in FIG. 8 respectively. Also, a sectional view of the well contact region $II_{well}$ corresponds to a cross section taken along a C2-C2 line in FIG. 8, and a sectional view of the pad region II$_{pad}$ corresponds to a cross section taken along a D2-D2 line in FIG. 8.

Since meanings and values of respective distances d4 to d7 in FIG. 8 are identical to those explained in FIG. 6 in the first embodiment, their explanation will be omitted herein.

According to the present embodiment explained as above, the B$^+$ ion as the p-type impurity is introduced previously into the conductive film 39 in the high-voltage transistor forming region II, and then the third and fourth gate electrodes 39c, 39d are formed by patterning the conductive film 39. Therefore, such a structure can be obtained that the B$^+$ ion can be introduced uniformly into all portions of these gate electrodes 39c, 39d, and thus the undoped portion is not formed in the gate electrodes 39c, 39d unlike the prior art. As a result, a reduction and a variation in the driving ability of the transistor due to the presence of the undoped portion can be prevented.

Figure 9:
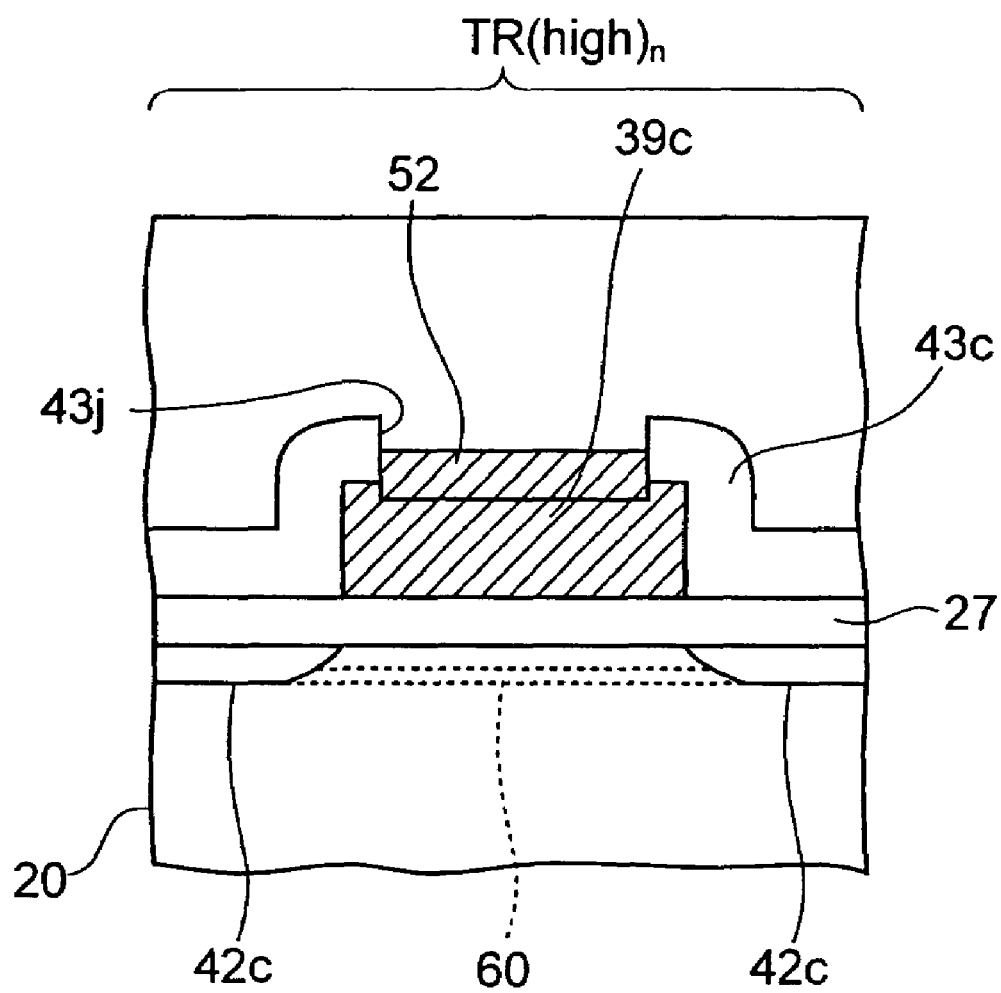
FIG. 9 is a sectional view showing a high-voltage n-type MOS transistor in the semiconductor device according to the second embodiment of the present invention.

In addition, in the present embodiment, the conductivity type of the third gate electrode 39c constituting the n-type high-voltage MOS transistor TR(high)$_n$ is the p type and is the opposite conductivity type to the n-channel. If the conductivity type of the channel is opposite to the gate electrode, the channel 60 is provided as the buried channel that is formed deeper than the surface of the silicon substrate 20, as shown in FIG. 9. Since the carriers travels through the buried channel that is located deeper than the surface of the silicon substrate 20, the carriers are hardly scattered by the interface state density that exists on the surface of the substrate. As a result, a mobility of the carriers can be improved and also the transistor with the high driving ability can be obtained.

In addition, according to such buried channel, merely a low channel density is required to get the threshold voltage that is equal to the surface channel generated on the substrate surface, and also a concentration gradient of the impurity at the jointed portion between the second n-type source/drain region 48c and the channel can be made gentle. Therefore, the higher withstand voltage of the second n-type source/drain region 48c can be realized.

(3) Third Embodiment

In the first embodiment, as shown in FIG. 5P, the extended portions 43e, 43f are provided to the third and fourth insulating sidewalls 43c, 43d in the high-voltage transistor forming region II. Then, respective offsets of the first p-type source/drain region 48d and the second n-type source/drain region 48c are increased by the ion implantation using the extended portions 43e, 43f as a mask. Thus, the withstand voltages of the MOS transistors TR(high)$_n$ and TR(high)$_p$ are enhanced.

In contrast, in the present embodiment, the offsets of the source/drain regions 48c, 48d are increased not by providing the extended portions 43e, 43f to the third and fourth insulating sidewalls 43c, 43d.

FIGS. 10A to 10G are sectional views showing a semiconductor device according to the present embodiment. In these Figures, the same reference symbols as those in the first embodiment are affixed to the same elements as those in the first embodiment, and their explanation will be omitted herein.

Figure 10A:
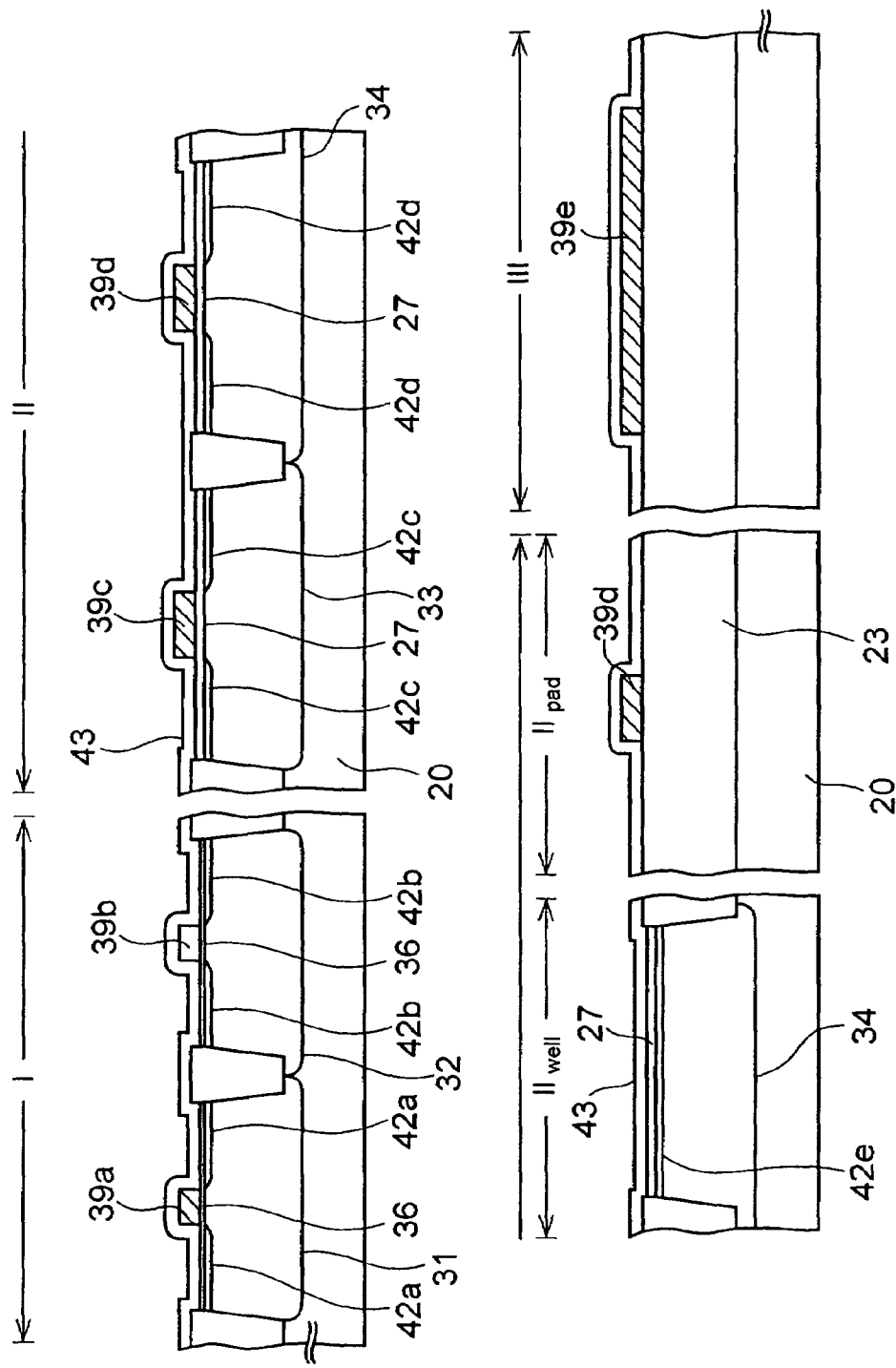

First, the steps in FIGS. 5A to 5K explained in the first embodiment are carried out, and then the steps explained in FIG. 5L in the first embodiment are carried out. Thus, as shown in FIG. 10A, the sidewall insulating film 43 is formed on the first to fourth gate electrodes 39a to 39d and the first and second gate insulating films 27, 36. As the sidewall insulating film 43, for example, a silicon oxide film of an about 100 nm thickness, which is formed by the plasma CVD method executed at a substrate temperature of almost 750 ⁰C to 800 ⁰C, may be employed.

Figure 10B:
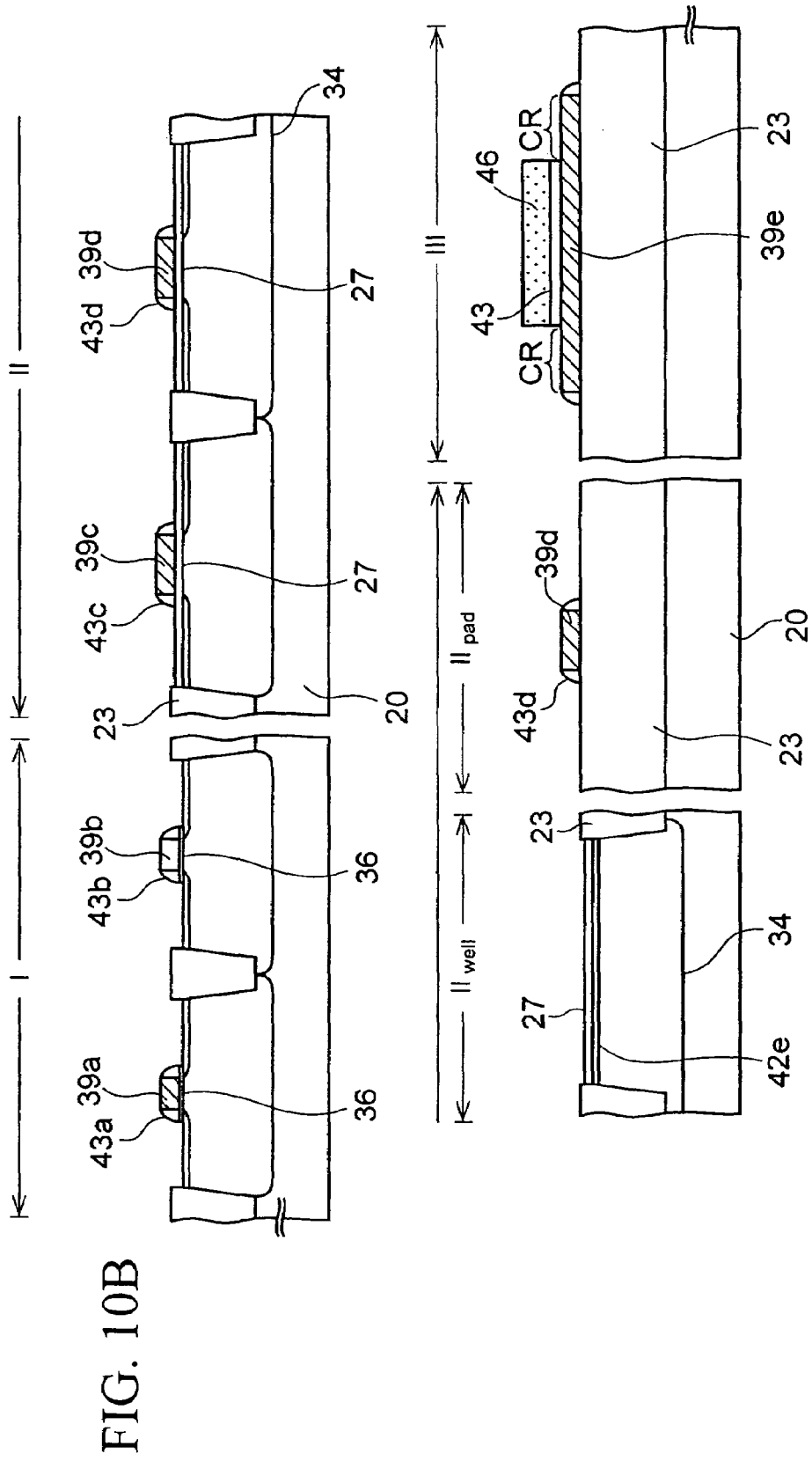

Then, as shown in FIG. 10B, the island-like sixth resist pattern 46 is formed on the resistor pattern 39e. Then, the sidewall insulating film 43 is etched back by the RIE while using the sixth resist pattern 46 as a mask. Thus, the first to fourth insulating sidewalls 43a to 43d are formed beside the first to fourth gate electrodes 39a to 39d, and also the sidewall insulating film 43 on the contact region CR of the resistor pattern 39e is removed. The etching gas in this RIE is not particularly limited, but $C_4F_8+O_2+Ar$ is employed in the present embodiment.

In this etching back, the sidewall insulating film 43 is over-etched by a film thickness ratio 10% to the thickness of about 100 nm, i.e., 10 nm. As a result, the first gate insulating film 27 having a thickness of 30 to 100 nm originally is etched by 10 nm in depth by the above etching-back, and a thickness thereof is reduced to about 20 to 90 nm.

In contrast, the second insulating film 36 formed in the normal transistor forming region I has a thickness of about 3 to 8 nm that is very thinner than the first gate insulating film 27. For this reason, the second gate insulating film 36 located beside the first and second gate electrodes 39a, 39b is etched in forming the first to fourth insulating sidewalls 43a to 43d and is removed.

Figure 10C:
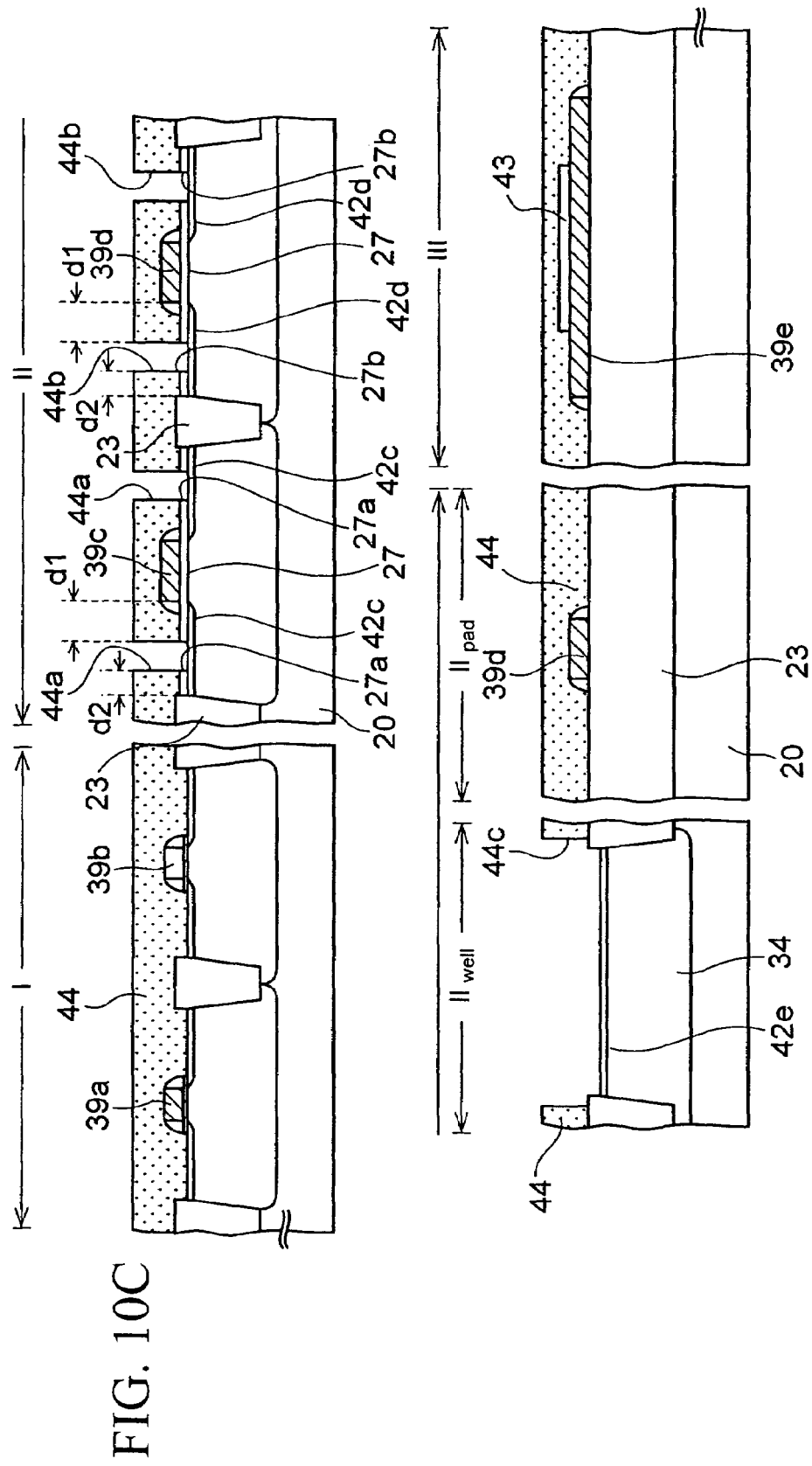

Then, as shown in FIG. 10C, the photoresist is coated in respective regions I to III, and then the fifth resist pattern 44 is formed by exposing/developing the photoresist.

Like the first embodiment, the fifth resist pattern 44 has the first and second windows 44a, 44b. A distance d1 between the windows 44a, 44b and the side surfaces of the third and fourth gate electrode 39c, 39d is set to about 0.3 to 1.0 fÊm. Then, a distance d2 between the windows 44a, 44b and the end portion of the element isolation insulating film 23 is set to about 0.1 fÊm.

Then, the first gate insulating film 27 is etched by the RIE through the first and second windows 44a, 44b. Thus, fifth and sixth openings 27a, 27b are formed in the first gate insulating film 27 on the source/drain extensions 42c, 42d.

In this case, the fifth resist pattern 44 has the third window 44c, and the first gate insulating film 27 under the third window 44c is removed by the etching using the RIE.

Then, the fifth resist pattern 44 is removed.

Figure 10D:
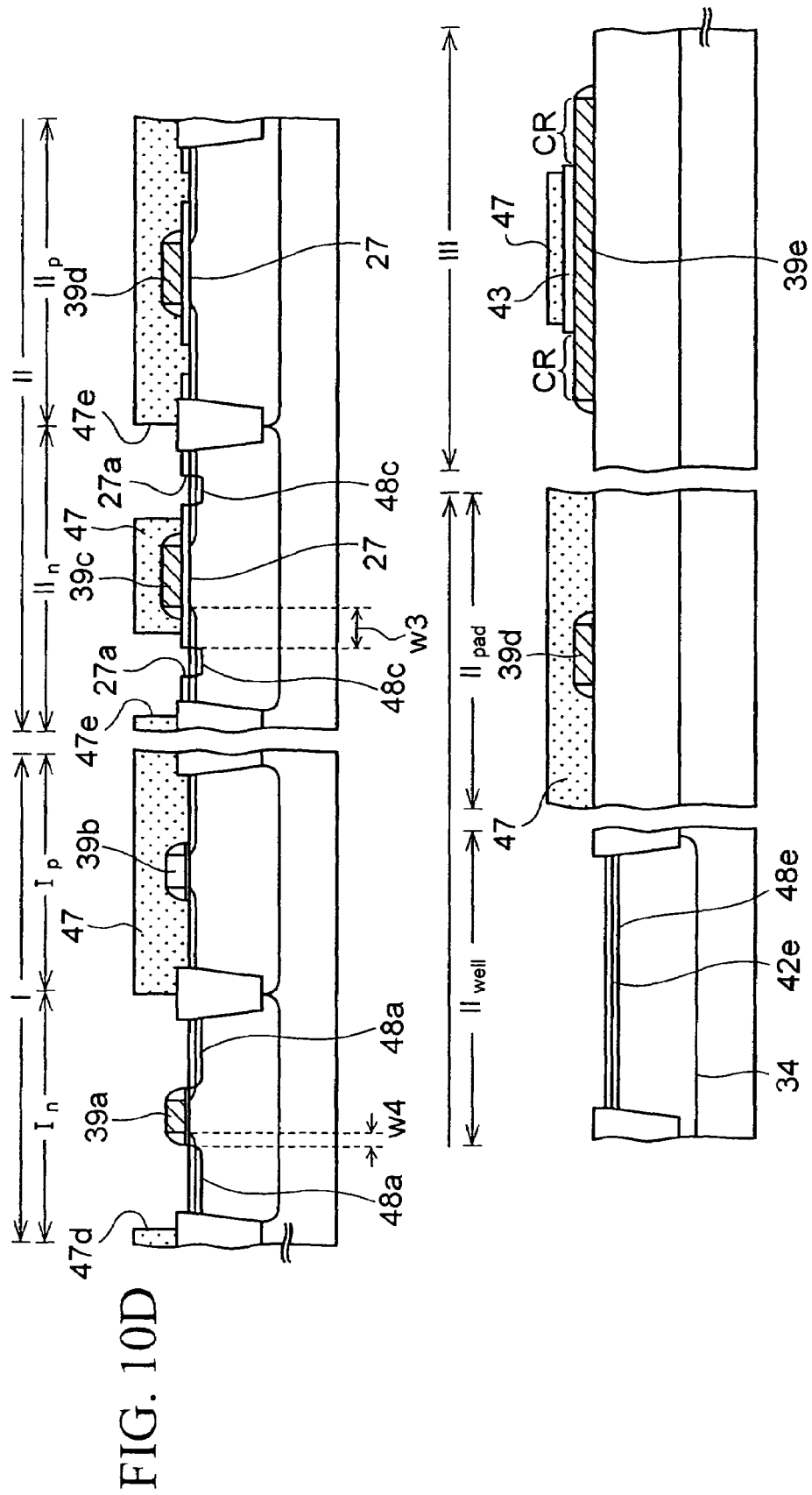

Then, as shown in FIG. 10D, the photoresist is coated in respective regions I to III, and then the seventh resist pattern 47 is formed by exposing/developing the photoresist. The seventh resist pattern 47 has an eleventh window 47d from which the normal n-type MOS transistor forming region I$_n$ is exposed, and twelfth window 47e on the second n-type source/drain region. Also, the contact region CR of the resistor pattern 39e is not covered with the seventh resist pattern 47 and is still exposed.

Then, the P$^+$ ion is ion-implanted into the silicon substrate 20 under the conditions of an acceleration energy of 10 to 15 KeV and a dose amount of 2⁰10$^{15}$ cm$^{-3}$, while using the seventh resist pattern 47 as a mask. As a result of such ion implantation, the first n-type source/drain region 48a is formed in the silicon substrate 20 beside the first gate electrode 39a. Also, the P$^+$ ion is implanted into the silicon substrate 20 in the high-voltage transistor forming region II through the fifth opening 27a, and thus the second n-type source/drain region 48c is formed. Also, the deep second n-type impurity diffusion region 48e whose impurity concentration is higher than the first n-type impurity diffusion region 42e is formed in the well contact region II$_{well}$.

Upon the ion implantation, since the third gate electrode 39c and the neighboring first gate insulating film 27 are covered with the seventh resist pattern 47 in the high-voltage transistor forming region II, the P$^+$ ion is not implanted into the silicon substrate 20 under the first gate insulating film 27. Therefore, the second n-type source/drain region 48c is selectively formed only under the fifth opening 27a, and also the offset W3 is equal to a distance d1 between the side surface of the third gate electrode 39c and the fourth opening 27a and is set to about 0.3 to 1.0 fÊm.

In contrast, since the first gate electrode 39a is not covered with the seventh resist pattern in the normal transistor forming region, the offset W4 of the first n-type source/drain region 48a becomes smaller than the offset W3 in the high-voltage transistor forming region.

The seventh resist pattern 47 is removed after this ion implantation is ended.

Figure 10E:
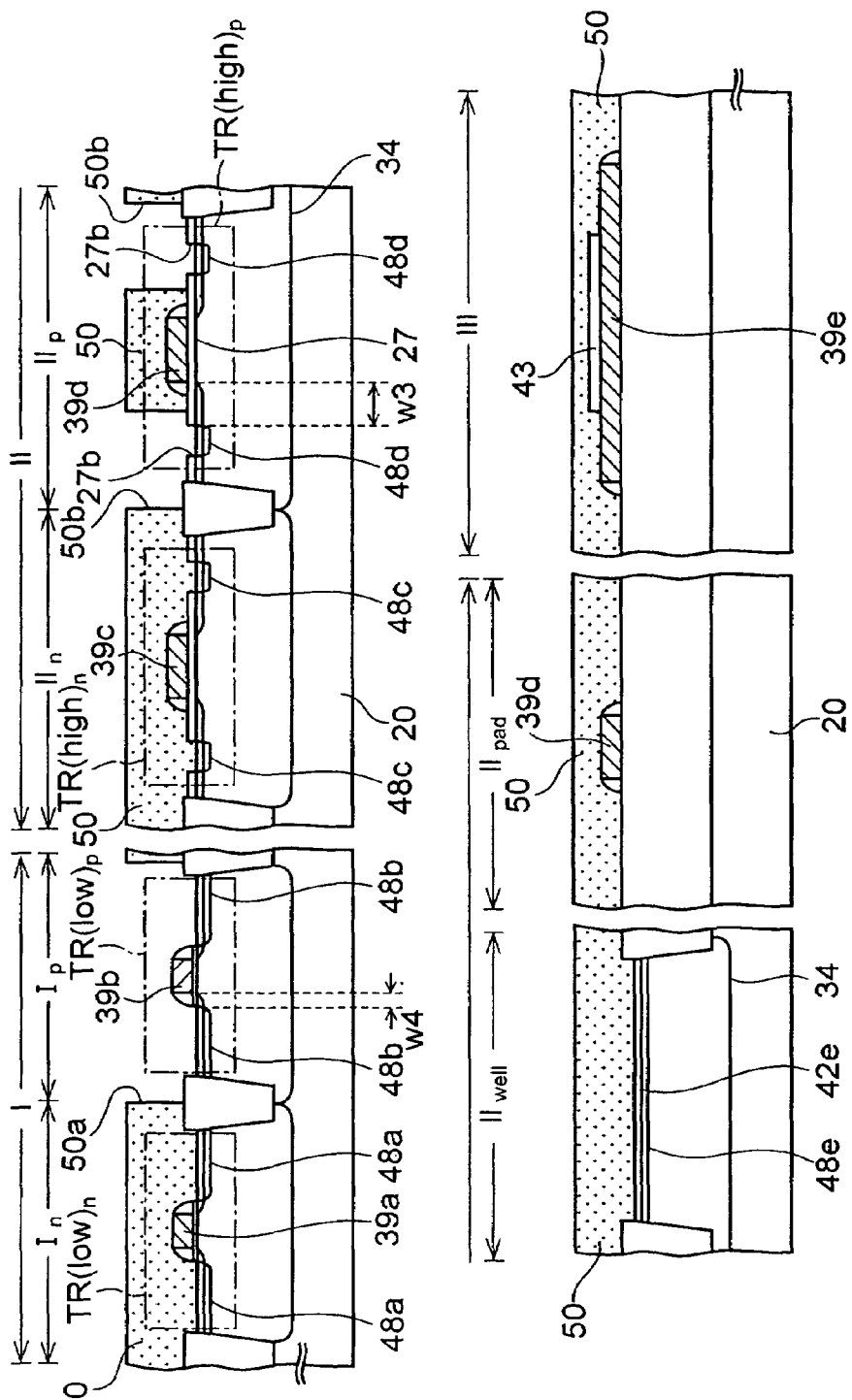

Then, as shown in FIG. 10E, the eighth resist pattern 50 having the eighth and ninth windows 50a, 50b, from which the source/drain forming regions in the normal p-type MOS transistor forming region I$_p$ and the high-voltage p-type MOS transistor forming region II$_p$ are exposed, is formed in respective regions I to III. Also, the well contact region II$_{well}$ is covered with the eighth resist pattern 50.

Then, the B$^+$ ion is ion-implanted into the silicon substrate 20 under the conditions of an acceleration energy of 5 KeV and a dose amount of 2□10$^{15}$ cm$^{-3}$, while using the eighth resist pattern 50 as a mask. As a result, the first p-type source/drain region 48d is formed on the silicon substrate 20 under the sixth opening 27b, and also the second p-type source/drain region 48b is formed on the silicon substrate 20 beside the second gate electrode 39b.

Then, according to this ion implantation, the B$^+$ ion is implanted into the second gate electrode 39b that is still kept in its undoped condition, and thus the conductivity type of the second gate electrode 39b is set to the p type.

In this ion implantation, because the fourth gate electrode 39d and the neighboring first gate insulating film 27 are covered with the eighth resist pattern 50, the B$^+$ ion is not implanted into the silicon substrate 20 under the first gate insulating film 27. Therefore, the offset W3 of the first p-type source/drain region 48d is equal to the distance d1 between the side surface of the third gate electrode 39c and the fifth opening 27a, and is set to about 0.3 to 1.0 fÊm.

In contrast, because the second gate electrode 39b is not covered with the eighth resist pattern 50 in the normal transistor forming region I, the offset W4 of the second p-type source/drain region 48b becomes shorter than the offset W3 in the high-voltage transistor forming region II.

Then, the eighth resist pattern 50 is removed. Then, the impurity injected into respective source/drain regions 48a to 48d is activated by the RTA that is executed in the nitrogen atmosphere at a substrate temperature of 1000 □Z for a process time of 10 second.

According to the steps up to now, the basic structure consisting of the n-type normal MOS transistor TR(low)$_n$ and the p-type normal MOS transistor TR(low)$_p$ is completed in the normal transistor forming region I, while the basic structure consisting of the n-type high-voltage MOS transistor TR(high)$_n$ and the p-type high-voltage MOS transistor TR(high)$_p$ is completed in the high-voltage transistor forming region II.

Out of these transistors, the transistors TR(low)$_n$, TR(low)$_p$ in the normal transistor forming region I have the dual gate structure similar to the first embodiment.

Then, because the offsets W3 of the MOS transistors TR(high)$_n$, TR(high)$_p$ formed in the high-voltage transistor forming region II becomes larger than the offset W4 in the normal transistor forming region I, the source-drain withstand voltage can be enhanced. Also, because a thickness of the first gate insulating film 27 constituting these transistors TR(high)$_n$, TR(high)$_p$ is thicker than a thickness of the second gate insulating film 36, the source-drain withstand voltage of the MOS transistors TR(high)$_n$, TR(high)$_p$ can be enhanced in contrast to the normal MOS transistors TR(low)$_n$, TR(low)$_p$.

Figure 10F:
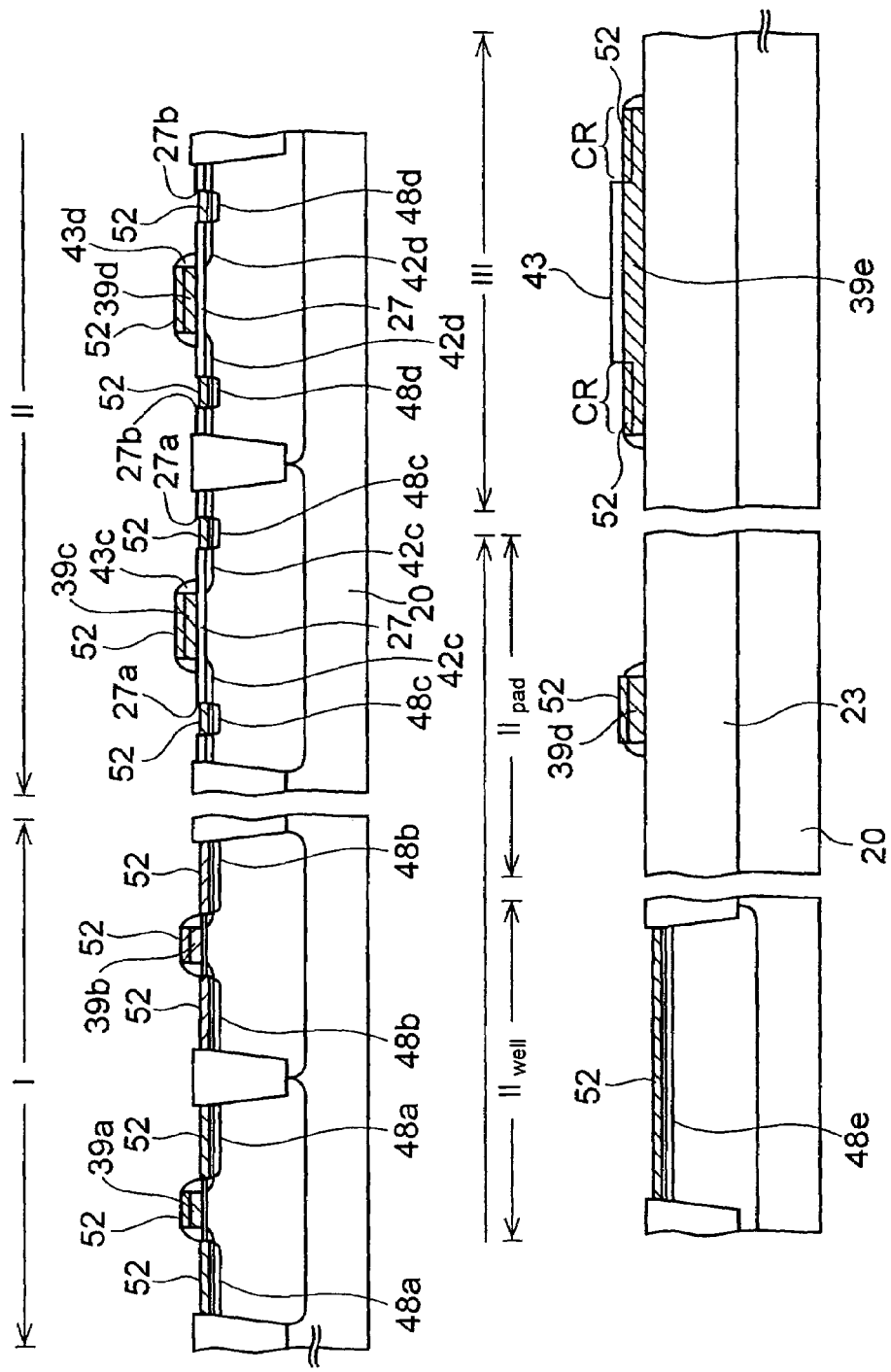

Then, as shown in FIG. 10F, the silicide layer 52 is formed on the source/drain regions 48a to 48d and upper surfaces of the first to fourth gate electrodes 39a to 39d by executing the steps in FIG. 5Q in the first embodiment.

Also, the silicide layer 52 is formed in the contact region CR of the resistor pattern 39e, and a resistance of the portion of the resistor pattern 39e is lowered. At this time, since a sufficiently thick residual film of the first gate insulating film 27 is still left on the extensions 42c, 42d between the fifth and sixth openings 27a, 27b and the gate electrodes 39c, 39d in the high-voltage transistor forming region II, the silicide layer 52 is not formed.

Meanwhile, in the present embodiment, unlike the first and second embodiments, the third and fourth insulating sidewalls 43c, 43d in the high-voltage transistor forming region II are not extended onto the upper surfaces of the third and fourth gate electrodes 39c, 39d. Therefore, the silicide layer 52 is formed on the overall upper surfaces of the third and fourth gate electrodes 39c, 39d. As a result, in the present embodiment, in contrast to the prior art in which the silicide layer is formed on a part of the upper surfaces of the gate electrodes, a resistance of the third and fourth gate electrodes 39c, 39d in the high-voltage transistor forming region can be sufficiently reduced.

Then, as shown in FIG. 10G, the first interlayer insulating film 57 consisting of the etching stopper film 55 and the insulating film 56 is formed by executing the steps in FIG. 5R in the first embodiment. Then, the first to seventh holes 57a to 57g are formed in the first interlayer insulating film 57 by the photolithography.

Then, the first to seventh conductive plugs 58a to 58g formed by stacking the Ti film, the TiN film, and the W film in this order are buried in the first to seventh holes 57a to 57g, whereby a basic structure of the semiconductor device according to the present embodiment is completed.

Then, like FIG. 5S in the first embodiment, the process goes to the step of forming the first-layer metal wirings 59 and the second interlayer insulating film 60, but their details will be omitted herein.

Figure 11:
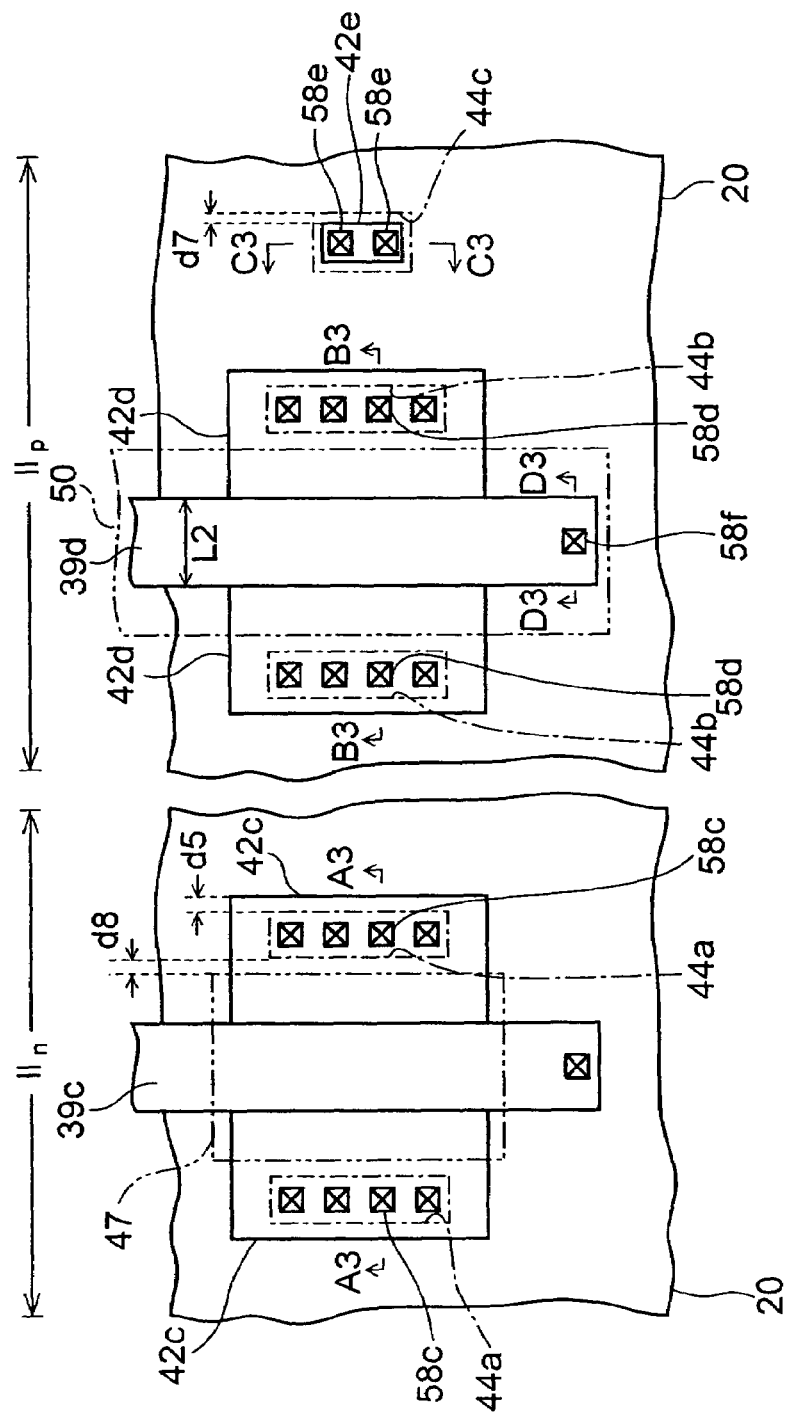
FIG. 11 is a plan view showing the semiconductor device according to the third embodiment of the present invention.

FIG. 11 is a plan view showing the high-voltage transistor forming region II of the semiconductor device in an enlarged fashion, and planar layouts of respective resist patterns formed in the above are also illustrated in FIG. 11. Then, sectional views of respective regions II$_n$, II$_p$ in above FIGS. 10A to 10G correspond to cross sectionals taken along an A3-A3 line and a B3-B3 line in FIG. 11 respectively. Also, a sectional view of the well contact region II$_{well}$ corresponds to a cross section taken along a C3-C3 line in FIG. 11, and a sectional view of the pad region II$_{pad}$ corresponds to a cross section taken along a D3-D3 line in FIG. 11.

Since meanings and values of the distances d5, d7 in FIG. 11 are equal to those in the first embodiment, their explanation will be omitted. While d8 is an interval between the first window 44a of the fifth resist pattern 44 and the seventh resist pattern 47 and has a value of about 0.15 fÊm, for example.

According to the present embodiment explained in the above, like the first embodiment, the P$^+$ ion is introduced previously as the impurity into the conductive film 39 in the high-voltage transistor forming region II, and then the third and fourth gate electrodes 39c, 39d are formed by patterning the conductive film 39. Therefore, the impurity distribution in the gate electrodes 39c, 39d can be made uniform, and thus the undoped portion is not formed in the gate electrodes unlike the prior art. As a result, a reduction and a variation in the driving ability of the transistor due to the presence of the undoped portion can be prevented.

In addition, in the present embodiment, the silicide layer 52 can be formed on the overall upper surfaces of the third and fourth gate electrodes 39c, 39d in the high-voltage transistor forming region II. Therefore, in contrast to the prior art in which the silicide layer is formed on a part of the upper surfaces of the gate electrodes, the resistance of the gate electrodes 39c, 39d can be further reduced.

Figure 12A:
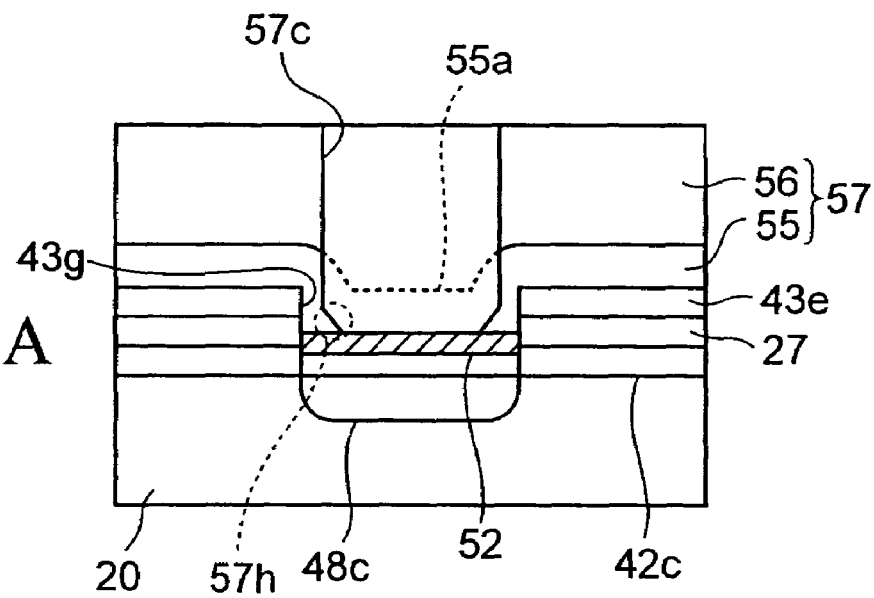
FIGS. 12A and 12B are sectional views showing a source/drain contact portion in a high-voltage transistor forming region in the first and third embodiments of the present invention in an enlarged fashion.
Figure 12B:
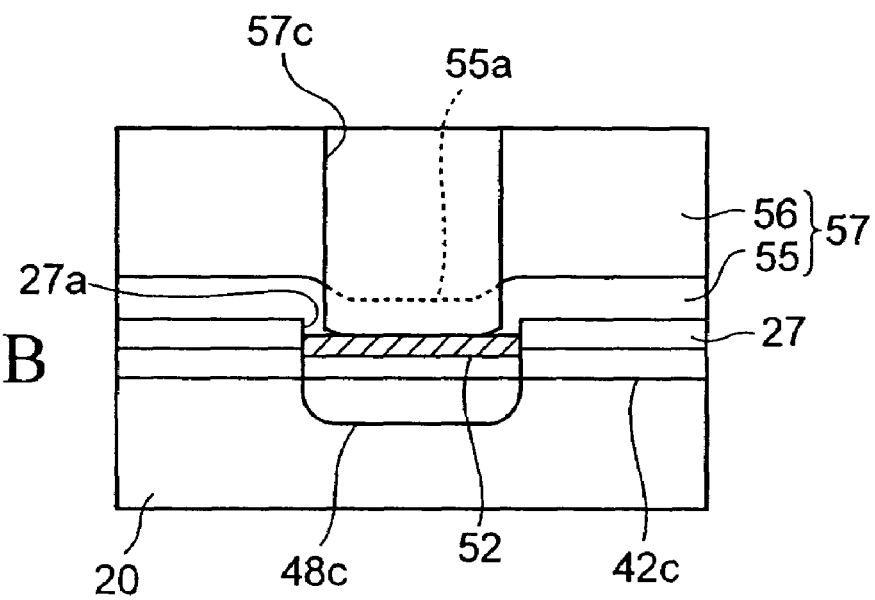

Now, FIG. 12A is a sectional view showing the source/drain contact portion in the high-voltage transistor forming region II in the first embodiment in an enlarged fashion, and FIG. 12B is a sectional view showing the same source/drain contact portion in the second embodiment.

As shown in FIG. 12A, in the first embodiment, the stacked film consisting of the first gate insulating film 27 and the extended portion 43e is formed thick around the second n-type source/drain region 48c. Therefore, a recess 55a whose depth corresponds to a level difference between this stacked film and the silicon substrate 20 is formed on the etching stopper film 55, and then an unopened portion 57h on which the recess 55a is reflected is formed on the bottom of the third hole 57c. In the case where the third hole 57c and the second n-type source/drain region 48c are precisely aligned, the problem is not particularly caused even when such unopened portion 57h is present. However, in the case where they are incorrectly aligned, an occupied area of the unopened portion 57h is increased. As a result, there is a likelihood that a contact resistance between the third conductive plug 58c (see FIG. 5R) and the second n-type source/drain region 48c is increased.

In contrast, as shown in FIG. 12B, in the present embodiment, since the extended portion 43e is not formed, the recess 55a formed in the etching stopper film 55 becomes shallower than the first embodiment. Therefore, since the unopened portion 57h owing to the recess 55a is seldom generated, the contact resistance between the third conductive plug 58c and the second n-type source/drain region 48c is hard to increase even though an alignment between the third hole 57c and the second n-type source/drain region 48c is slightly incorrect.

(4) Fourth Embodiment

In the above third embodiment, in order to dope the impurity uniformly into the third and fourth gate electrodes 39c, 39d, the impurity is doped previously into the conductive film 39 in the high-voltage transistor forming region II. In contrast, in the present embodiment, the thickness of the first gate insulating film 27 is made thicker than that in the third embodiment, and then the impurity is doped uniformly into the third and fourth gate electrodes 39c, 39d while preventing the ion-implantation of the impurity into the silicon substrate 20 except the source/drain regions by the thick first gate insulating film 27, after the third and fourth gate electrodes 39c, 39d are formed.

FIGS. 13A to 13G are sectional views showing a semiconductor device according to the present embodiment in the manufacturing process respectively. In these Figures, the same reference symbols as those in the third embodiment are affixed to the same elements as those in the third embodiment, and their explanation will be omitted herein.

Figure 13A:
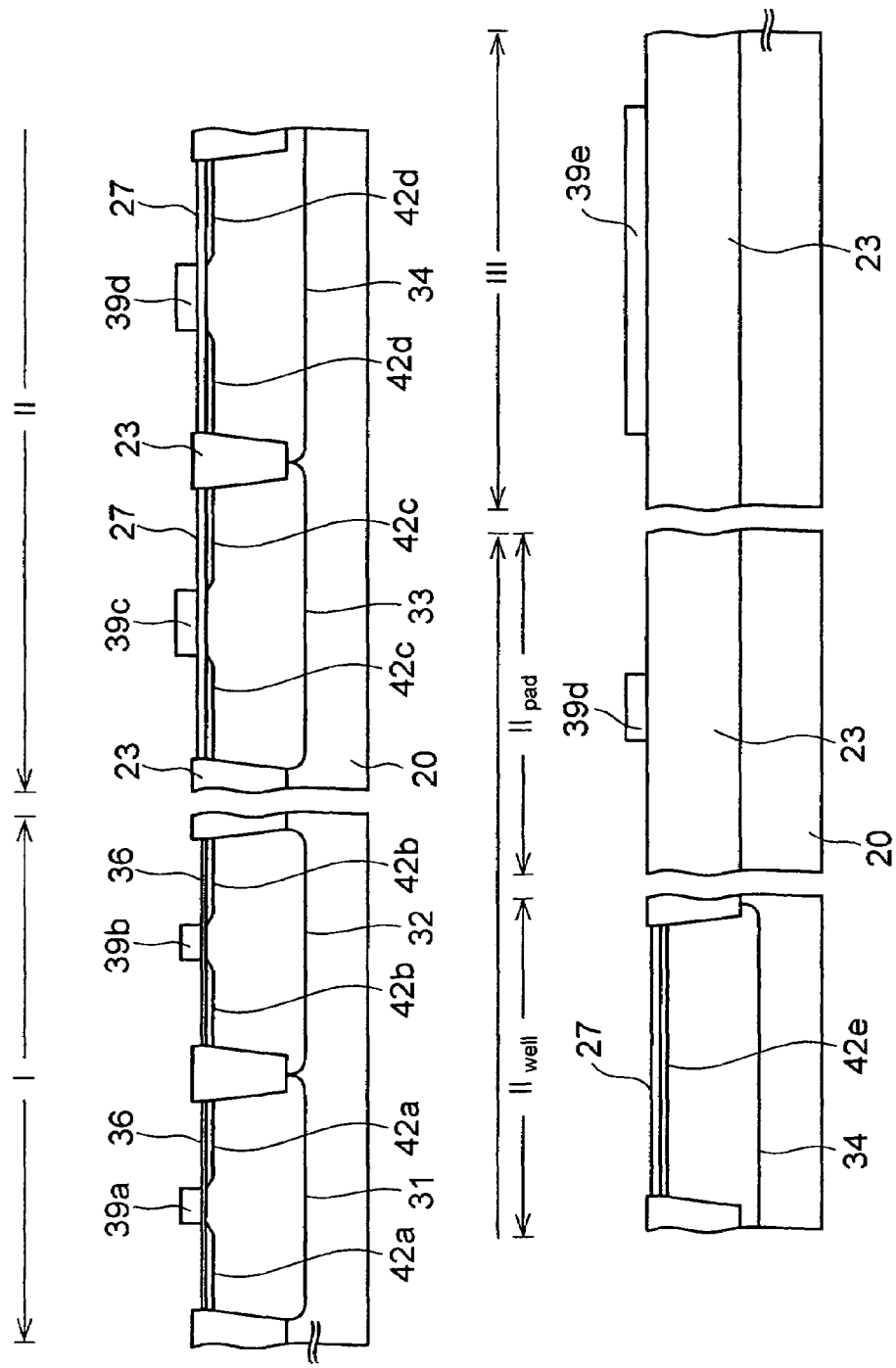
FIGS. 13A to 13G are sectional views showing a semiconductor device according to a fourth embodiment of the present invention in the manufacturing process respectively.

At first, the steps required until a sectional structure shown in FIG. 13A is obtained will be explained hereunder.

First, the conductive film 39 made of the undoped polysilicon is formed on respective regions I to III by executing the steps explained in the first embodiment and shown in FIGS. 5A to 5I.

Then, unlike the first to third embodiments, the impurity is not introduced into the conductive film 39 and then the conductive film 39 is patterned. Thus, the first to fourth undoped gate electrodes 39a to 39d, as shown in FIG. 13A, are formed on respective regions I, II.

Also, in the present embodiment, the thickness of the first gate insulating film 27 is set to 70 to 90 nm, and a lower limit of the thickness is made thicker than 20 nm in the first embodiment.

Then, while employing the same conditions as explained in FIG. 5K of the first embodiment, the first and second n-type source/drain extensions 42a, 42c and the first and second p-type source/drain extensions 42b, 42d are formed on the silicon substrate 20.

Figure 13B:
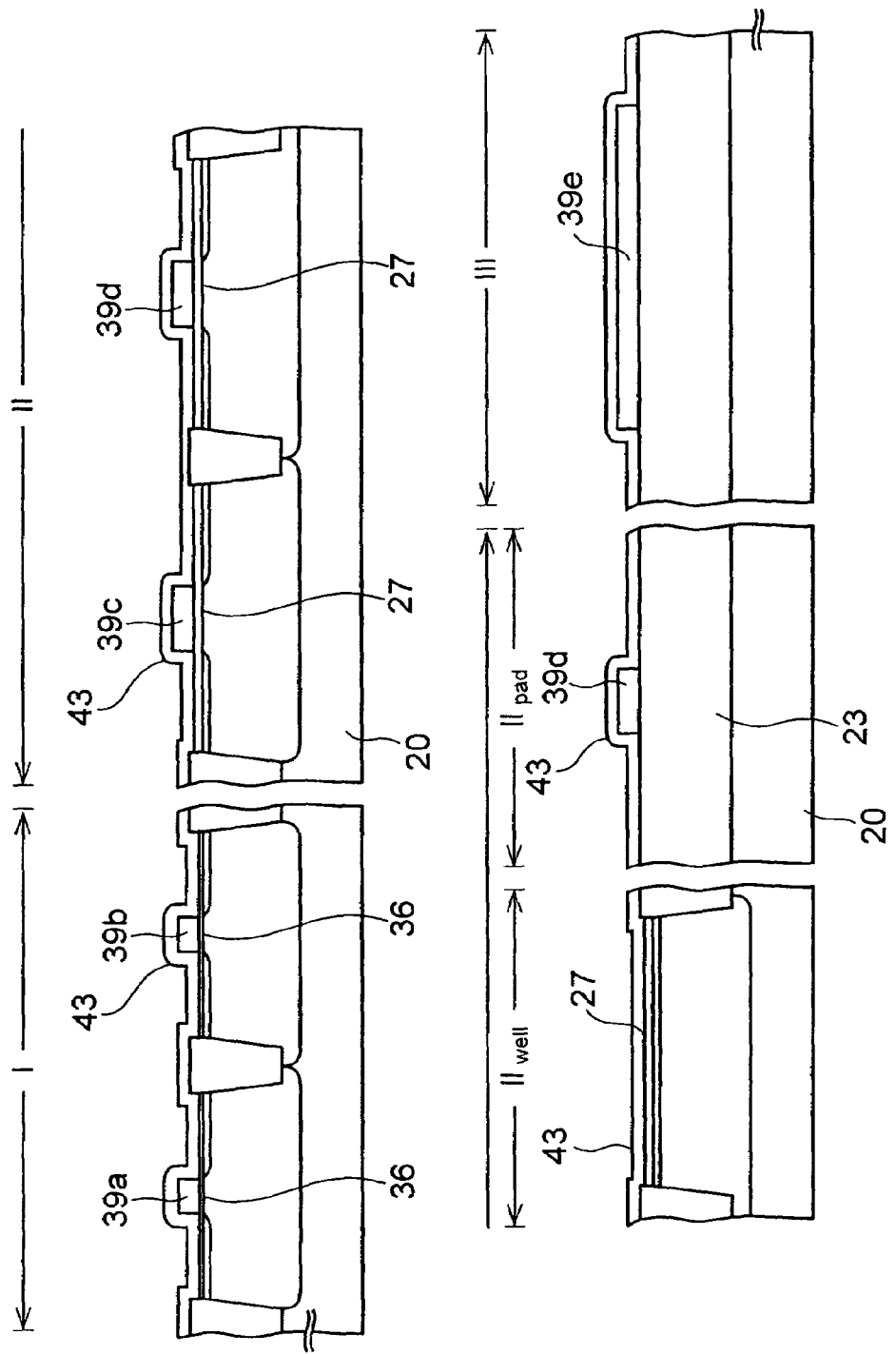

Then, as shown in FIG. 13B, the sidewall insulating film 43 is formed in respective regions I to III in the same way as that in FIG. 10A of the third embodiment. Before depositing sidewall insulating film 43, P$^+$ ion implantation (for example under the condition of P+20 keV and $4 \square 10^{15}$ cm$^{-2}$) is executed into the resistor pattern 39e and the resistor pattern 39e is doped.

Figure 13C:
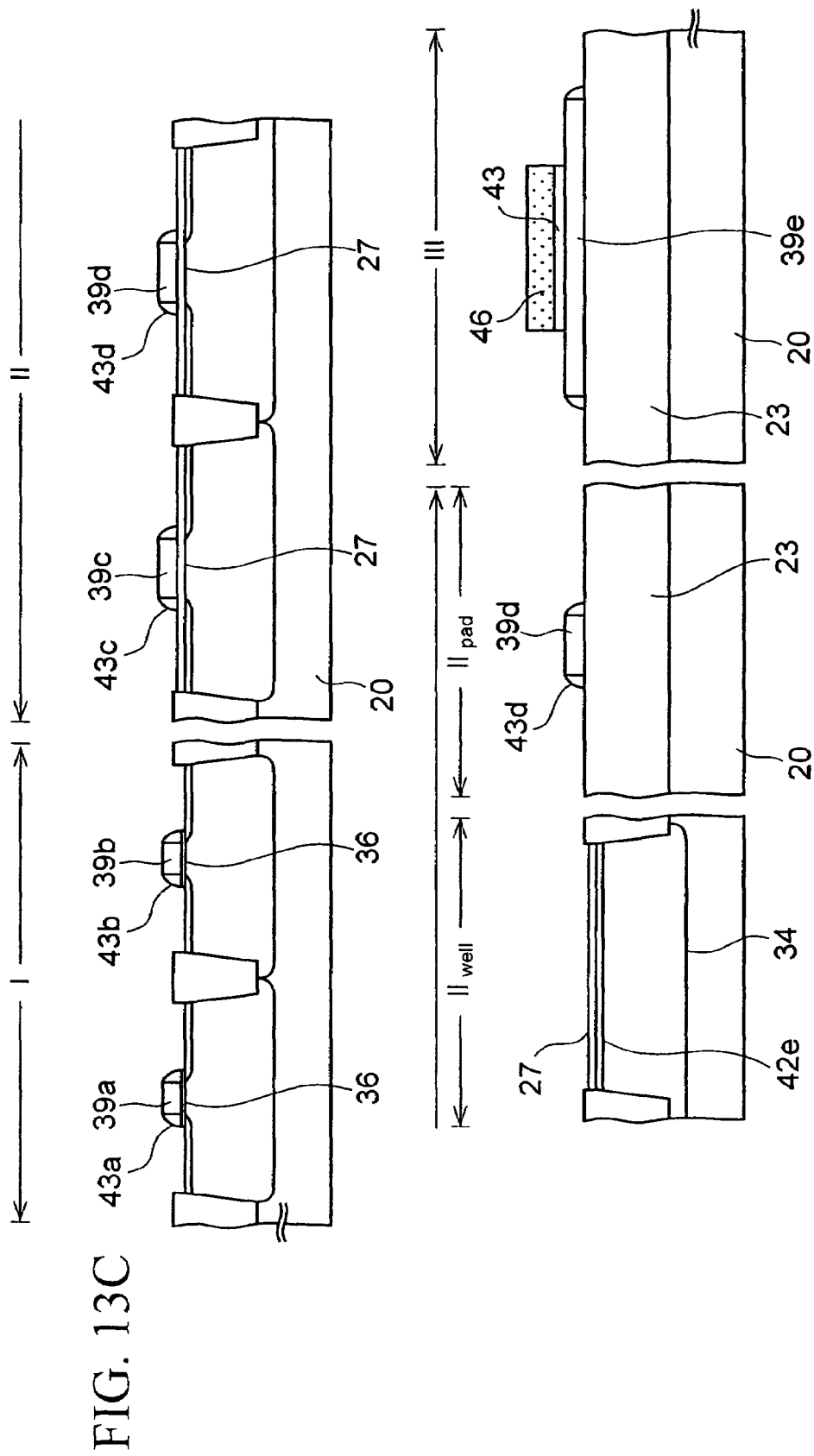

Then, as shown in FIG. 13C, the island-like sixth resist pattern 46 is formed on the resistor pattern 39e. Then, the sidewall insulating film 43 is etched back by the RIE while using the sixth resist pattern 46 as a mask. Thus, the first to fourth insulating sidewalls 43a to 43d are formed beside the first to fourth gate electrodes 39a to 39d, and also the sidewall insulating film 43 on the contact region CR of the resistor pattern 39e is removed. In this etching back, the sidewall insulating film 43 is over-etched by a film thickness ratio 10% to the thickness of about 100 nm, i.e., 10 nm. As a result, the first gate insulating film 27 having originally a thickness of 70 to 90 nm is etched by 10 nm in depth by the above etching-back, and a thickness thereof is reduced to about 60 to 80 nm.

Then, the sixth resist pattern 46 is removed.

Figure 13D:
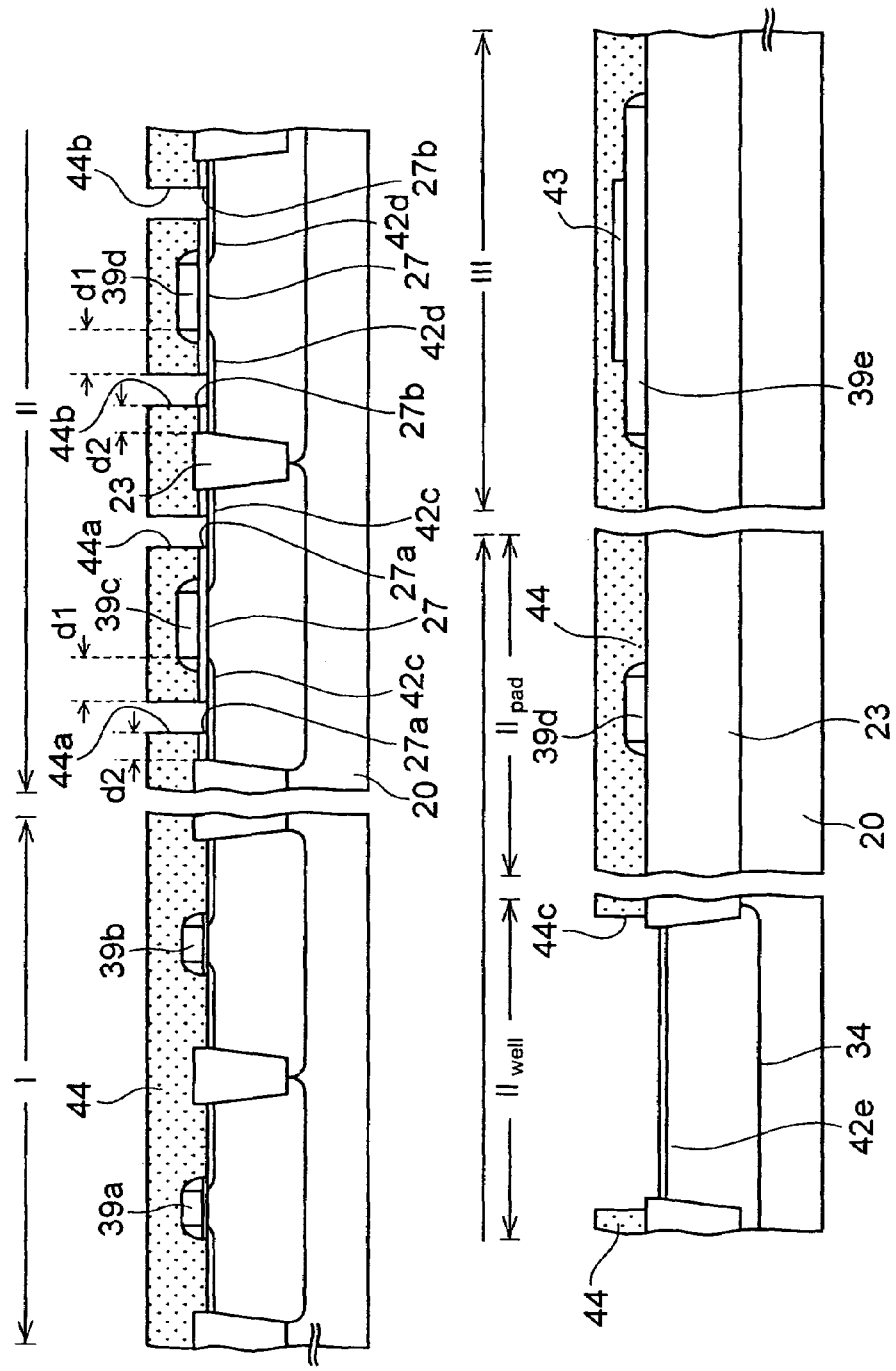

Then, as shown in FIG. 13D, the first gate insulating film 27 under the first and second windows 44a, 44b of the fifth resist pattern 44 is etched by executing the same steps as explained in the third embodiment and shown in FIG. 10C, and thus the fifth and sixth openings 27a, 27b are formed. Then, the fifth resist pattern 44 is removed.

Figure 13E:
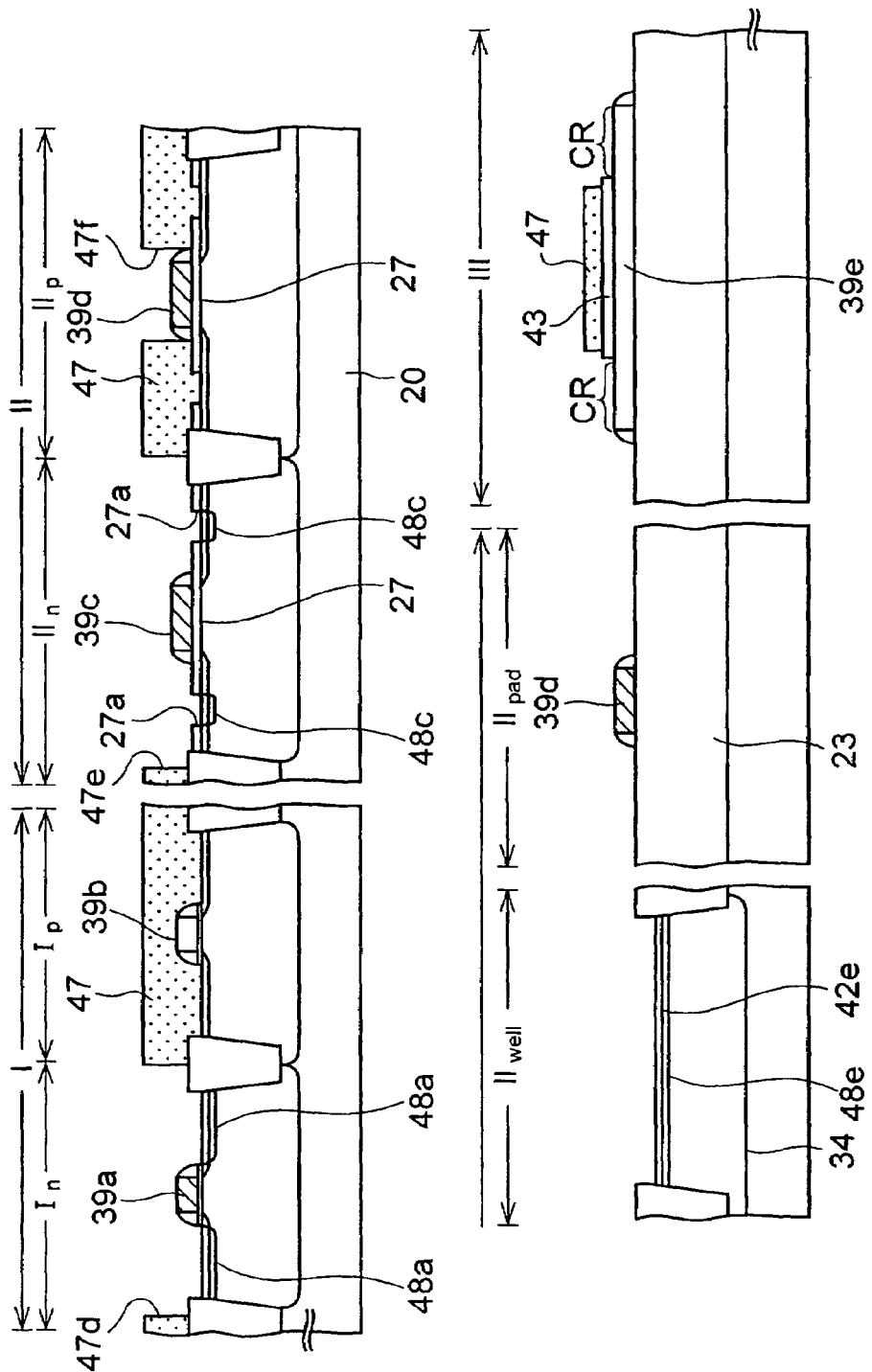

Next, the steps required until a sectional structure shown in FIG. 13E is obtained will be explained hereunder.

First, the photoresist is coated on respective regions I to III, and then the seventh resist pattern 47 is formed by exposing/developing the photoresist. The seventh resist pattern 47 has the eleventh and twelfth windows 47d, 47e from which the normal n-type MOS transistor forming region I$_n$ and the high-voltage n-type MOS transistor forming region II$_n$ are exposed respectively.

In this event, unlike the third embodiment, the third gate electrode 39c is not covered with the seventh resist pattern 47 and is exposed.

Also, the well contact region II$_{well}$ is not covered with the seventh resist pattern 47 and is exposed.

Further, the seventh resist pattern 47 has the thirteenth window 47f from which the fourth gate electrode 39d is exposed. Also, the contact region CR of the resistor pattern 39e is not covered with the seventh resist pattern 47 and is still exposed.

Then, the P+ ion is ion-implanted into the silicon substrate 20 under the conditions of an acceleration energy of 10 to 15 KeV and a dose amount of 2×10$^{15}$ cm$^{-3}$, while using the seventh resist pattern 47 as a mask.

As a result, in the normal n-type MOS transistor forming region I$_n$, the first n-type source/drain region 48a is formed in the silicon substrate 20 beside the first gate electrode 39a, and also the P+ ion is introduced into the first gate electrode 39a that was kept in its undoped condition. Thus, the conductivity type of the first gate electrode 39a is set to the n type.

Also, in the high-voltage n-type MOS transistor forming region II$_n$, since the first gate insulating film 27 which is thicker than the third embodiment and whose thickness is 80 to 100 nm can block the P+ ion, the second n-type source/drain region 48c can be formed selectively in the silicon substrate 20 under the fifth opening 27a even though the seventh resist pattern 47 is not provided. Then, the deep second n-type impurity diffusion region 48e whose impurity concentration is higher than the first n-type impurity diffusion region 42e is formed in the well contact region II$_{well}$.

Then, the P+ ion is implanted into all portions of the third and fourth gate electrodes 39c, 39d that were kept in their undoped condition. Thus, the conductivity type of these gate electrodes 39c, 39d is set to the n type.

Then, the seventh resist pattern 47 is removed.

Figure 13F:
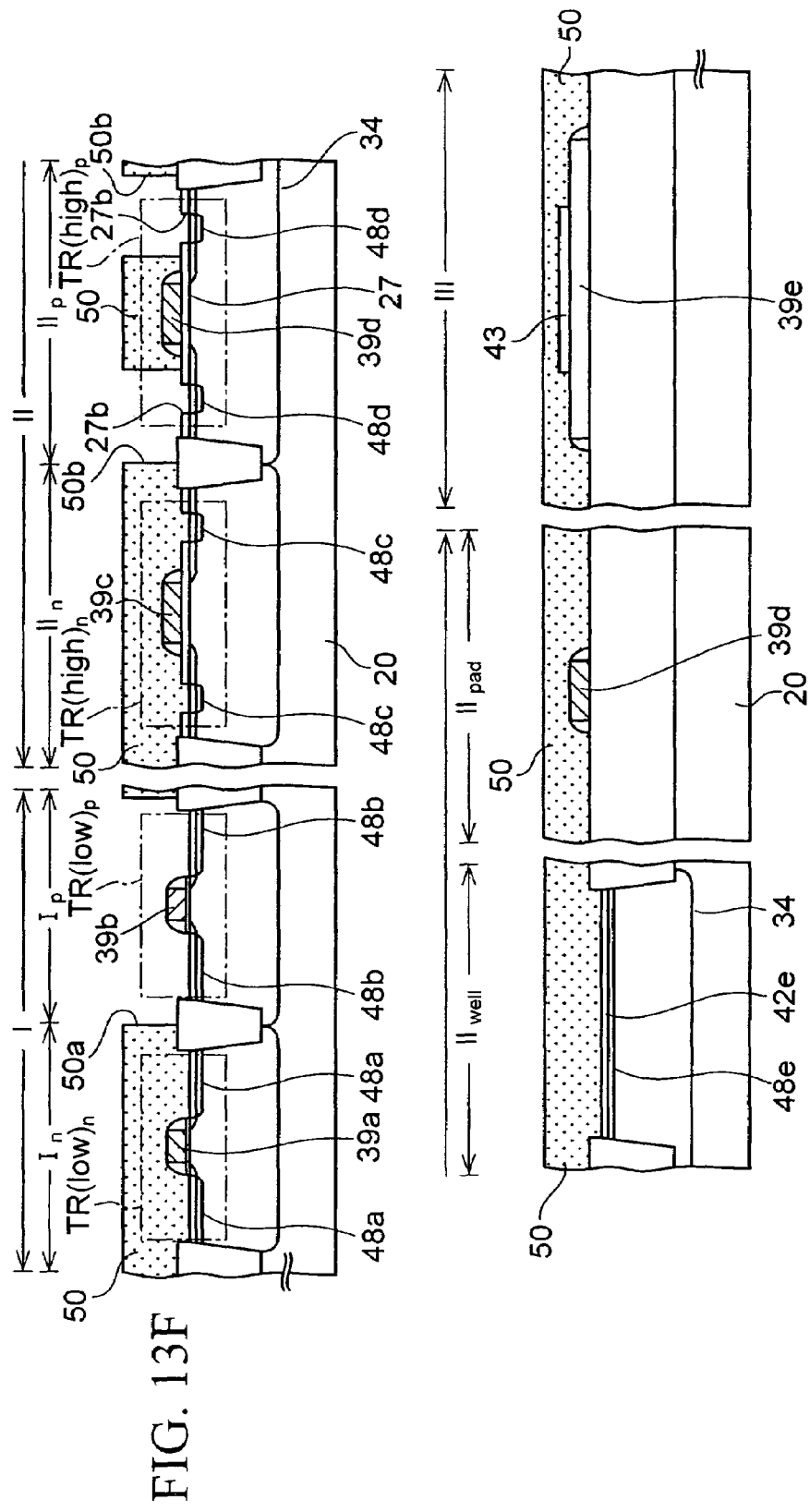

Then, as shown in FIG. 13F, the same ion implantation step explained in the third embodiment and shown in FIG. 10E is carried out. Thus, the conductivity type of the second gate electrode 39b is set to the p type and also the second p-type source/drain region 48b is formed beside the second gate electrode 39b in the silicon substrate 20. As the result of this ion implantation, the first p-type source/drain region 48d is formed in the silicon substrate 20 under the sixth opening 27b in the first gate insulating film 27 in the high-voltage transistor forming region II.

The eighth resist pattern 50 used as a mask is removed after this ion implantation is ended.

According to the steps executed up to now, the basic structure consisting of the n-type normal MOS transistor TR(low)$_n$ and the p-type normal MOS transistor TR(low)$_p$ is completed in the normal transistor forming region I, while the basic structure consisting of the n-type high-voltage MOS transistor TR(high)$_n$ and the p-type high-voltage MOS transistor TR(high)$_p$ is completed in the high-voltage transistor forming region II.

Figure 13G:
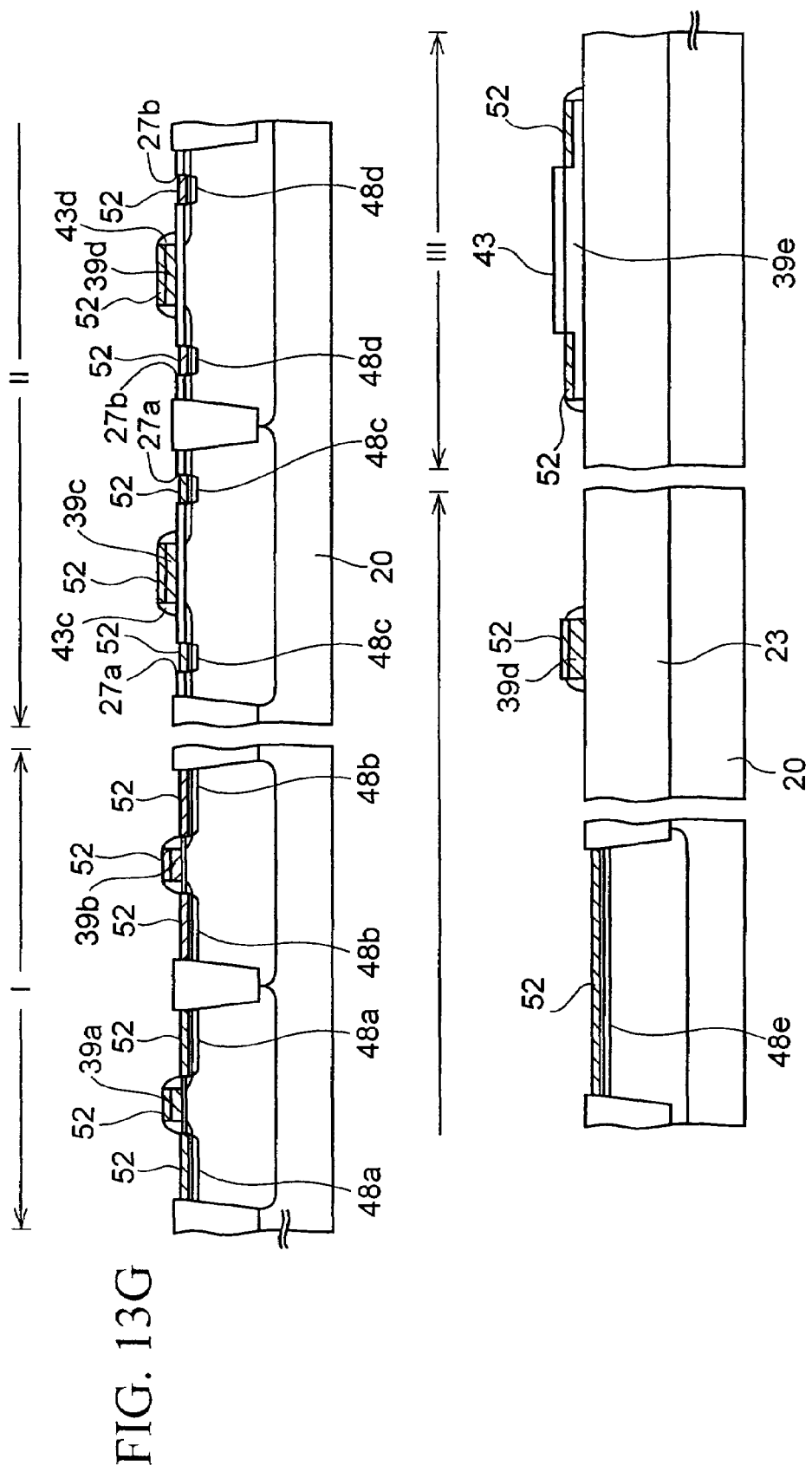

Then, as shown in FIG. 13G, the silicide layer 52 is formed on respective regions I to III by executing the same steps as explained in the third embodiment and shown in FIG. 10F.

With the above, major steps in the method of manufacturing the semiconductor device according to the present embodiment are ended.

Figure 14:
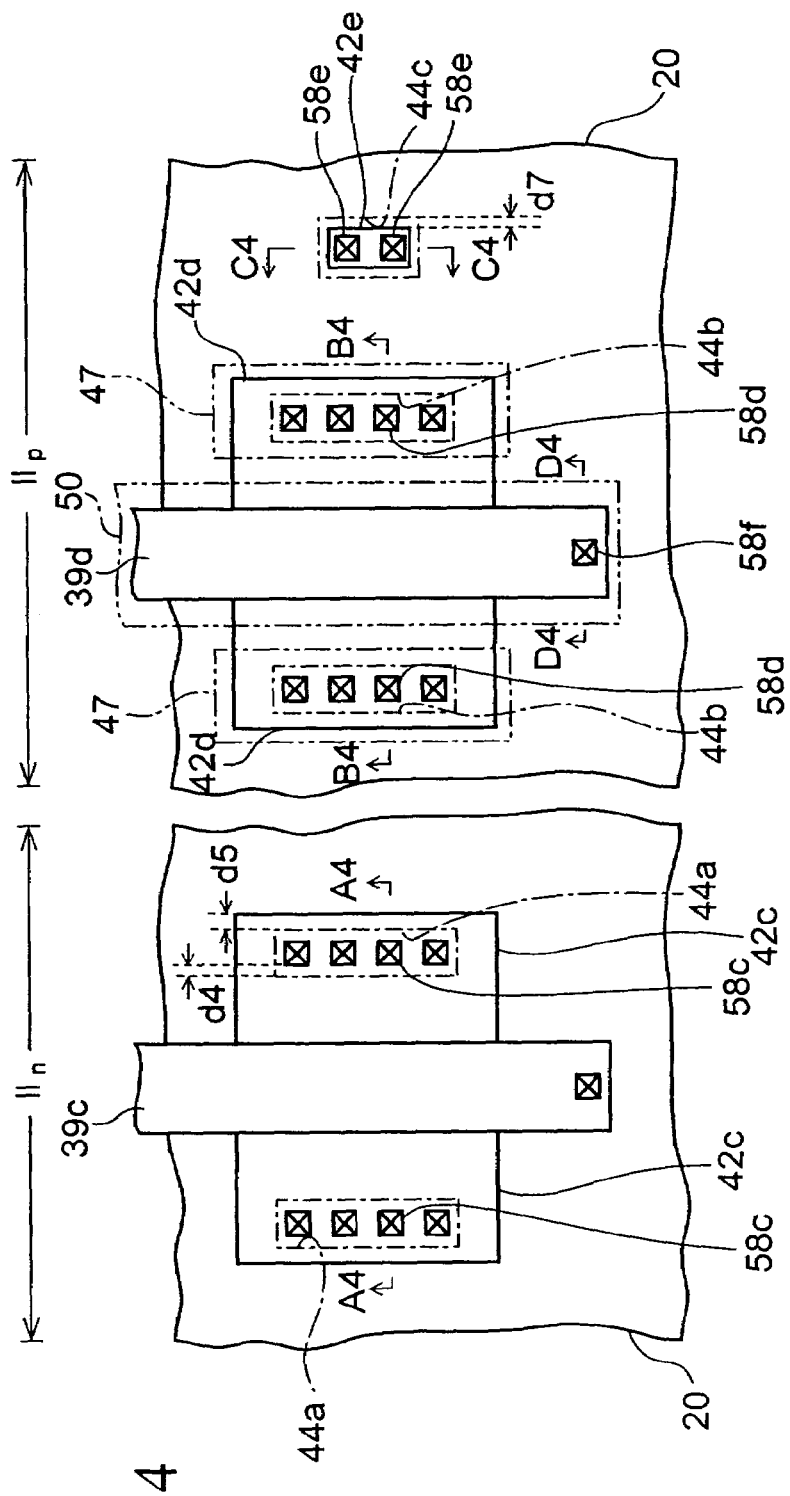
FIG. 14 is a plan view showing the semiconductor device according to the fourth embodiment of the present invention.

Now, FIG. 14 is a plan view showing the high-voltage transistor forming region II of the semiconductor device according to the present embodiment in an enlarged fashion, and planar layouts of respective resist patterns formed in the above are also illustrated in FIG. 14. Then, sectional views of respective regions II$_n$, II$_p$ in above FIGS. 13A to 13G correspond to cross sectionals taken along an A4-A4 line and a B4-B4 line in FIG. 14 respectively. Also, a sectional view of the well contact region II$_{well}$ corresponds to a cross section taken along a C4-C4 line in FIG. 14, and a sectional view of the pad region II$_{pad}$ corresponds to a cross section taken along a D4-D4 line in FIG. 14.

Since the meanings and the values of the distances d4, d5, d7 in FIG. 14 are equal to the first embodiment, their explanation will be omitted herein.

According to the above present embodiment, the third and fourth insulating sidewalls 43c, 43d do not cover the upper surfaces of the third and fourth gate electrodes 39c, 39d. For this reason, the impurity can be introduced into the overall upper surfaces of the third and fourth gate electrodes 39c, 39d in the ion implantation step shown in FIG. 13E, so that the undoped portion can be prevented from being formed in these gate electrodes 39c, 39d.

In addition, in the step explained in FIG. 13G, the silicide layer 52 can be formed on all the upper surfaces of the third and fourth gate electrodes 39c, 39d. Therefore, the resistance of the gate electrodes 39c, 39d can be sufficiently lowered in comparison with the prior art by which the silicide layer is formed only on a part of the upper surfaces.

(5) Fifth Embodiment

The present embodiment gives a variation of the fourth embodiment, and both the n-type high-voltage MOS transistor TR(high)$_n$ and the p-type high-voltage MOS transistor TR(high)$_p$ are of the surface channel type.

FIGS. 15A to 15E are sectional views showing a semiconductor device according to the present embodiment in the manufacturing process. In these Figures, the same reference symbols as those in the fourth embodiment are affixed to the same elements as those in the fourth embodiment, and their explanation will be omitted herein.

First, as shown in FIG. 15A, the first to fourth insulating sidewalls 43a to 43d are formed on the side surfaces of the first to fourth gate electrodes 39a to 39d by executing the steps explained in the fourth embodiment and shown in FIG. 13C.

In the present embodiment, like the fourth embodiment, the first gate insulating 27 in the high-voltage transistor forming region I is employed as a mask of the ion implantation upon forming the source/drain regions. Therefore, the first gate insulating 27 is formed thicker than the third embodiment, e.g., to have a thickness of about 80 to 100 nm. In the etching step of forming the sidewalls, the first gate insulating film 27 is etched by about 10 nm, and this an etching residue of about 70 nm to 90 nm still remains.

Figure 15B:
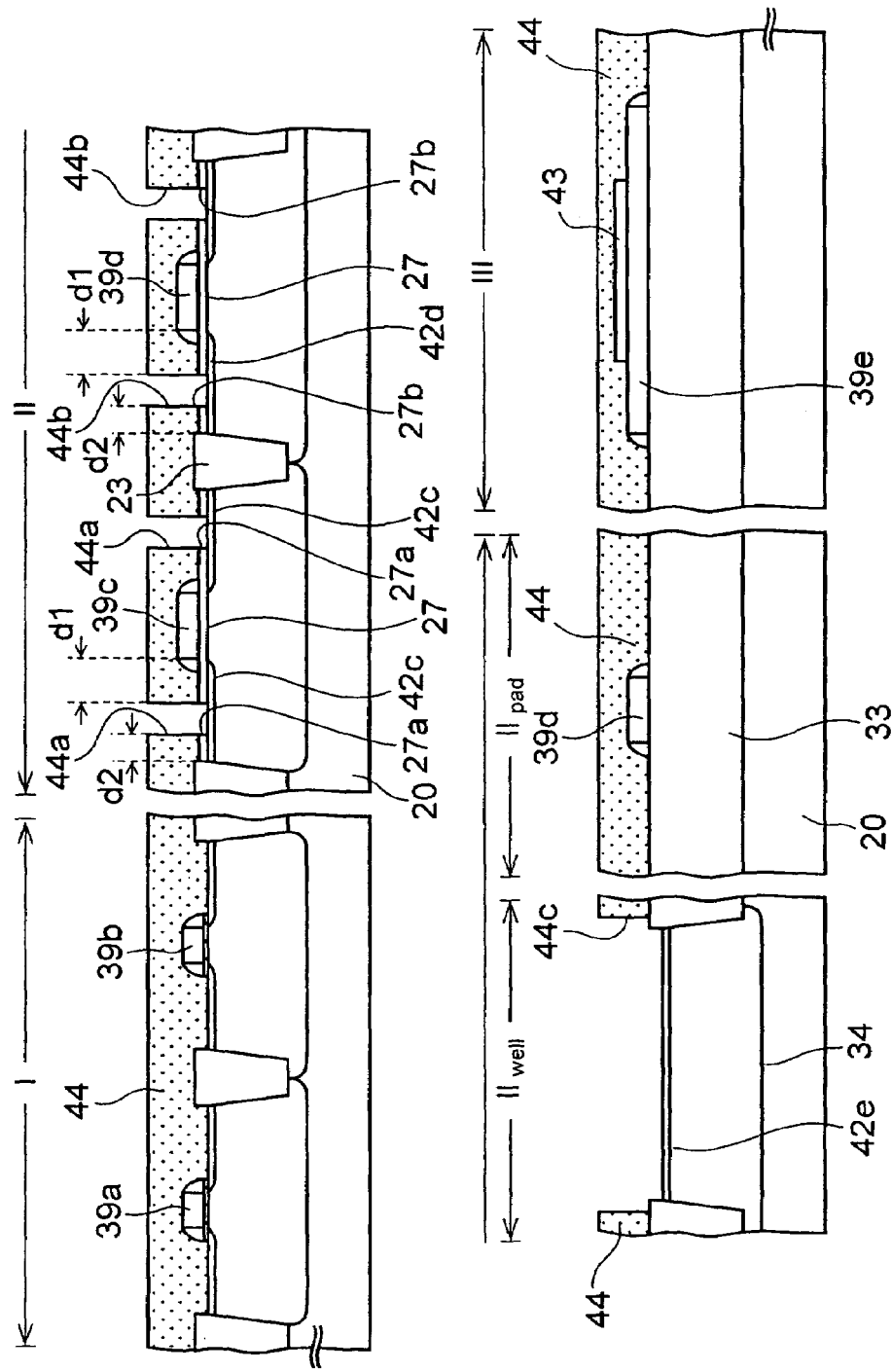

Then, the steps explained in the fourth embodiment and shown in FIG. 13D are executed. Thus, as shown in FIG. 15B, the fifth and sixth openings 27a, 27b are formed by etching the first gate insulating 27 under the first and second windows 44a, 44b in the fifth resist pattern 44. Then, the fifth resist pattern 44 is removed.

Figure 15C:
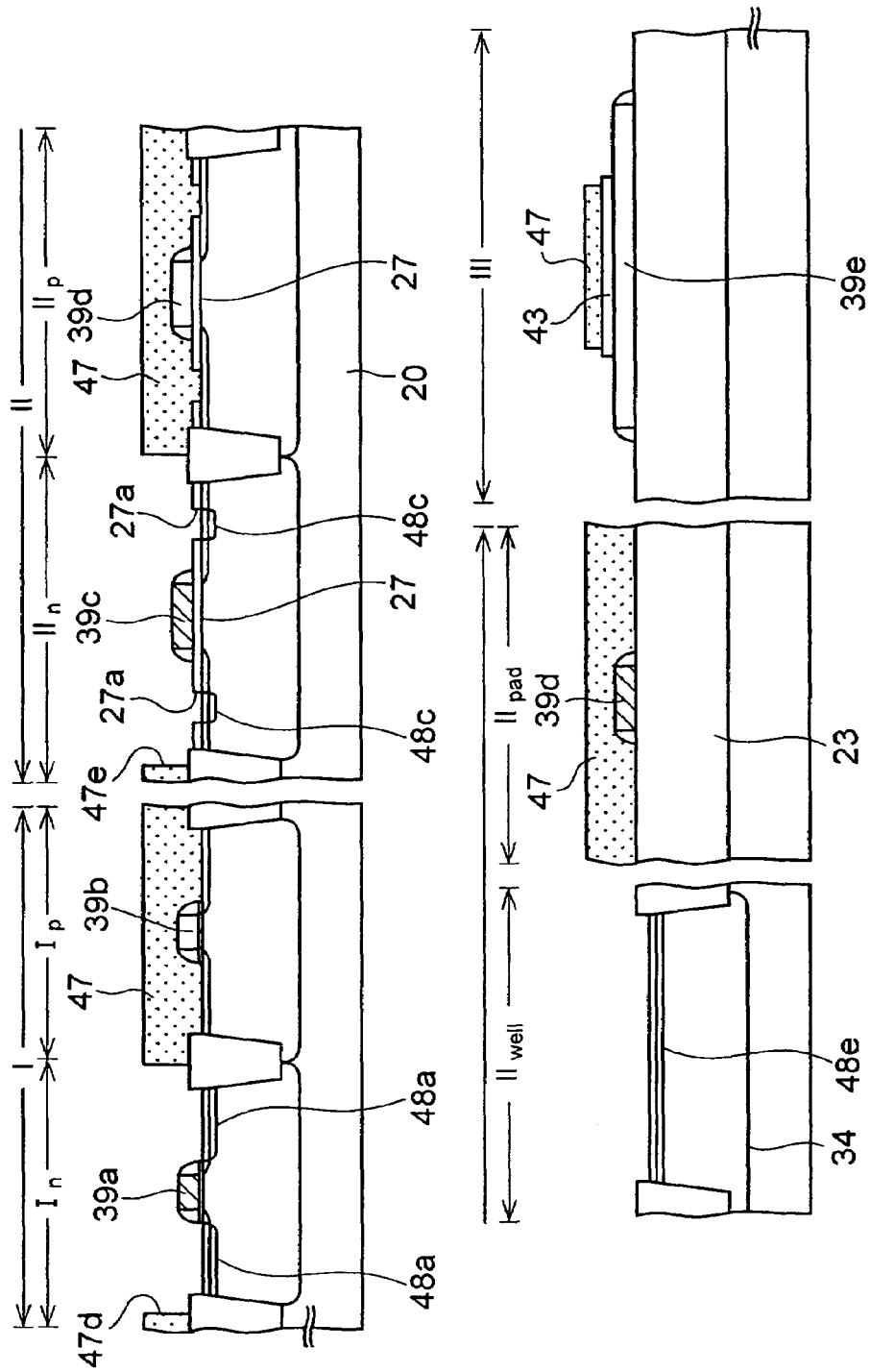

Then, as shown in FIG. 15C, the seventh resist pattern 47 is formed in respective regions I to III, like the FIG. 13E in the fourth embodiment. However, in the present embodiment, unlike the fourth embodiment, the thirteenth window 47f from which the fourth gate electrode 39d is exposed is not formed in the seventh resist pattern 47, and the fourth gate electrode 39d is still covered with the seventh resist pattern 47.

Then, the P+ ion is ion-implanted into the silicon substrate 20 under the same conditions as those in the fourth embodiment, while employing the seventh resist pattern 47 as a mask. As a result, the first n-type source/drain region 48a is formed in the silicon substrate 20 beside the first gate electrode 39a, and also the P+ ion is introduced into the entire portions of the first and third gate electrodes 39a, 39c. Thus, the conductivity type of these gate electrodes is set to the n type.

Also, in the high-voltage n-type MOS transistor forming region II$_n$, the second n-type source/drain region 48c is formed selectively only in the silicon substrate 20 under the fifth opening 27a because the first gate insulating film 27 that is thick like 80 to 100 nm acts as a mask.

Also, in the well contact region $II_{well}$, the second n-type impurity diffusion region 48e that has a higher impurity concentration and is deeper than the first n-type impurity diffusion region 42e is formed.

Then, the seventh resist pattern 47 is removed.

Figure 15D:
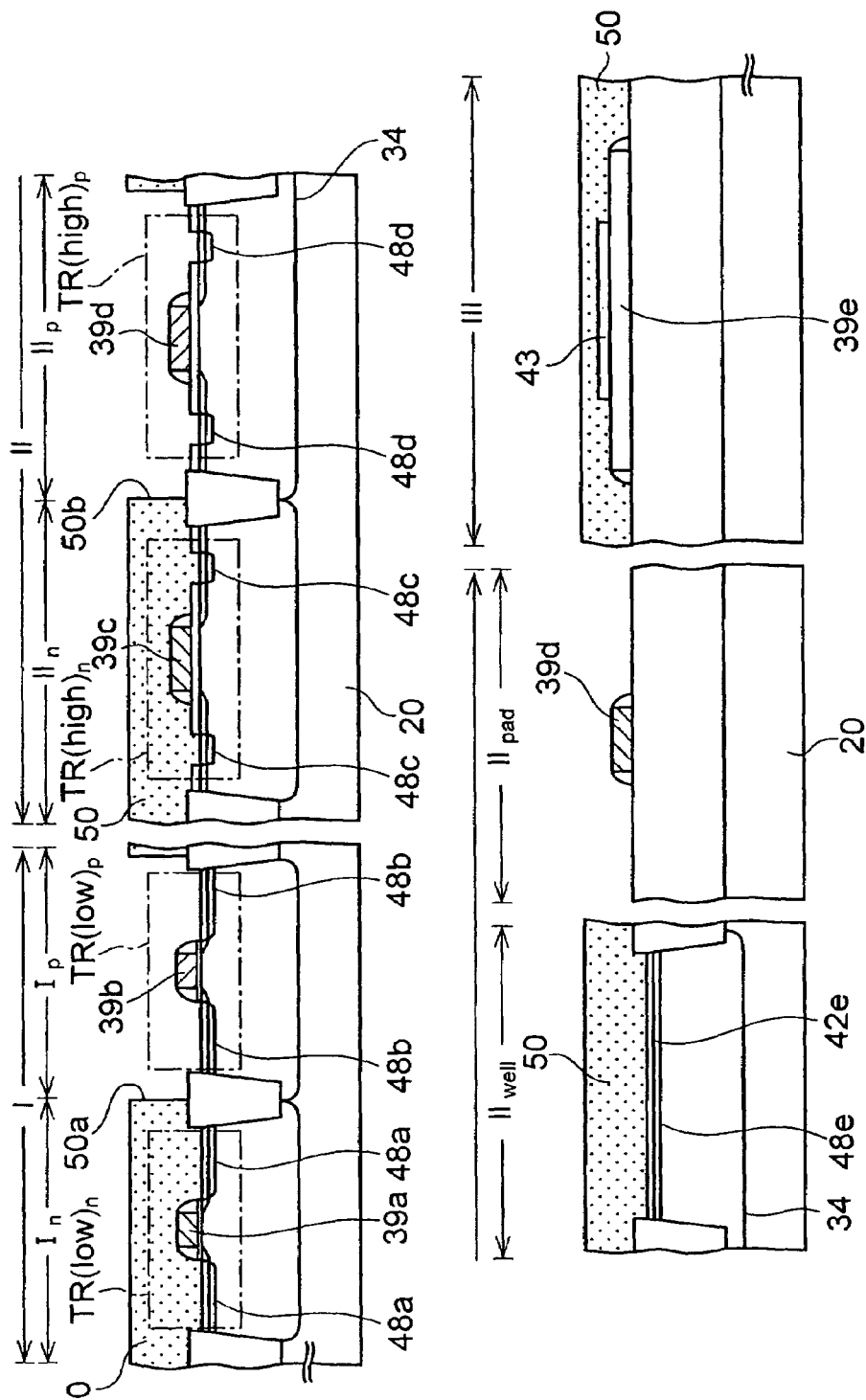

Then, as shown in FIG. 15D, the eighth resist pattern 50 having the eighth and ninth windows 50a, 50b from which the normal p-type MOS transistor forming region $I_p$ and the high-voltage p-type MOS transistor forming region $II_p$ are exposed respectively is formed on the silicon substrate 20. Then, the $B^+$ ion is implanted into the silicon substrate 20 under the same ion-implantation conditions as those in the fourth embodiment.

As a result, in the normal transistor forming region I, the second p-type source/drain region 48b is formed in the silicon substrate 20 beside the second gate electrode 39b. Also, in the high-voltage transistor forming region II, the first p-type source/drain region 48d is selectively formed under the fifth opening 27b because the first gate insulating film 27 that is thicker than the third embodiment serve as a mask.

Also, the $B^+$ ion is implanted into the entire portions of the second and fourth gate electrodes 39b, 39d, and thus the conductivity type of these gate electrodes is set to the P type.

Then, the eighth resist pattern 50 is removed.

Figure 15E:
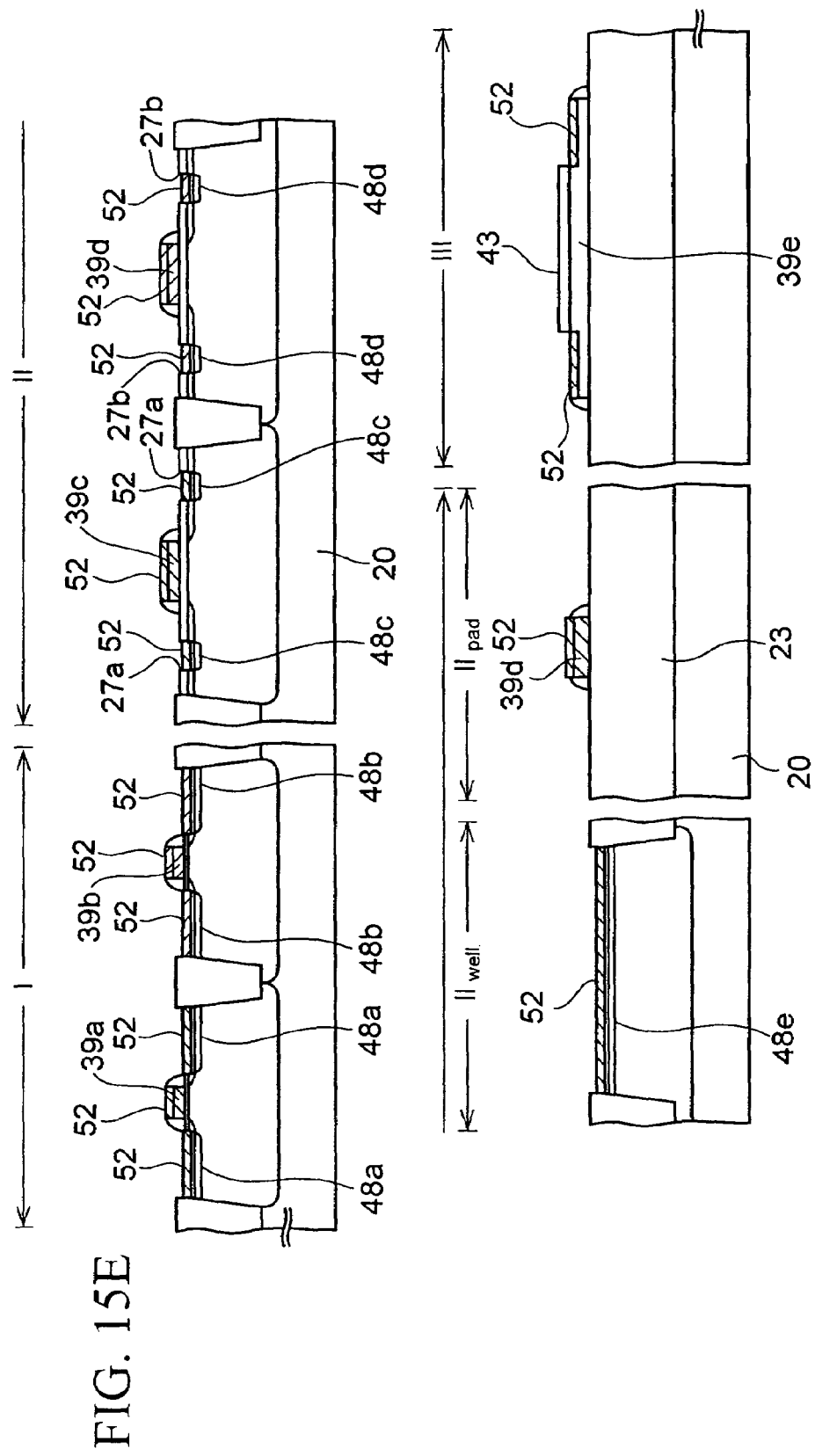

Then, as shown in FIG. 15E, the silicide layer 52 is formed on respective regions I to III by executing the same steps explained in the third embodiment and shown in FIG. 10F.

With the above, major steps in the method of manufacturing the semiconductor device according to the present embodiment are ended.

According to the present embodiment, for the reason explained in the fourth embodiment, the impurity can be introduced uniformly not to form the undoped portions in the third and fourth gate electrodes 39c, 39d, and also the silicide layer 52 can be formed on the overall upper surfaces of these gate electrodes 39c, 39d.

Further, in the present embodiment, both the n-type high-voltage MOS transistor $TR(high)_n$ and the p-type high-voltage MOS transistor $TR(high)_p$ have the surface channel structure in which the gate electrode and the channel have the same conductivity type. Therefore, these transistor $TR(high)_n$, $TR(high)_p$ can withstand much more the short channel effect.

(6) Sixth Embodiment

The present embodiment is a variation of the fifth embodiment, and both the n-type high-voltage MOS transistor $TR(high)_n$ and the p-type high-voltage MOS transistor $TR(high)_p$ are of the buried channel type.

Figure 16A:
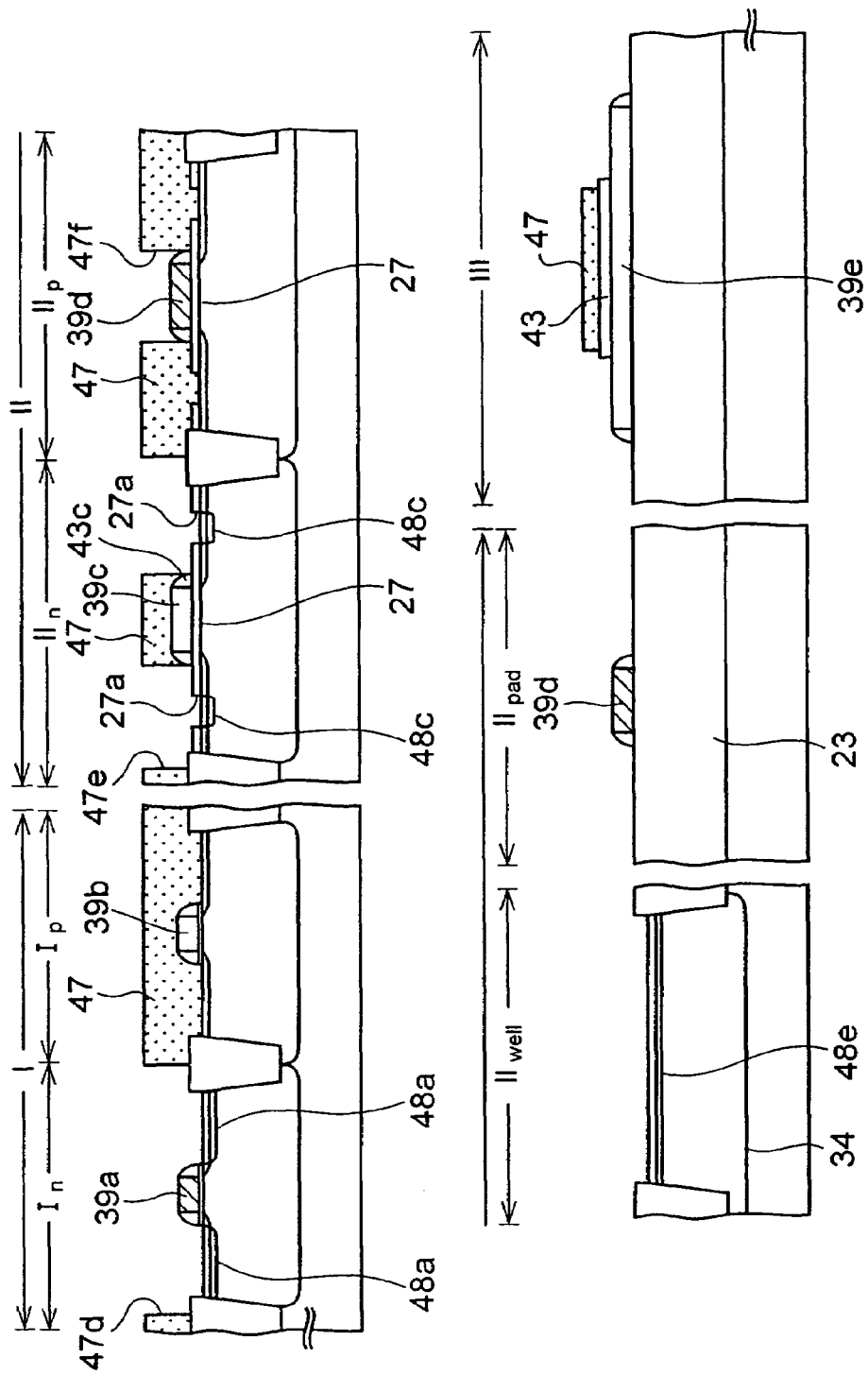
FIGS. 16A to 16C are sectional views showing a semiconductor device according to a sixth embodiment of the present invention in the manufacturing process respectively.
Figure 16B:
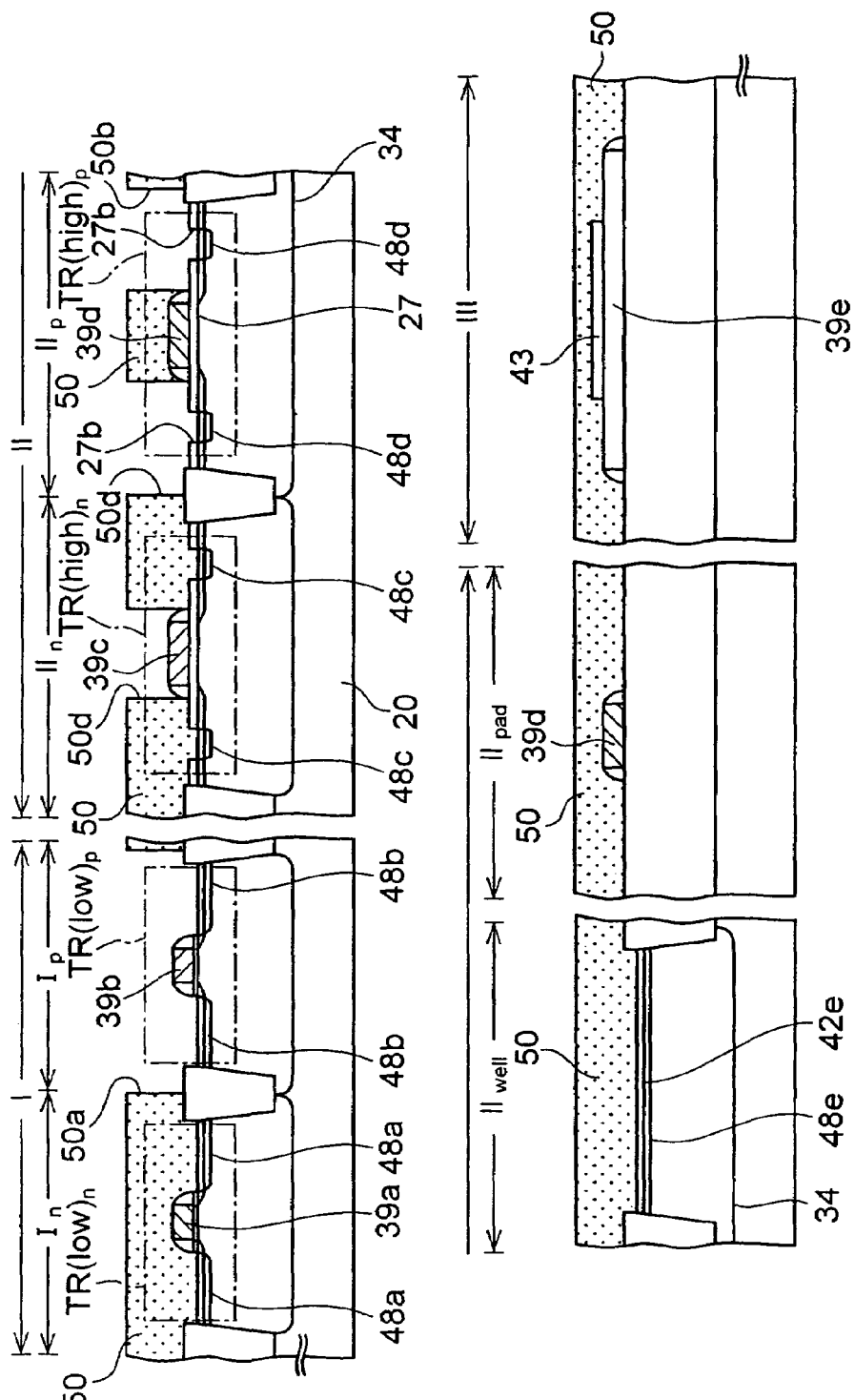
Figure 16C:
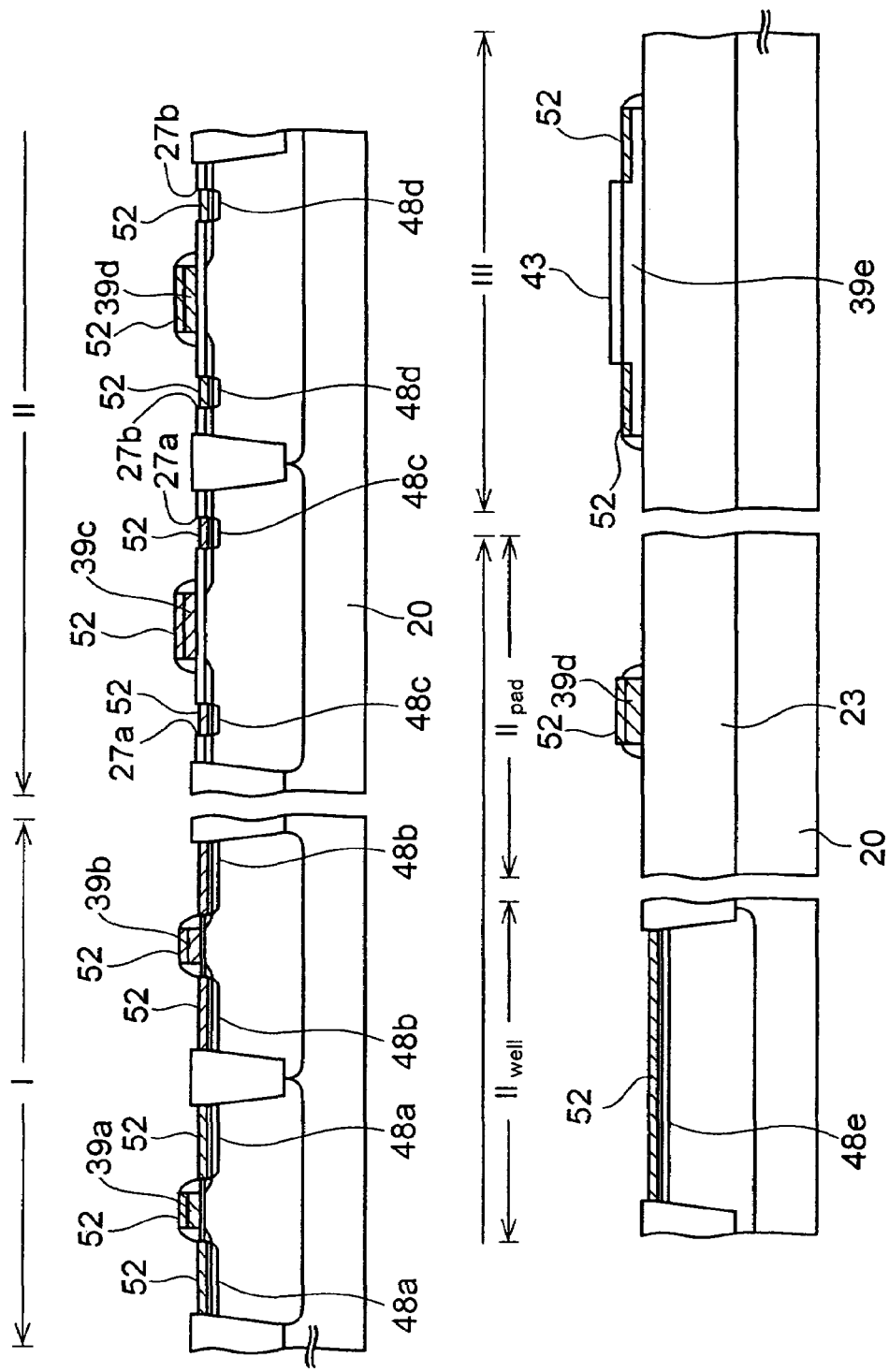

FIGS. 16A to 16C are sectional views showing a semiconductor device according to the present embodiment in the manufacturing process respectively. In these Figures, the same reference symbols as those in the fifth embodiment are affixed to the same elements as those in the fifth embodiment, and their explanation will be omitted herein.

First, as shown in FIG. 16A, the seventh resist pattern 47 is formed in respective regions I to III in the same way as the steps in FIG. 15C in the fifth embodiment. In this case, in the present embodiment, the thirteenth window 47f from which the fourth gate electrode 39d is exposed is formed in the seventh resist pattern 47, and also the third gate electrode 39c is covered with the seventh resist pattern 47.

Then, the P+ ion is ion-implanted into the silicon substrate 20 under the same conditions as those in the fourth embodiment, while using the seventh resist pattern 47 as a mask. As a result, the first n-type source/drain region 48a is formed on the silicon substrate 20 beside the first gate electrode 39a, and also the second n-type source/drain region 48c is formed on the silicon substrate 20 under the fifth opening 27a.

At this time, in the high-voltage n-type MOS transistor forming region $II_n$, the $P^+$ ion is not implanted into the portions of the silicon substrate 20 out of the fifth opening 27a because the thick first gate insulating film 27 whose thickness is 80 to 100 nm acts as a mask.

Also, the $P^+$ ion is introduced into the entire portions of the first and fourth gate electrodes 39a, 39d being kept in their undoped condition by this ion implantation, and thus the conductivity type of these gate electrodes is set to the n type.

Then, in the well contact region $II_{well}$, the second n-type impurity diffusion region 48e that has a higher concentration and is deeper than the first n-type impurity diffusion region 42e is formed.

Then, the seventh resist pattern 47 is removed.

Then, as shown in FIG. 16B, the eighth resist pattern 50 having the eighth window 50a, from which the normal p-type MOS transistor forming region $I_p$ is exposed, and the ninth window 50b, from which the source/drain forming region in the high-voltage p-type MOS transistor forming region $II_p$ is exposed, is formed on the silicon substrate 20. In this case, in the present embodiment, unlike the fifth embodiment, the fourth gate electrode 39d is not exposed from the ninth window 50b, and such fourth gate electrode 39d is still covered with the eighth resist patter 50. Also, the tenth window 50d from which the third gate electrode 39c in the high-voltage transistor forming region II is exposed is formed in the eighth resist patter 50.

Then, the $B^+$ ion as the p-type impurity is ion-implanted into the silicon substrate 20 under the same conditions as those in the fourth embodiment, while employing the eighth resist pattern 50 as a mask. As a result, in the normal transistor forming region I, the second p-type source/drain region 48b is formed on the silicon substrate 20 beside the second gate electrode 39b.

Also, in the high-voltage transistor forming region II, the first p-type source/drain region 48d is formed selectively only in the silicon substrate 20 under the sixth opening 27b because the thick first gate insulating film 27 whose thickness is 80 to 100 nm acts as a mask in the ion implantation.

Also, the $B^+$ ion is implanted into the entire portions of the second and fourth gate electrodes 39b, 39d by this ion implantation, and thus the conductivity type of these gate electrodes 39b, 39d is set to the p type.

Then, the eighth resist pattern 50 is removed.

Then, as shown in FIG. 16C, the silicide layer 52 is formed on respective regions I to III, like the third to fifth embodiments.

With the above, major steps of the method of manufacturing the semiconductor device according to the present embodiment are ended.

According to the present embodiment, like the fourth and fifth embodiments, the impurity is introduced uniformly into the third and fourth gate electrodes 39c, 39d in the high-voltage transistor forming region II, and thus there is no possibility of forming the undoped portion in these gate electrodes 39c, 39d. In addition, since the silicide layer 52 is formed on the overall upper surfaces of the third and fourth gate electrodes 39c, 39d, the resistance of the gate electrodes 39c, 39d can be lowered sufficiently rather than the prior art.

Further, both the n-type high-voltage MOS transistor $TR(high)_n$ and the p-type high-voltage MOS transistor $TR(high)_p$ are of the buried channel type. Therefore, like the second embodiment, merely a low channel concentration is required to get the same threshold voltage as the surface channel type, and also a concentration gradient of the impurity in the jointed portion between the source/drain regions 48c, 48d and the channel can be made gentle. As a result, the higher withstand voltage of the source/drain regions 48c, 48d can be realized.

Moreover, in the buried channel type, for the same reason as explained in the second embodiment, the driving ability of the MOS transistors $TR(high)_n$, $TR(high)_p$ can be enhanced.

(7) Seventh Embodiment

In the above third to sixth embodiments, the silicon oxide film is formed as the sidewall insulating film 43. In contrast, in the present embodiment, the silicon nitride film is formed as the sidewall insulating film 43.

Figure 17A:
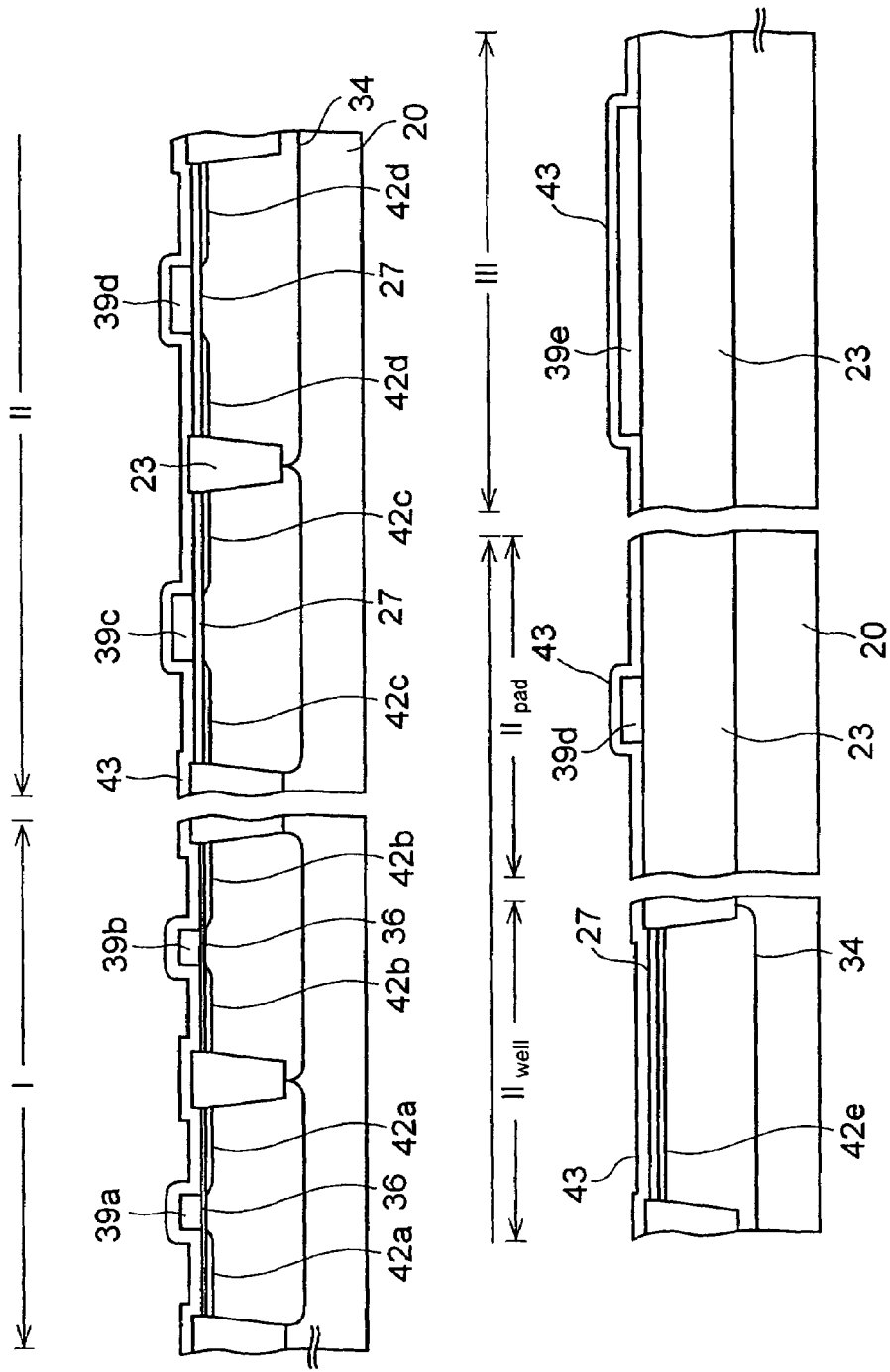
FIGS. 17A to 17C are sectional views showing a semiconductor device according to a seventh embodiment of the present invention in the manufacturing process respectively.
Figure 17B:
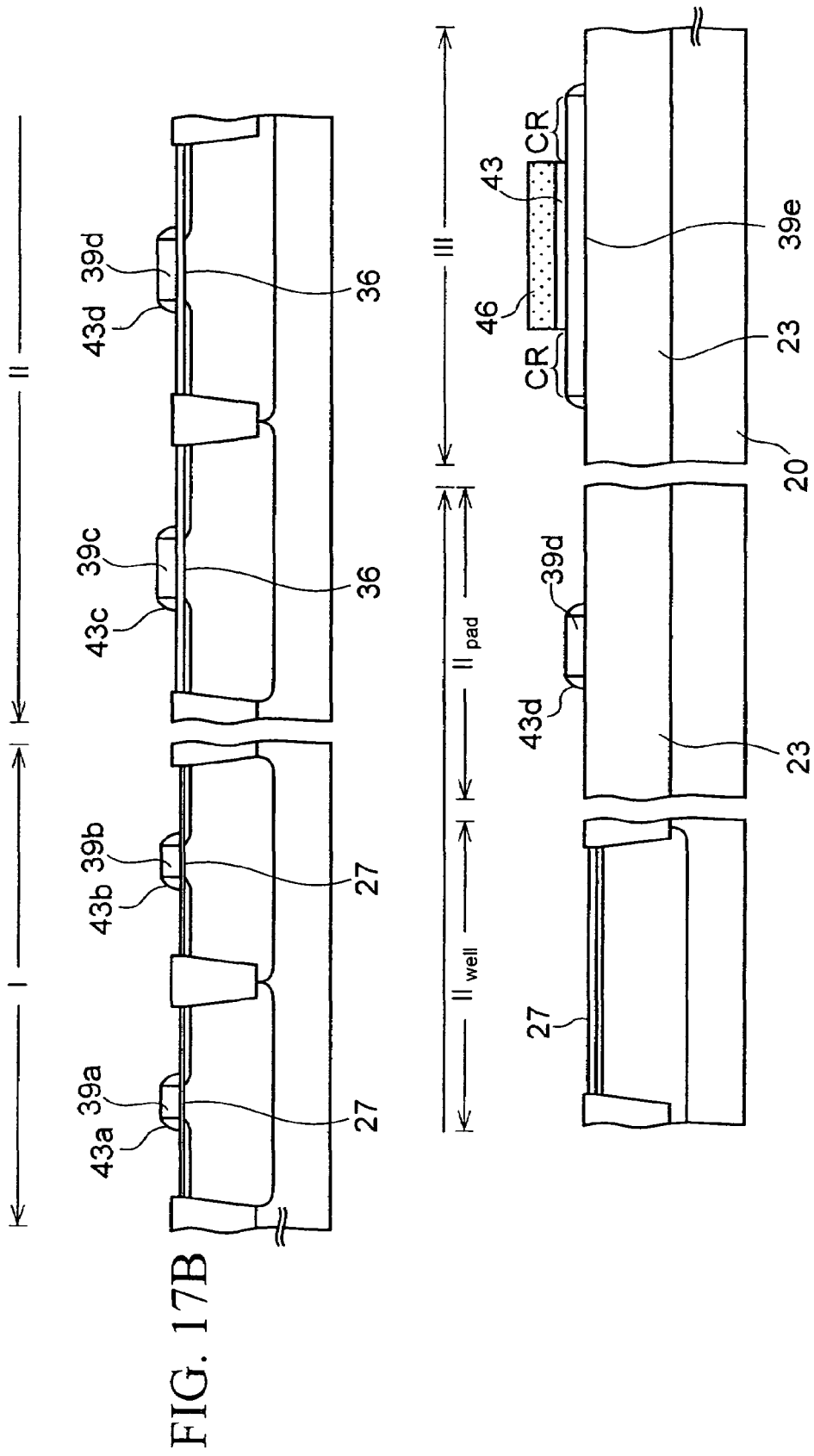
Figure 17C:
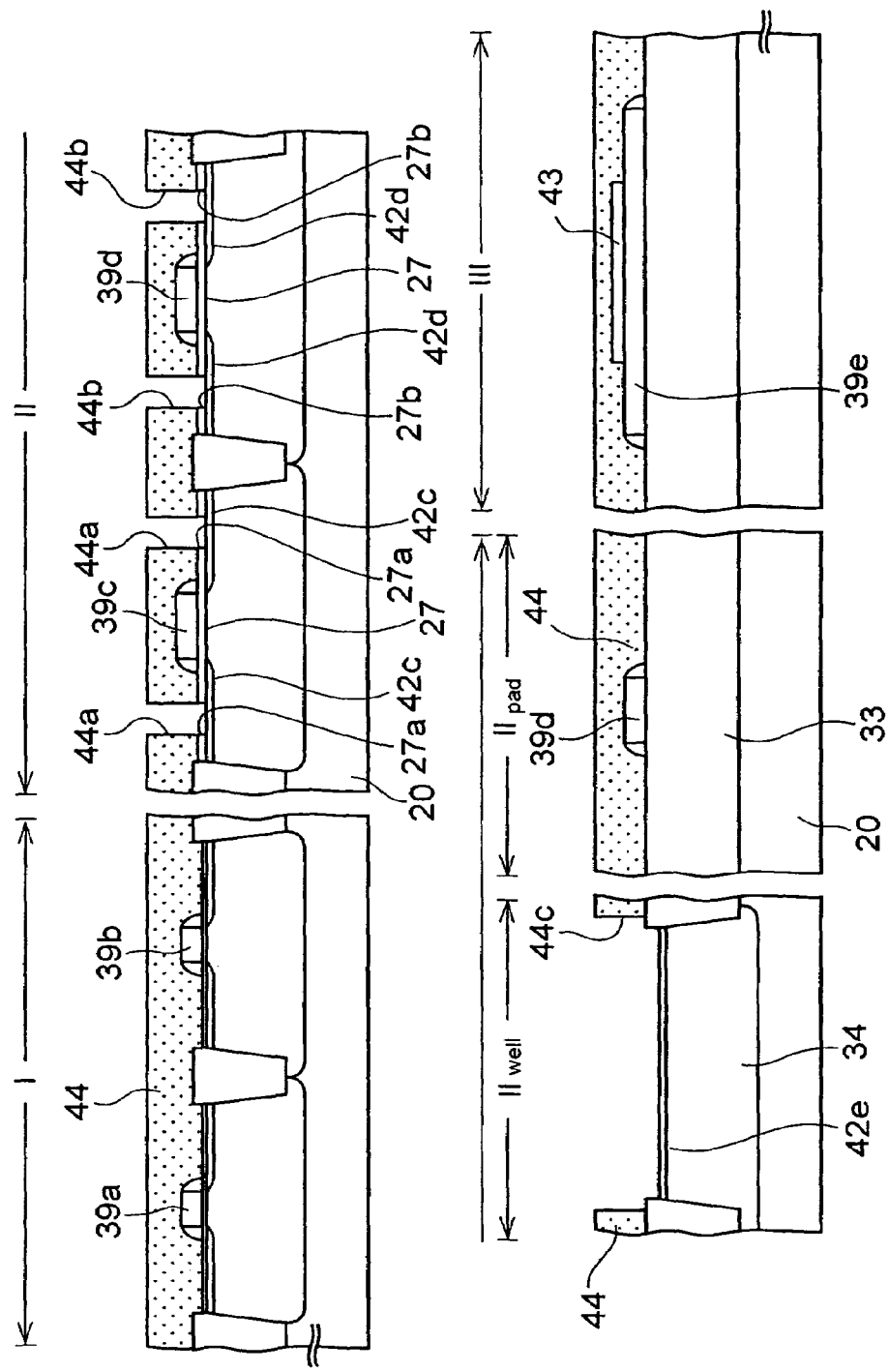

FIGS. 17A to 17C are sectional views showing a semiconductor device according to the present embodiment in the manufacturing process respectively. In these Figures, the same reference symbols as those in the third to sixth embodiments are affixed to the same elements as those in the third to sixth embodiments, and their explanation will be omitted herein.

First, the steps explained in the fourth embodiment are carried out. Then, as shown in FIG. 17A, the silicon nitride film of an about 100 nm thickness is formed on the first to fourth gate electrodes 39a to 39d and the first and second gate insulating films 27, 36 by the CVD method at a substrate temperature of 650 to 750 ⁰Z, and then this film is used as the sidewall insulating film 43. Before depositing silicon nitride film 43, $P^+$ ion implantation (for example under the condition of $P^+$ 20 keV and $4 \times 10^{15}$ cm$^{-2}$) is executed into the resistor pattern 39e and the resistor pattern 39e is doped.

In this case, the first to fourth gate electrodes 39a to 39d may be subjected to the implantation of the impurity before the sidewall insulating film 43 is formed, like the third embodiment, or may be kept in their undoped condition, like the fourth and fifth embodiments.

Then, as shown in FIG. 17B, the island-like sixth resist pattern 46 is formed on the resistor pattern 39e. Then, the sidewall insulating film 43 is etched back by the RIE while employing the sixth resist pattern 46 as a mask. Thus, the first to fourth insulating sidewalls 43a to 43d are formed beside the first to fourth gate electrodes 39a to 39d respectively, and also the sidewall insulating film 43 on the contact region CR of the resistor pattern 39e is removed.

Because a mixed gas consisting of $CHF_3$ and $O_2$, for example, is used as an etching gas in this RIE, a selective etching ratio between the first and second gate insulating films 27, 36 made of the silicon oxide and the sidewall insulating film 43 made of the silicon nitride can be increased like almost 1:5. As a result, the gate insulating films 27, 36 are hardly eroded in the etching-back, and therefore the thicknesses of these films obtained after the etching is finished are substantially equal to those obtained before the etching.

Then, the sixth resist pattern 46 is removed.

Then, as shown in FIG. 17C, the fifth resist pattern 44 is formed on respective regions I to III by applying the steps explained in the fourth embodiment and shown in FIG. 13D. Then, the first gate insulating film 27 is etched through the first and second windows 44a, 44b in the fifth resist pattern 44. Thus, the fourth and fifth openings 27a, 27b are formed, and also the first gate insulating film 27 located under the third window 44c is removed.

Then, the fifth resist pattern 44 is removed.

Subsequently, as shown in FIG. 16B, the basic structures of the foregoing transistors $TR(low)_n$, $TR(low)_p$, $TR(high)_n$, and $TR(high)_p$ are completed by executing the steps explained in the sixth embodiment and shown in FIGS. 16A to 16C, for example.

According to the present invention, the impurity can be introduced into all the portions of the third and fourth gate electrodes formed in the high-voltage transistor forming region. Therefore, the undoped portion into which no impurity is introduced is not formed in these gate electrodes, and a reduction and a variation in the driving ability of the high-voltage transistor due to the undoped portion can be prevented.

In addition, since the silicide layer is formed on the overall upper surfaces of the third and fourth gate electrodes, the resistance of these gate electrodes can be reduced sufficiently in contrast to the prior art.

What is claimed is:

1. A method of manufacturing a semiconductor device, comprising the steps of:

forming an element isolation insulating film, which defines first and second low-voltage transistor forming regions and first and second high-voltage transistor forming regions, on a semiconductor substrate;

forming a first gate insulating film on the semiconductor substrate in the first and second high-voltage transistor forming regions;

forming a second gate insulating film on the semiconductor substrate in the first and second low-voltage transistor forming regions;

forming an undoped conductive film on the first and second gate insulating films;

implanting selectively a first conductivity type impurity into the conductive film in the first low-voltage transistor forming region and the first and second high-voltage transistor forming regions;

patterning the conductive film after the first conductivity type impurity is implanted, to form first and second gate electrodes in the first and second low-voltage transistor forming regions respectively and form third and fourth gate electrodes in the first and second high-voltage transistor forming regions respectively;

forming selectively first and second source/drain extensions of first conductivity type on the semiconductor substrate beside the first and third gate electrodes respectively;

forming selectively third and fourth source/drain extensions of second conductivity type, which is opposite to the first conductivity type, on the semiconductor substrate beside the second and fourth gate electrodes respectively;

forming first to fourth insulating sidewalls beside the first to fourth gate electrodes respectively;

forming low-voltage first conductivity type source/drain region away from side surfaces of the first gate electrode at a first interval after the first to fourth insulating sidewalls are formed, and forming high-voltage first conductivity type source/drain region away from side surfaces of the third gate electrode at a second interval that is wider than the first interval;

forming low-voltage second conductivity type source/drain region away from side surfaces of the second gate electrode at the first interval after the first to fourth insulating sidewalls are formed, and forming high-voltage second conductivity type source/drain region away from side surfaces of the fourth gate electrode at the third interval that is wider than the first interval; and introducing a second conductivity type impurity into the second gate electrode.

2. A method of manufacturing a semiconductor device, according to claim 1, wherein the step of forming the first to fourth insulating sidewalls includes the steps of, forming a sidewall insulating film, which covers the first to fourth gate electrodes, in the first and second low-voltage transistor forming regions and the first and second high-voltage transistor forming regions, forming first and second openings in the sidewall insulating film and the first gate insulating film away from side surfaces of the third and fourth gate electrodes at the second and third interval respectively, and making the sidewall insulating film left on an upper surfaces and sides of the third and fourth gate electrode into the third and the fourth insulating sidewalls, and etching the third and fourth insulating sidewalls on upper surfaces of the third and fourth gate electrodes to expose the third and fourth gate electrodes except edges of the upper surfaces thereof, and etching back the sidewall insulating film in the first and second low-voltage transistor forming regions to leave the film as the first and second insulating sidewalls beside the first and second gate electrodes.

3. A method of manufacturing a semiconductor device, according to claim 2, wherein the step of forming the high-voltage first and second conductivity type source/drain regions is executed by implanting a first conductivity type impurity into the silicon substrate via the first opening and implanting a second conductivity type impurity into the silicon substrate via the second opening.

4. A method of manufacturing a semiconductor device, according to claim 3, further comprising the step of:

forming a silicide layer on upper surfaces of the first and second gate electrodes and upper surfaces of the third and fourth gate electrodes except the edge portions after the first and second insulating sidewalls are formed.

5. A method of manufacturing a semiconductor device, according to claim 1, wherein the first gate insulating film is formed thicker than the second gate insulating film, in the step of forming the first gate insulating film.

6. A method of manufacturing a semiconductor device, according to claim 1, wherein the step of forming the first to fourth insulating sidewalls includes the steps of, forming a sidewall insulating film, which covers the first to fourth gate electrodes, in the first and second low-voltage transistor forming regions and the first and second high-voltage transistor forming regions, and etching back the sidewall insulating film by an etching depth, at which an etching residue of the first gate insulating film is left, to make the sidewall insulating film left beside the first to fourth gate electrodes into the first to fourth insulating sidewall, and the method further comprising the step of:

forming third and fourth openings in portions of the first gate insulating film, which are away from side surfaces of the third and fourth gate electrodes at the second interval respectively, before the step of forming the high-voltage first and second conductivity type source/drain regions; and wherein the step of forming the high-voltage first and second conductivity type source/drain regions is executed by implanting a first conductivity type impurity into the silicon substrate via the third opening and implanting a second conductivity type impurity into the silicon substrate via the fourth opening.

7. A method of manufacturing a semiconductor device, according to claim 6, further comprising the steps of:

forming an interlayer insulating film to cover the first to fourth gate electrodes after the low-voltage first and second conductivity type source/drain regions and the high-voltage first and second conductivity type source/drain regions are formed;

patterning the interlayer insulating film to form first and second holes on the low-voltage first and second conductivity type source/drain regions respectively and form third and fourth holes on the high-voltage first and second conductivity type source/drain regions respectively; and forming first to fourth conductive plugs in the first to fourth holes.

8. A method of manufacturing a semiconductor device, according to claim 7, wherein, in the step of forming the interlayer insulating film, the interlayer insulating film is formed by stacking an etching stopper film and an insulating film in this order, and in the step of forming the first to fourth holes, the first to fourth holes are formed by etching the insulating film under the condition where the etching is stopped on the etching stopper film, and then etching the etching stopper film.

9. A method of manufacturing a semiconductor device, comprising the steps of:

forming an element isolation insulating film, which defines first and second low-voltage transistor forming regions and first and second high-voltage transistor forming regions, on a semiconductor substrate;

forming a first gate insulating film on the semiconductor substrate in the first and second high-voltage transistor forming regions;

forming a second gate insulating film, which is thinner than the first gate insulating film, on the semiconductor substrate in the first and second low-voltage transistor forming regions;

forming an undoped conductive film on the first and second gate insulating films;

patterning the conductive film to form first and second gate electrodes in the first and second low-voltage transistor forming regions respectively and form third and fourth gate electrodes in the first and second high-voltage transistor forming regions respectively;

forming a sidewall insulating film in the first and second low-voltage transistor forming regions and the first and second high-voltage transistor forming regions to cover the first to fourth gate electrodes;

removing the sidewall insulating film from upper surfaces of the first to fourth gate electrodes by etching back the sidewall insulating film by an etching depth at which an etching residue of the first gate insulating film is left, and making the sidewall insulating film left beside the first to fourth gate electrode into first to fourth insulating sidewalls;

forming a first opening in the first gate insulating film away from a side surface of the third insulating sidewall at an interval, and forming a second opening in the first gate insulating film away from a side surface of the fourth insulating sidewall at an interval;

introducing a first conductivity type impurity into the first gate electrode, as well as forming low-voltage first conductivity type source/drain region on the silicon substrate beside the first gate electrode, and forming high-voltage first conductivity type source/drain region on the silicon substrate under the first opening;

introducing a second conductivity type impurity into the second gate electrode, as well as forming low-voltage second conductivity type source/drain region on the silicon substrate beside the second gate electrode, and forming high-voltage second conductivity type source/drain region on the silicon substrate under the second opening;

introducing the impurity into all portions of the third gate electrode; and introducing the impurity into all portions of the fourth gate electrode.

10. A method of manufacturing a semiconductor device, according to claim 9, further comprising the step of:

forming a silicide layer on overall upper surfaces of at least the third and fourth gate electrodes.

11. A method of manufacturing a semiconductor device, according to claim 9, wherein, in the step of forming the first insulating film, a thickness of the first insulating film is set such that the thickness is able to block the first conductivity type impurity used in the step of forming the high-voltage first conductivity type source/drain region or the second conductivity type impurity used in the step of forming the high-voltage second conductivity type source/drain region.

12. A method of manufacturing a semiconductor device, according to claim 9, wherein the first conductivity type impurity is introduced into the third gate electrode, in the step of introducing the impurity into the third gate electrode, and the first conductivity type impurity is introduced into the fourth gate electrode, in the step of introducing the impurity into the fourth gate electrode.

* * * * *